(12) United States Patent
Takeoka et al.

(10) Patent No.: US 11,917,829 B2
(45) Date of Patent: Feb. 27, 2024

(54) SEMICONDUCTOR MEMORY DEVICE

(71) Applicant: Kioxia Corporation, Tokyo (JP)

(72) Inventors: Ayaka Takeoka, Yokohama (JP);
Yoshitaka Kubota, Sagamihara (JP)

(73) Assignee: Kioxia Corporation, Tokyo (JP)

( * ) Notice: Subject to any disclaimer, the term of this patent is extended or adjusted under 35 U.S.C. 154(b) by 376 days.

(21) Appl. No.: 17/445,968

(22) Filed: Aug. 26, 2021

(65) Prior Publication Data
US 2022/0254801 A1 Aug. 11, 2022

(30) Foreign Application Priority Data
Feb. 10, 2021 (JP) ................................. 2021-020265

(51) Int. Cl.
| | |
|---|---|
| *H01L 29/76* | (2006.01) |
| *H01L 23/00* | (2006.01) |
| *H10B 41/27* | (2023.01) |
| *H10B 41/50* | (2023.01) |
| *H10B 43/27* | (2023.01) |
| *H10B 43/50* | (2023.01) |

(52) U.S. Cl.
CPC .......... *H10B 43/50* (2023.02); *H01L 23/562* (2013.01); *H10B 41/27* (2023.02); *H10B 41/50* (2023.02); *H10B 43/27* (2023.02)

(58) Field of Classification Search
CPC ..... H01L 23/562; H01L 29/788; H10B 43/27; H10B 43/50; H10B 41/27; H10B 41/50
USPC ................................................. 257/314, 758
See application file for complete search history.

(56) References Cited

U.S. PATENT DOCUMENTS

| | | | |
|---|---|---|---|
| 6,750,496 B2* | 6/2004 | Hayano .................... | G03F 1/30 |
| | | | 257/E21.507 |
| 9,953,992 B1* | 4/2018 | Ogawa .................... | H10B 43/27 |
| 10,269,820 B1* | 4/2019 | Kaminaga ............... | H10B 41/35 |
| 10,276,585 B2 | 4/2019 | Utsumi | |
| 10,381,373 B2 | 8/2019 | Okizumi et al. | |
| 10,411,028 B2* | 9/2019 | Arisumi ................. | H10B 43/30 |

(Continued)

FOREIGN PATENT DOCUMENTS

| | | |
|---|---|---|
| JP | 2018-026518 A | 2/2018 |
| JP | 2019-054162 A | 4/2019 |

*Primary Examiner* — Nitin Parekh
(74) *Attorney, Agent, or Firm* — Oblon, McClelland, Maier & Neustadt, L.L.P.

(57) ABSTRACT

A semiconductor memory device comprises a semiconductor substrate comprising a first region, a second region, and a third region provided therebetween. The first region comprises: first conductive layers; a first semiconductor layer facing the first conductive layers; and a second semiconductor layer connected to the first semiconductor layer. The second region comprises: a third semiconductor layer and fourth semiconductor layer; and a second conductive layer electrically connected to the third semiconductor layer, the fourth semiconductor layer, and the semiconductor substrate. The third region comprises a fifth semiconductor layer and sixth semiconductor layer that are formed continuously with the second semiconductor layer and the third semiconductor layer or fourth semiconductor layer, and extend in a second direction. The third region comprises first and second portions aligned alternately in the second direction. In the second portions, the fifth and the sixth semiconductor layers are electrically connected.

18 Claims, 46 Drawing Sheets

(56) References Cited

U.S. PATENT DOCUMENTS

| | | | |
|---|---|---|---|
| 10,522,460 B2 | 12/2019 | Ichinose et al. | |
| 10,566,339 B2 | 2/2020 | Fujii et al. | |
| 2012/0068967 A1* | 3/2012 | Toubiana | G06F 3/0446 |
| | | | 2/167 |
| 2019/0341397 A1* | 11/2019 | Arisumi | H10B 41/27 |
| 2020/0098782 A1* | 3/2020 | Nojima | H10B 43/27 |
| 2020/0235125 A1* | 7/2020 | Arai | H10B 41/50 |
| 2020/0350330 A1* | 11/2020 | Ahn | H10B 43/27 |

* cited by examiner

SEMICONDUCTOR MEMORY DEVICE

CROSS-REFERENCE TO RELATED APPLICATIONS

This application is based upon and claims the benefit of Japanese Patent Application No. 2021-020265, filed on Feb. 10, 2021, the entire contents of which are incorporated herein by reference.

BACKGROUND

Field

Embodiments relate to a semiconductor memory device.

Description of the Related Art

There is known a semiconductor memory device comprising: a semiconductor substrate; a plurality of first conductive layers aligned in a first direction intersecting a surface of the semiconductor substrate; a first semiconductor layer extending in the first direction and facing the plurality of first conductive layers; and a second semiconductor layer provided between the plurality of first conductive layers and the semiconductor substrate and connected to one end in the first direction of the first semiconductor layer.

DETAILED DESCRIPTION

Figure 1:
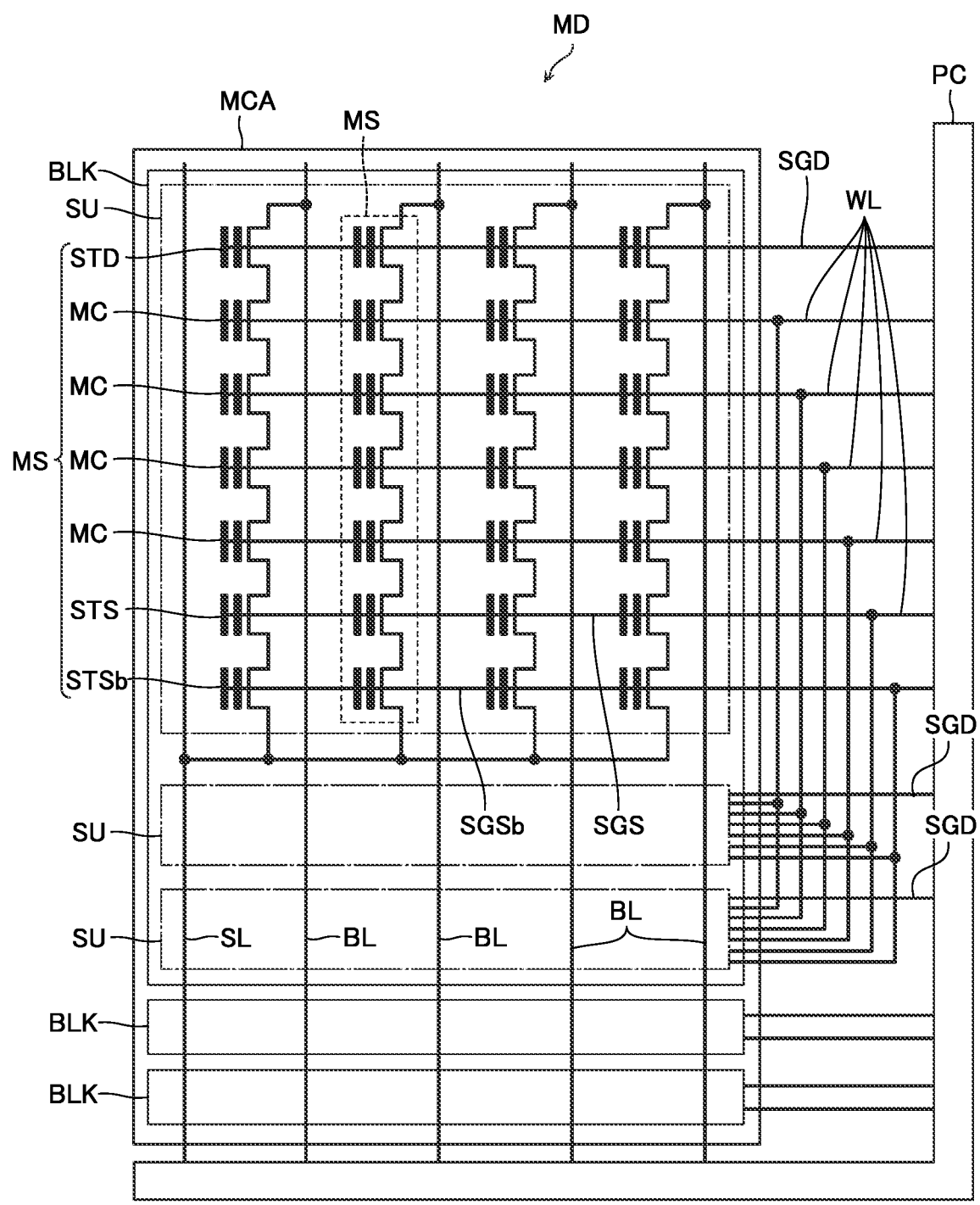
FIG. 1 is a schematic circuit diagram showing a configuration of a semiconductor memory device according to a first embodiment.

A semiconductor memory device according to an embodiment comprises a semiconductor substrate. The semiconductor substrate comprises a first region including a plurality of memory cells, a second region provided between the first region and an edge of the semiconductor substrate, and a third region, the third region being provided between the first region and the second region. A plurality of first conductive layers are provided in the first region. The plurality of first conductive layers are aligned in a first direction intersecting a surface of the semiconductor substrate. A first semiconductor layer is provided in the first region. The first semiconductor layer extends in the first direction and faces the plurality of first conductive layers. A second semiconductor layer is provided in the first region. The second semiconductor layer is provided between the plurality of first conductive layers and the semiconductor substrate. The second semiconductor layer is connected to the first semiconductor layer. A third semiconductor layer and a fourth semiconductor layer are provided in the second region. The third semiconductor layer and the fourth semiconductor layer are aligned in the first direction. A second conductive layer is provided in the second region. The second conductive layer is electrically connected to the third semiconductor layer, the fourth semiconductor layer, and the semiconductor substrate. A fifth semiconductor layer is provided in the third region. The fifth semiconductor layer extends in a second direction intersecting the first direction and comprising a portion formed continuously with the second semiconductor layer and a portion formed continuously with the third semiconductor layer. A sixth semiconductor layer is provided in the third region. The sixth semiconductor layer extends in the second direction and comprises a portion formed continuously with the second semiconductor layer and a portion formed continuously with the fourth semiconductor layer. The third region comprises a plurality of first portions and second portions aligned alternately in the second direction. In the plurality of first portions, the fifth semiconductor layer and the sixth semiconductor layer are separated in the first direction. In the plurality of second portions, the fifth semiconductor layer and the sixth semiconductor layer are electrically connected.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, some configurations, and so on, thereof will sometimes be omitted. Moreover, portions that are common to a plurality of embodiments will be assigned with the same symbols, and descriptions thereof will sometimes be omitted.

Moreover, when a "semiconductor memory device" is referred to in the present specification, it will sometimes mean a memory die, and will sometimes mean a memory system including a control die, of the likes of a memory chip, a memory card, or an SSD (Solid State Drive). Furthermore, it will sometimes mean a configuration including a host computer, of the likes of a smartphone, a tablet terminal, or a personal computer.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, even when, in the case of three transistors having been serially connected, the second transistor is in an OFF state, the first transistor is still "electrically connected" to the third transistor.

Moreover, in the present specification, when a first configuration is said to be "connected between" a second configuration and a third configuration, it will sometimes mean that the first configuration, the second configuration, and the third configuration are serially connected, and the second configuration is connected to the third configuration via the first configuration.

Moreover, in the present specification, a certain direction parallel to an upper surface of a substrate will be referred to as an X direction, a direction parallel to the upper surface of the substrate and perpendicular to the X direction will be referred to as a Y direction, and a direction perpendicular to the upper surface of the substrate will be referred to as a Z direction.

Moreover, in the present specification, sometimes, a direction lying along a certain plane will be referred to as a first direction, a direction intersecting the first direction along this certain plane will be referred to as a second direction, and a direction intersecting this certain plane will be referred to as a third direction. These first direction, second direction, and third direction may, but need not, correspond to any of the X direction, the Y direction, and the Z direction.

Moreover, in the present specification, expressions such as "up" or "down" will be defined with reference to the substrate. For example, an orientation of moving away from the substrate along the above-described Z direction will be referred to as up, and an orientation of coming closer to the substrate along the Z direction will be referred to as down. Moreover, when a lower surface or a lower end is referred to for a certain configuration, this will be assumed to mean a surface or end portion on a substrate side of this configuration, and when an upper surface or an upper end is referred to for a certain configuration, this will be assumed to mean a surface or end portion on an opposite side to the substrate of this configuration. Moreover, a surface intersecting the X direction or the Y direction will be referred to as a side surface, and so on.

Moreover, in the present specification, when the likes of a "width", a "length", or a "thickness" in a certain direction is referred to for a configuration, a member, and so on, this will sometimes mean a width, a length, or a thickness, and so on, in a cross section observed by the likes of SEM (Scanning Electron Microscopy) or TEM (Transmission Electron Microscopy), and so on.

First Embodiment

FIG. 1 is a schematic circuit diagram showing a configuration of a memory die MD according to a first embodiment.

The memory die MD comprises a memory cell array MCA and a peripheral circuit PC.

The memory cell array MCA comprises a plurality of memory blocks BLK. These plurality of memory blocks BLK each comprise a plurality of string units SU. These plurality of string units SU each comprise a plurality of memory strings MS. One ends of these plurality of memory strings MS are respectively connected to the peripheral circuit PC via bit lines BL. Moreover, the other ends of these plurality of memory strings MS are each connected to the peripheral circuit PC via a common source line SL.

The memory string MS comprises a drain side select transistor STD, a plurality of memory cells MC (memory transistors), a source side select transistor STS, and a source side select transistor STSb. The drain side select transistor STD, the plurality of memory cells MC, the source side select transistor STS, and the source side select transistor STSb are connected in series between the bit line BL and the source line SL. Hereafter, the drain side select transistor STD, the source side select transistor STS, and the source side select transistor STSb will sometimes simply be referred to as select transistors (STD, STS, STSb).

The memory cell MC is a field effect type transistor. The memory cell MC comprises a semiconductor layer, a gate insulating film, and a gate electrode. The semiconductor layer functions as a channel region. The gate insulating film includes a charge accumulating film. A threshold voltage of the memory cell MC changes according to an amount of charge in the charge accumulating film. The memory cell MC stores 1 bit or a plurality of bits of data. Note that the gate electrodes of the plurality of memory cells MC corresponding to one memory string MS are respectively connected to word lines WL. These word lines WL are respectively commonly connected to all of the memory strings MS in one memory block BLK.

The select transistors (STD, STS, STSb) are field effect type transistors. The select transistors (STD, STS, STSb) each comprise a semiconductor layer, a gate insulating film, and a gate electrode. The semiconductor layer functions as a channel region. The gate electrodes of the select transistors (STD, STS, STSb) are respectively connected with select gate lines (SGD, SGS, SGSb). One drain side select gate line SGD is commonly connected to all of the memory strings MS in one string unit SU. One source side select gate line SGS is commonly connected to all of the memory strings MS in one memory block BLK. One source side select gate line SGSb is commonly connected to all of the memory strings MS in one memory block BLK.

The peripheral circuit PC comprises, for example: a voltage generating circuit that generates an operation voltage; a voltage transfer circuit that transfers the generated operation voltage to selected ones of the bit lines BL, word lines WL, source line SL, select gate lines (SGD, SGS, SGSb), and so on; a sense amplifier module connected to the bit lines BL; and a sequencer that controls these voltage generating circuit, voltage transfer circuit, and sense amplifier module.

[Structure of Memory Die MD]

Figure 2:
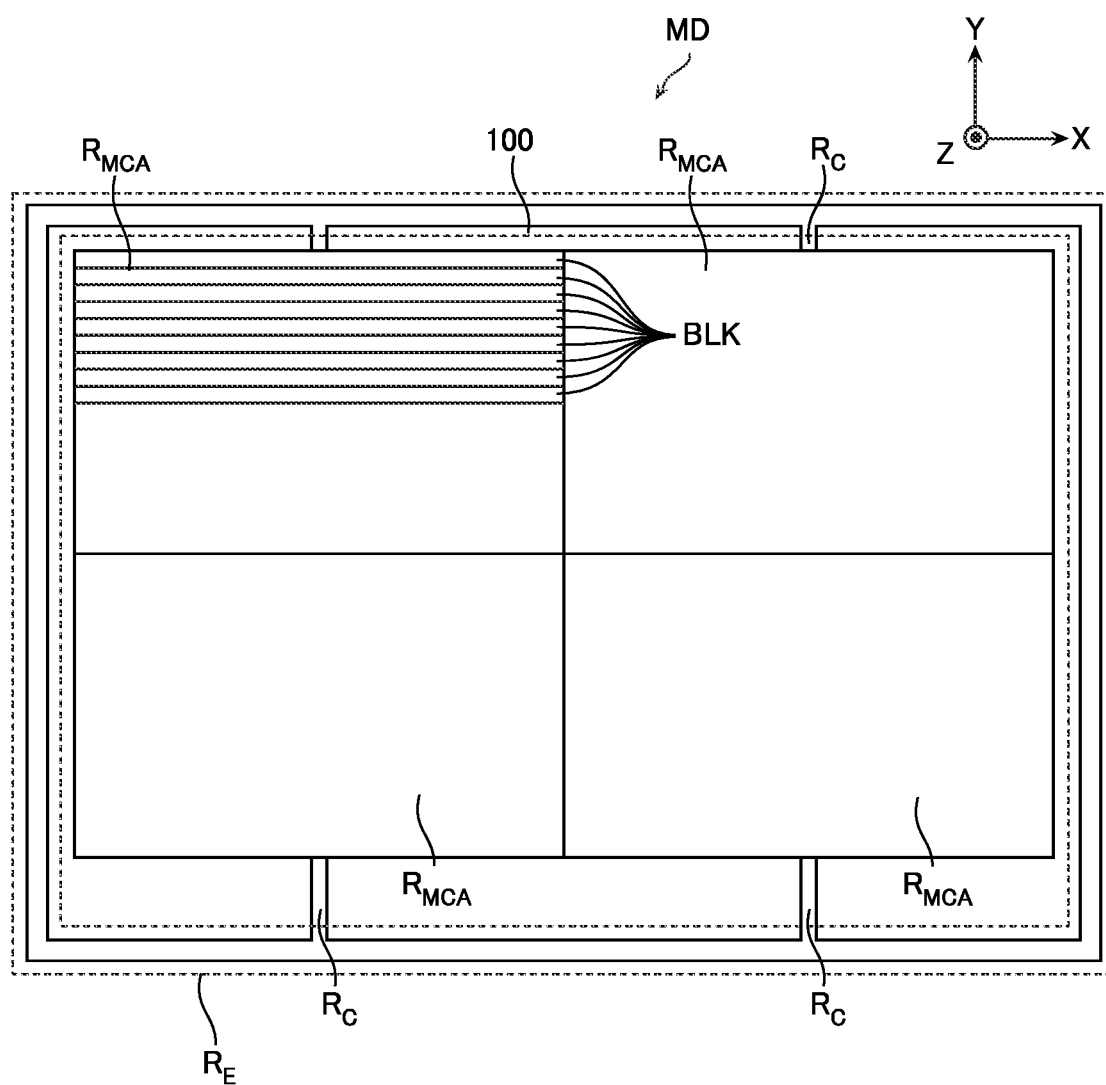
FIG. 2 is a schematic plan view of same semiconductor memory device.
Figure 3:
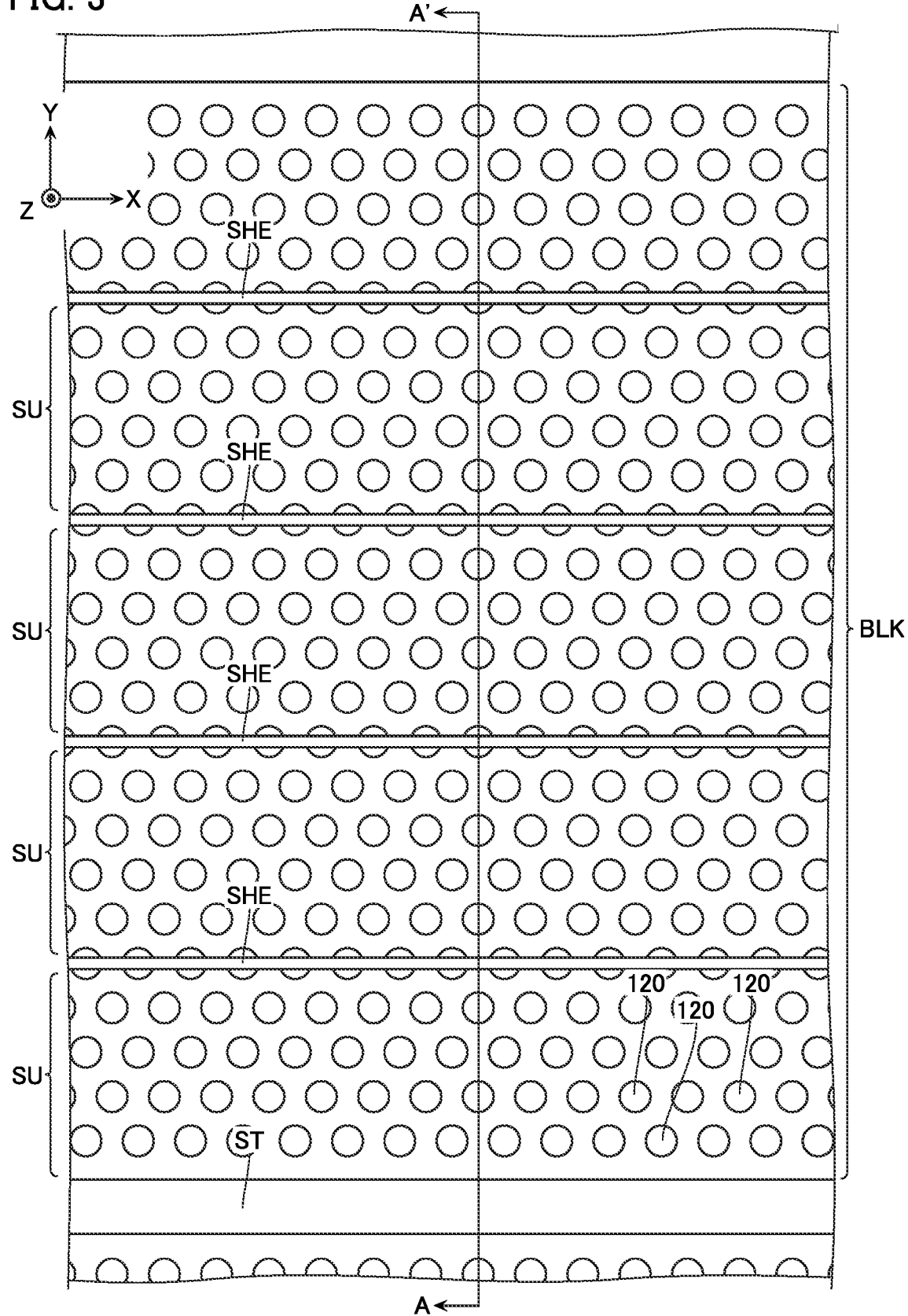
FIG. 3 is a schematic enlarged view of part of FIG. 2.
Figure 4:
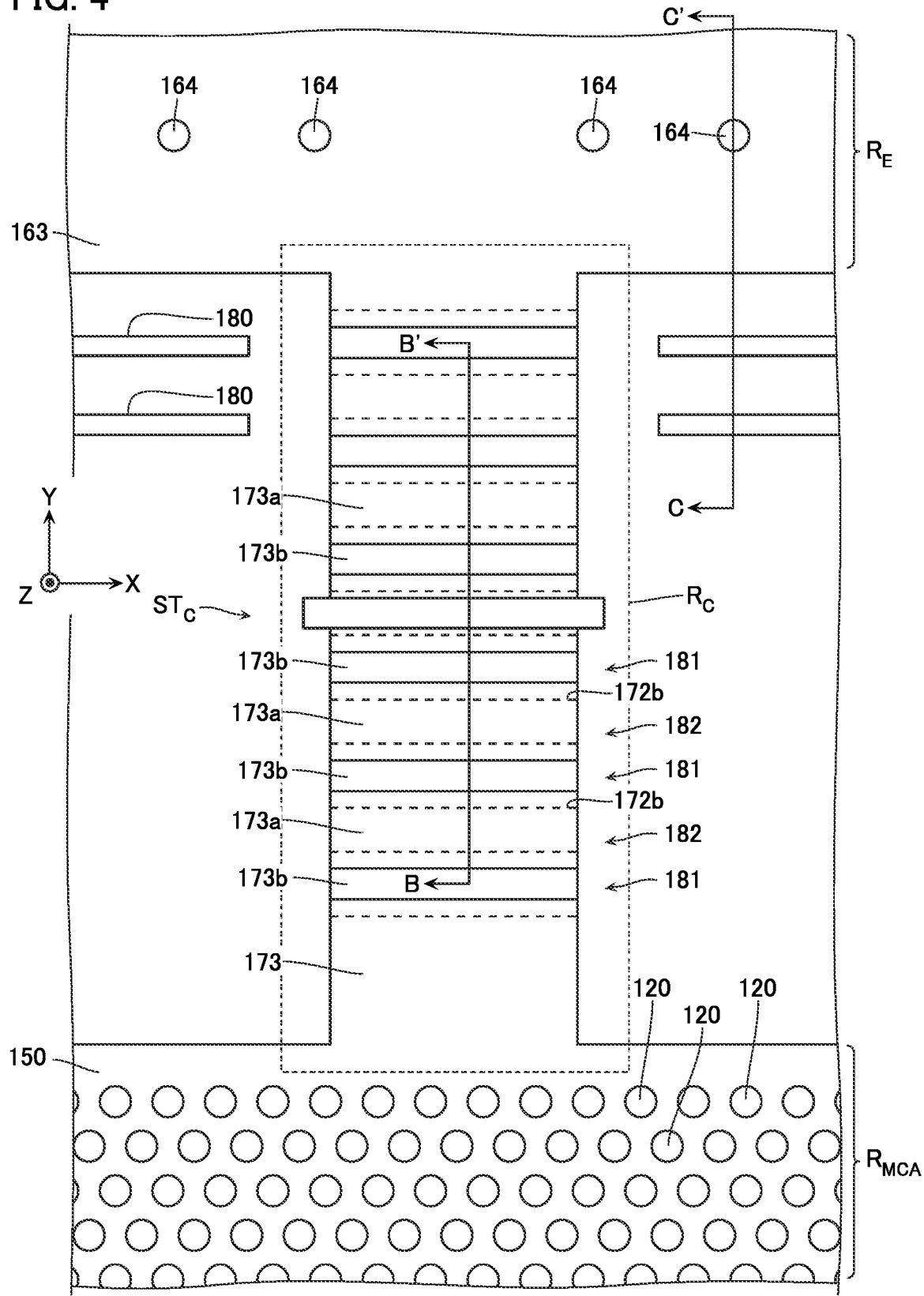
FIG. 4 is a schematic enlarged view of part of FIG. 2.
Figure 5:
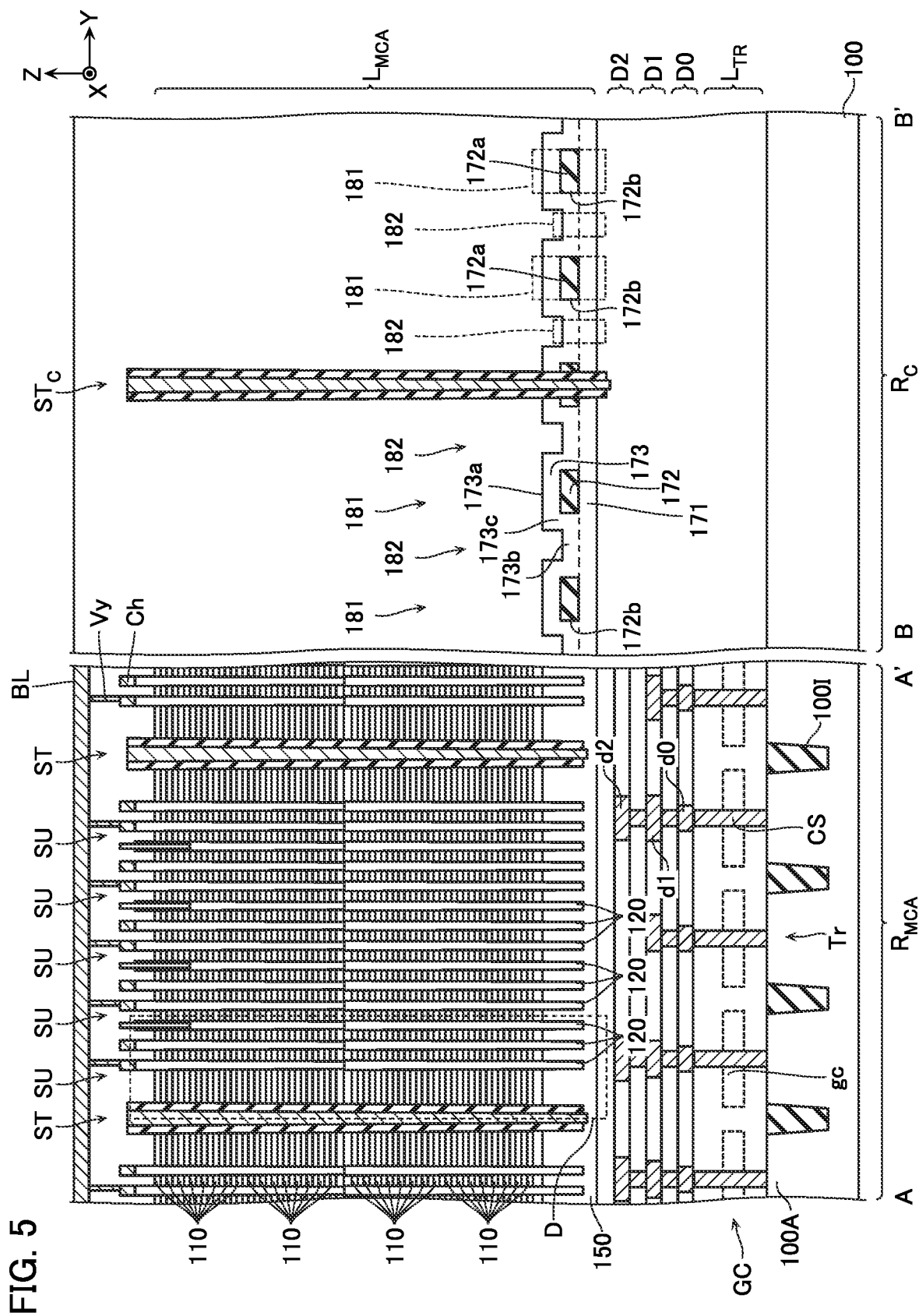
FIG. 5 is a schematic cross-sectional view of same semiconductor memory device.
Figure 6:
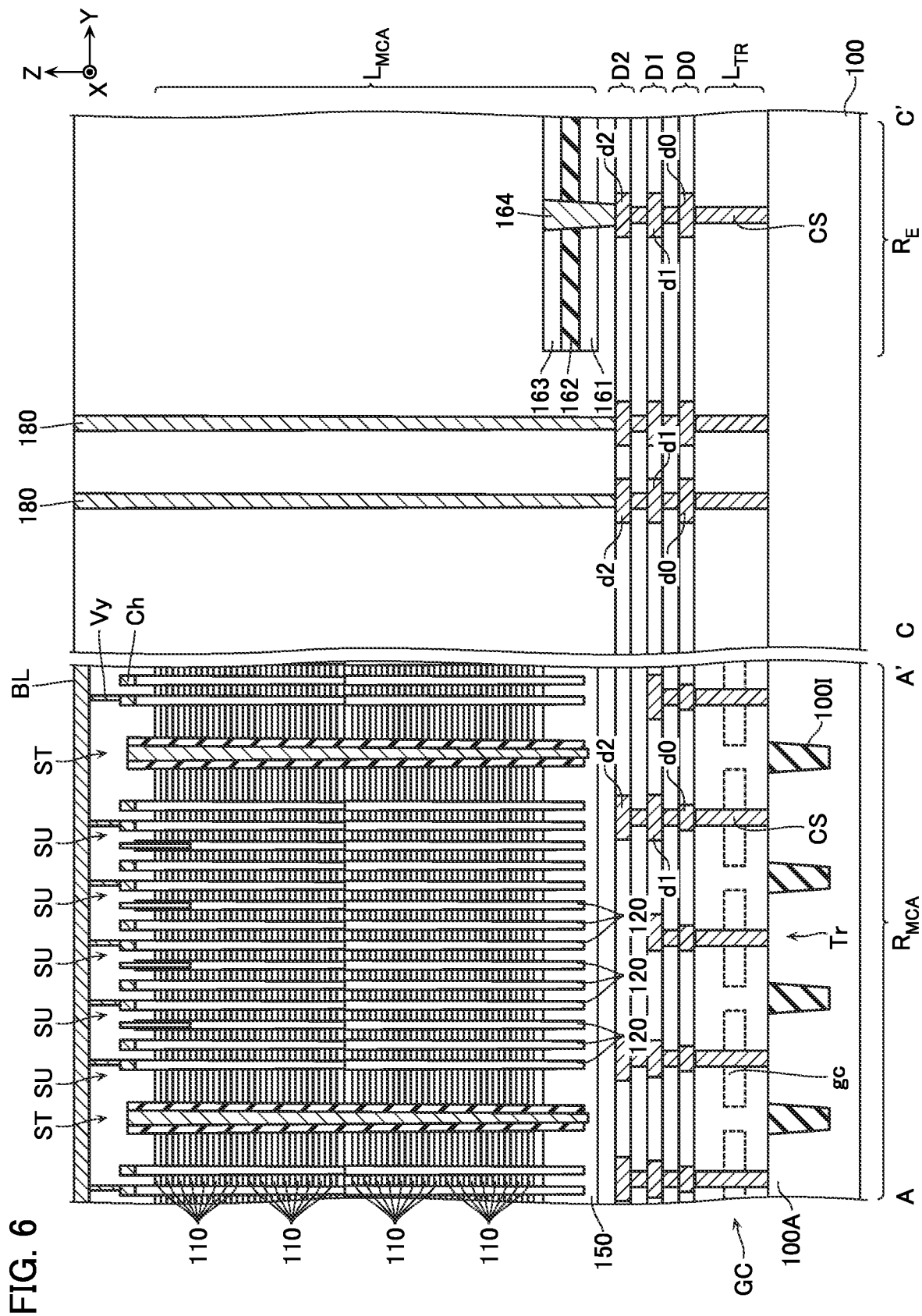
FIG. 6 is a schematic cross-sectional view of same semiconductor memory device.
Figure 7:
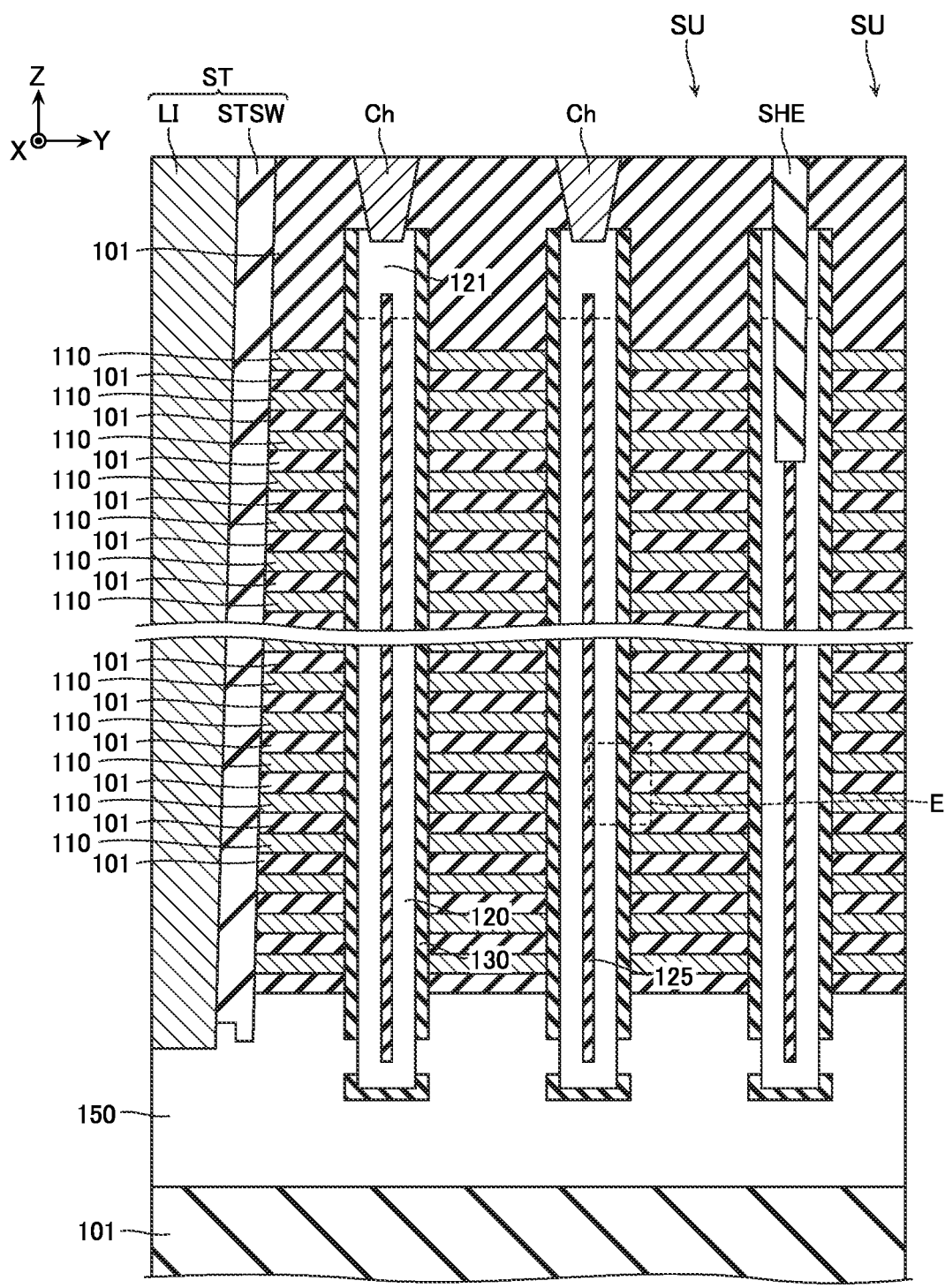
FIG. 7 is a schematic enlarged view of the portion indicated by D in FIG. 5.
Figure 8:
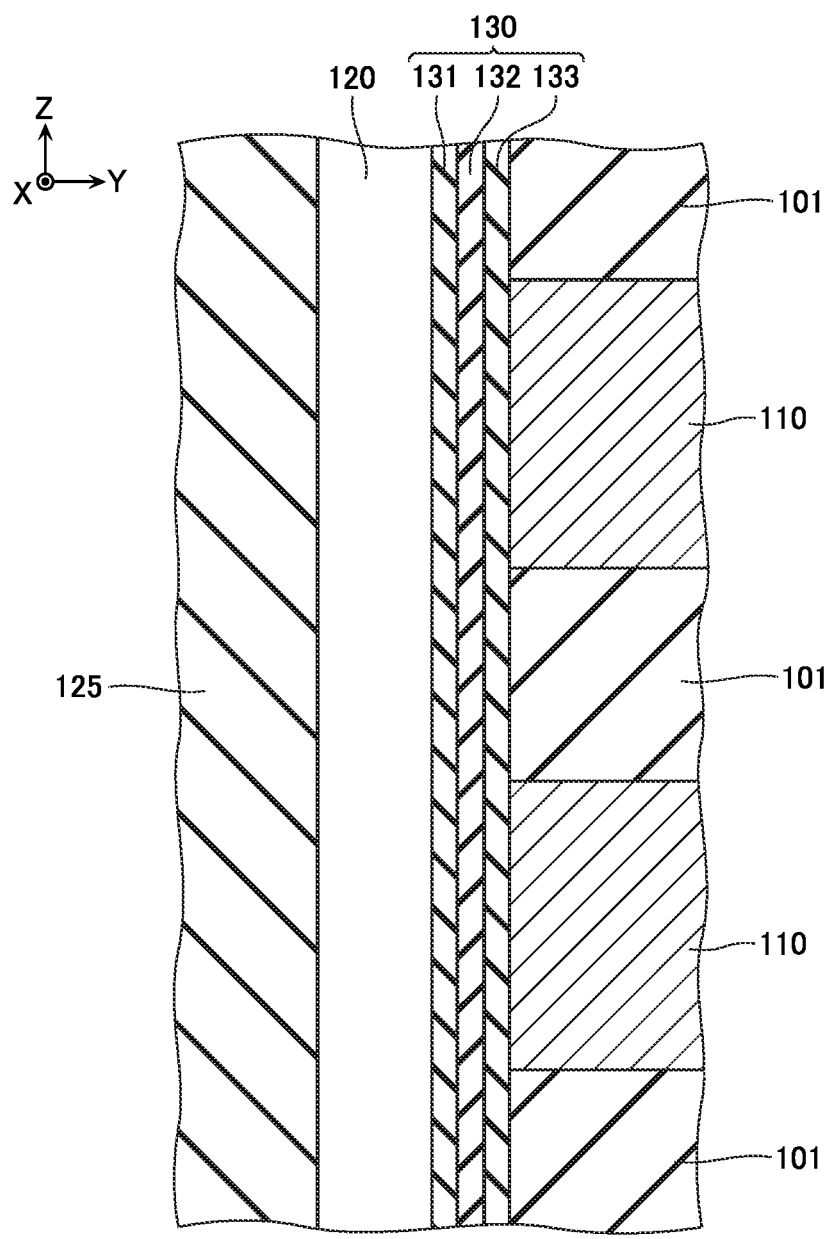
FIG. 8 is a schematic enlarged view of the portion indicated by E in FIG. 7.

FIG. 2 is a schematic plan view of the memory die MD. FIGS. 3 and 4 are schematic enlarged views of parts of FIG. 2. FIGS. 5 and 6 are schematic cross-sectional views of the memory die MD. Note that FIG. 5 includes a schematic cross section in which the structure shown in FIG. 3 has been cut along the line A-A' and viewed along a direction of the arrows. In addition, FIG. 5 includes a schematic cross section in which the structure shown in FIG. 4 has been cut along the line B-B' and viewed along a direction of the arrows. Moreover, FIG. 6 includes a schematic cross section in which the structure shown in FIG. 3 has been cut along the line A-A' and viewed along a direction of the arrows. In addition, FIG. 6 includes a schematic cross section in which the structure shown in FIG. 4 has been cut along the line C-C' and viewed along a direction of the arrows. FIG. 7 is a schematic enlarged view of the portion indicated by D in FIG. 5. FIG. 8 is a schematic enlarged view of the portion indicated by E in FIG. 7.

As shown in FIG. 2, for example, the memory die MD comprises a semiconductor substrate 100. In the example illustrated, the semiconductor substrate 100 is provided with four memory cell array regions $R_{MCA}$ aligned in the X direction and the Y direction. Moreover, end portions in the X direction and the Y direction of the semiconductor substrate 100 are provided with an edge seal region $R_E$. The edge seal region $R_E$ comprises: a portion extending in the Y direction along the end portion in the X direction of the semiconductor substrate 100; and a portion extending in the X direction along the end portion in the Y direction of the semiconductor substrate 100. Moreover, at least one connection region $R_C$ is provided between each of the memory cell array regions $R_{MCA}$ and the edge seal region $R_E$.

As shown in FIG. 5, for example, the memory die MD comprises: the semiconductor substrate 100; a transistor layer $L_{TR}$ provided on the semiconductor substrate 100; a wiring layer D0 provided above the transistor layer $L_{TR}$; a wiring layer D1 provided above the wiring layer D0; a wiring layer D2 provided above the wiring layer D1; and a memory cell array layer $L_{MCA}$ provided above the wiring layer D2.

[Structure of Semiconductor Substrate 100]

The semiconductor substrate 100 is a semiconductor substrate configured from P type silicon (Si) including a P type impurity such as boron (B), for example. As shown in FIG. 5, for example, a surface of the semiconductor substrate 100 is provided with an active region 100A and an insulating region 100I. The active region 100A may be an N type well region including an N type impurity such as phosphorus (P), may be a P type well region including a P type impurity such as boron (B), or may be a semiconductor substrate region where the N type well region and the P type well region are not provided.

[Structure of Transistor Layer $L_{TR}$]

As shown in FIG. 5, for example, a wiring layer GC is provided above an upper surface of the semiconductor substrate 100, via an unillustrated insulating layer. The wiring layer GC includes a plurality of electrodes gc that face the surface of the semiconductor substrate 100. Moreover, each of the regions of the semiconductor substrate 100 and the plurality of electrodes gc included in the wiring layer GC are respectively connected to contacts CS.

The active regions 100A of the semiconductor substrate 100 respectively function as the likes of channel regions of a plurality of transistors Tr and electrodes on one sides of a plurality of capacitors configuring the peripheral circuit PC (FIG. 1).

The plurality of electrodes gc included in the wiring layer GC respectively function as the likes of gate electrodes of the plurality of transistors Tr and electrodes on the other sides of the plurality of capacitors configuring the peripheral circuit PC (FIG. 1).

The contact CS extends in the Z direction, and has its lower end connected to an upper surface of the semiconductor substrate 100 or an upper surface of the electrode gc. A connecting portion of the contact CS and the semiconductor substrate 100 is provided with an impurity region including an N type impurity or a P type impurity. The contact CS may include, for example, a stacked film of a barrier conductive film of the likes of titanium nitride (TiN) and a metal film of the likes of tungsten (W), or the like.

[Structure of Wiring Layers D0, D1, D2]

As shown in FIG. 5, for example, a plurality of wirings included in the wiring layers D0, D1, D2 are electrically connected to at least one of configurations in the memory cell array MCA and configurations in the peripheral circuit PC.

The wiring layers D0, D1, D2 respectively include pluralities of wirings d0, d1, d2. These pluralities of wirings d0, d1, d2 may each include, for example, a stacked film of a barrier conductive film of the likes of titanium nitride (TiN) and a metal film of the likes of tungsten (W), or the like.

[Structure of Memory Cell Array Layer $L_{MCA}$]

Next, a structure of the memory cell array layer $L_{MCA}$ will be described.

[Structure of Memory Cell Array Region $R_{MCA}$]

As shown in FIG. 2, for example, the memory cell array region $R_{MCA}$ is provided with a plurality of the memory blocks BLK aligned in the Y direction. As shown in FIG. 3, for example, the memory block BLK comprises a plurality of the string units SU aligned in the Y direction. An inter-block structure ST is provided between two memory blocks BLK adjacent in the Y direction. Moreover, an inter-string unit insulating layer SHE of the likes of silicon oxide ($SiO_2$) is provided between two string units SU adjacent in the Y direction.

As shown in FIG. 7, for example, the memory block BLK comprises: a plurality of conductive layers 110 aligned in the Z direction; a plurality of semiconductor layers 120 extending in the Z direction; and a plurality of gate insulating films 130 respectively provided between the plurality of conductive layers 110 and the plurality of semiconductor layers 120.

The conductive layer 110 is a substantially plate-like conductive layer extending in the X direction. The conductive layer 110 may include a stacked film of a barrier conductive film of the likes of titanium nitride (TiN) and a metal film of the likes of tungsten (W), or the like. Moreover, the conductive layer 110 may include the likes of polycrystalline silicon including an impurity such as phosphorus (P) or boron (B), for example. An insulating layer 101 of the likes of silicon oxide ($SiO_2$) is provided between the plurality of conductive layers 110 aligned in the Z direction.

A semiconductor layer 150 is provided below the conductive layers 110. The semiconductor layer 150 may include the likes of polycrystalline silicon including an impurity such as phosphorus (P) or boron (B), for example. Moreover, the insulating layer 101 of the likes of silicon oxide ($SiO_2$) is provided between the semiconductor layer 150 and the conductive layers 110.

The semiconductor layer 150 functions as the source line SL (FIG. 1). The source line SL is commonly provided for all of the memory blocks BLK included in the memory cell array region $R_{MCA}$ (FIG. 2), for example.

Moreover, one or a plurality of the conductive layers 110 positioned in a lowermost layer, of the plurality of conductive layers 110 function as the source side select gate lines SGS, SGSb (FIG. 1) and as the gate electrodes of the pluralities of source side select transistors STS, STSb (FIG. 1) connected to these source side select gate lines SGS, SGSb. These plurality of conductive layers 110 are electrically independent every memory block BLK.

Moreover, the plurality of conductive layers 110 positioned more upwardly than these lowermost layer-positioned conductive layers 110 function as the word lines WL (FIG. 1) and as the gate electrodes of the pluralities of memory cells MC (FIG. 1) connected to these word lines WL. These plurality of conductive layers 110 are each electrically independent every memory block BLK.

Moreover, one or a plurality of the conductive layers 110 positioned more upwardly than these word line WL-functioning conductive layers 110 function as the drain side select gate line SGD (FIG. 1) and as the gate electrodes of the plurality of drain side select transistors STD (FIG. 1) connected to this drain side select gate line SGD. These plurality of conductive layers 110 have a smaller width in the Y direction than the other conductive layers 110. Moreover, the inter-string unit insulating layer SHE is provided between twos of these pluralities of conductive layers 110 adjacent in the Y direction. These plurality of conductive layers 110 are each electrically independent every string unit SU.

As shown in FIG. 3, for example, the semiconductor layers 120 are aligned in a certain pattern in the X direction and the Y direction. The semiconductor layer 120 functions as the channel regions of the plurality of memory cells MC and the select transistors (STD, STS, STSb) included in one memory string MS (FIG. 1). The semiconductor layer 120 is a semiconductor layer of the likes of polycrystalline silicon (Si), for example. As shown in FIG. 7, for example, the semiconductor layer 120 has a substantially bottomed cylindrical shape, and has its central portion provided with an insulating layer 125 of the likes of silicon oxide. Moreover, an outer peripheral surface of the semiconductor layer 120 is surrounded by respective ones of the conductive layers 110, and faces the conductive layers 110.

An upper end portion of the semiconductor layer 120 is provided with an impurity region 121 that includes an N type impurity of the likes of phosphorus (P). In the example of FIG. 7, a boundary line of the upper end portion of the semiconductor layer 120 and a lower end portion of the impurity region 121 is indicated by a broken line. The impurity region 121 is connected to the bit line BL via a contact Ch and a contact Vy (FIG. 5).

A lower end portion of the semiconductor layer 120 is connected to the above-described semiconductor layer 150.

The gate insulating film 130 has a substantially bottomed cylindrical shape covering the outer peripheral surface of the semiconductor layer 120. As shown in FIG. 8, for example, the gate insulating film 130 comprises a tunnel insulating film 131, a charge accumulating film 132, and a block insulating film 133 that are stacked between the semiconductor layer 120 and the conductive layers 110. The tunnel insulating film 131 and the block insulating film 133 are insulating films of the likes of silicon oxide ($SiO_2$), for example. The charge accumulating film 132 is a film capable of accumulating a charge, of the likes of silicon nitride ($Si_3N_4$), for example. The tunnel insulating film 131, the charge accumulating film 132, and the block insulating film 133 have substantially cylindrical shapes, and extend in the Z direction along the outer peripheral surface of the semiconductor layer 120 excluding a contacting portion of the semiconductor layer 120 and the semiconductor layer 150.

Note that FIG. 8 shows an example where the gate insulating film 130 comprises the charge accumulating film 132 of the likes of silicon nitride. However, the gate insulating film 130 may comprise a floating gate of the likes of polycrystalline silicon including an N type or P type impurity, for example.

As shown in FIG. 7, for example, the inter-block structure ST comprises: a conductive layer LI; and an insulating layer STSW of the likes of silicon oxide ($SiO_2$) provided on a side surface in the Y direction of the conductive layer LI. The conductive layer LI is a substantially plate-like conductive layer extending in the X direction and the Z direction. The conductive layer LI may include a stacked film of a barrier conductive film of the likes of titanium nitride (TiN) and a metal film of the likes of tungsten (W), or the like. Moreover, the conductive layer LI may include the likes of polycrystalline silicon including an impurity such as phosphorus (P) or boron (B), for example. A lower end of the conductive layer LI is connected to the semiconductor layer 150. The conductive layer LI functions as part of the source line SL (FIG. 1).

[Structure of Edge Seal Region $R_E$]

As shown in FIG. 6, the edge seal region $R_E$ is provided with: a semiconductor layer 161; an insulating layer 162 of the likes of silicon nitride ($Si_3N_4$) provided on an upper surface of the semiconductor layer 161; and a semiconductor layer 163 provided on an upper surface of the insulating layer 162. The semiconductor layers 161, 163 may include the likes of polycrystalline silicon including an impurity such as phosphorus (P) or boron (B), for example.

In addition, the edge seal region $R_E$ is provided with a conductive layer 164 that extends in the Z direction penetrating the semiconductor layer 161, the insulating layer 162, and the semiconductor layer 163. Parts of an outer peripheral surface of the conductive layer 164 contact the semiconductor layers 161, 163. A lower end of the conductive layer 164 is connected to the wiring d2. The conductive layer 164 is connected to the active region 100A of the semiconductor substrate 100 via the wirings d2, d1, d0 and the contact CS.

Note that, as shown in FIG. 6, a region on an inner side of the edge seal region $R_E$ is provided with a crack stopper 180. The crack stopper 180 may include, for example, a stacked film of a barrier conductive film of the likes of titanium nitride (TiN) and a metal film of the likes of tungsten (W), or the like. A lower end of the crack stopper 180 is connected to the wiring d2. The crack stopper 180 is connected to the active region 100A of the semiconductor substrate 100 via the wirings d2, d1, d0 and the contact CS. Moreover, a position of an upper end of the crack stopper 180 is positioned more upwardly than the bit line BL, although illustration of this is omitted. The upper end of the crack stopper 180 may be connected to an unillustrated contact electrode, for example. Moreover, the crack stopper 180 may be electrically continuous, via the likes of this contact electrode, with a bonding pad electrode applied with a ground voltage. The crack stopper 180 extends in the X direction and the Y direction along the edge seal region $R_E$. However, as shown in FIG. 4, for example, the crack stopper 180 is disposed avoiding the connection region $R_C$.

[Structure of Connection Region $R_C$]

As shown in FIG. 5, the connection region $R_C$ is provided with: a semiconductor layer 171; an insulating layer 172 of the likes of silicon nitride ($Si_3N_4$) provided on an upper surface of the semiconductor layer 171; and a semiconductor layer 173 provided on an upper surface of the insulating layer 172. The semiconductor layers 171, 173 may include the likes of polycrystalline silicon including an impurity such as phosphorus (P) or boron (B), for example. Note that in FIG. 5, a boundary line of the semiconductor layer 171 and the semiconductor layer 173 is indicated by a one dot-chain line. As shown in FIG. 4, the semiconductor layer 171, the insulating layer 172, and the semiconductor layer 173 extend in the Y direction.

The semiconductor layer 171 comprises a portion formed continuously with the semiconductor layer 150 and a portion formed continuously with the semiconductor layer 161. A height position of a lower surface of the semiconductor layer 171 may match a height position of lower surfaces of the semiconductor layer 150 and the semiconductor layer 161, for example. Moreover, for example, a height position of the upper surface of the semiconductor layer 171 may match a height position of the upper surface of the semiconductor layer 161.

The insulating layer 172 comprises a portion formed continuously with the insulating layer 162. A height position of a lower surface of the insulating layer 172 may match a height position of a lower surface of the insulating layer 162, for example. Moreover, for example, a height position of an upper surface of the insulating layer 172 may match a height position of an upper surface of the insulating layer 162.

The semiconductor layer 173 comprises a portion formed continuously with the semiconductor layer 150 and a portion formed continuously with the semiconductor layer 163. A height position of a lower surface of part of the semiconductor layer 173 may match a height position of a lower surface of the semiconductor layer 163, for example. Moreover, for example, a height position of an upper surface of part of the semiconductor layer 173 may match a height position of upper surfaces of the semiconductor layer 150 and the semiconductor layer 163.

Moreover, the connection region $R_C$ is provided with a plurality of first regions 181 and second regions 182 aligned alternately in the Y direction.

As shown in FIG. 5, the insulating layer 172 comprises: a plurality of portions 172a provided correspondingly to the plurality of first regions 181; and a plurality of openings 172b provided correspondingly to the plurality of second regions 182. As shown in FIG. 4, end portions on one side and the other side in the X direction of the opening 172b reach end portion positions on one side and the other side in the X direction of the insulating layer 172.

As shown in FIG. 5, the semiconductor layer 173 comprises: a plurality of portions 173a provided correspondingly to the plurality of first regions 181; a plurality of portions 173b provided correspondingly to the plurality of second regions 182; and a plurality of portions 173c connecting these pluralities of portions 173a, 173b. The portion 173a is provided on an upper surface of the portion 172a. The portion 173b is provided on the upper surface of the semiconductor layer 171. The portion 173c is provided on side surfaces in the Y direction of the portion 172a.

Moreover, as shown in FIG. 5, the connection region $R_C$ is provided with a structure $ST_C$ that divides the semiconductor layer 171, the insulating layer 172, and the semiconductor layer 173 in the Y direction. The structure $ST_C$ is configured substantially similarly to the inter-block structure ST. However, the structure $ST_C$ penetrates the semiconductor layer 171, the insulating layer 172, and the semiconductor layer 173. That is, a lower end of the structure $ST_C$ is positioned more downwardly than the lower surface of the semiconductor layer 171.

[Manufacturing Method]

Next, a manufacturing method of the memory die MD will be described with reference to FIGS. 9 to 29. FIGS. 9 to 29 are schematic cross-sectional views for explaining same manufacturing method. Note that FIGS. 9 to 11, 16 to 22, 24, and 27 to 29 show cross sections corresponding to FIG. 5. Moreover, FIGS. 12 to 15 show cross sections corresponding to FIG. 6. Moreover, FIGS. 23, 25, and 26 show cross sections corresponding to FIG. 7.

Figure 9:
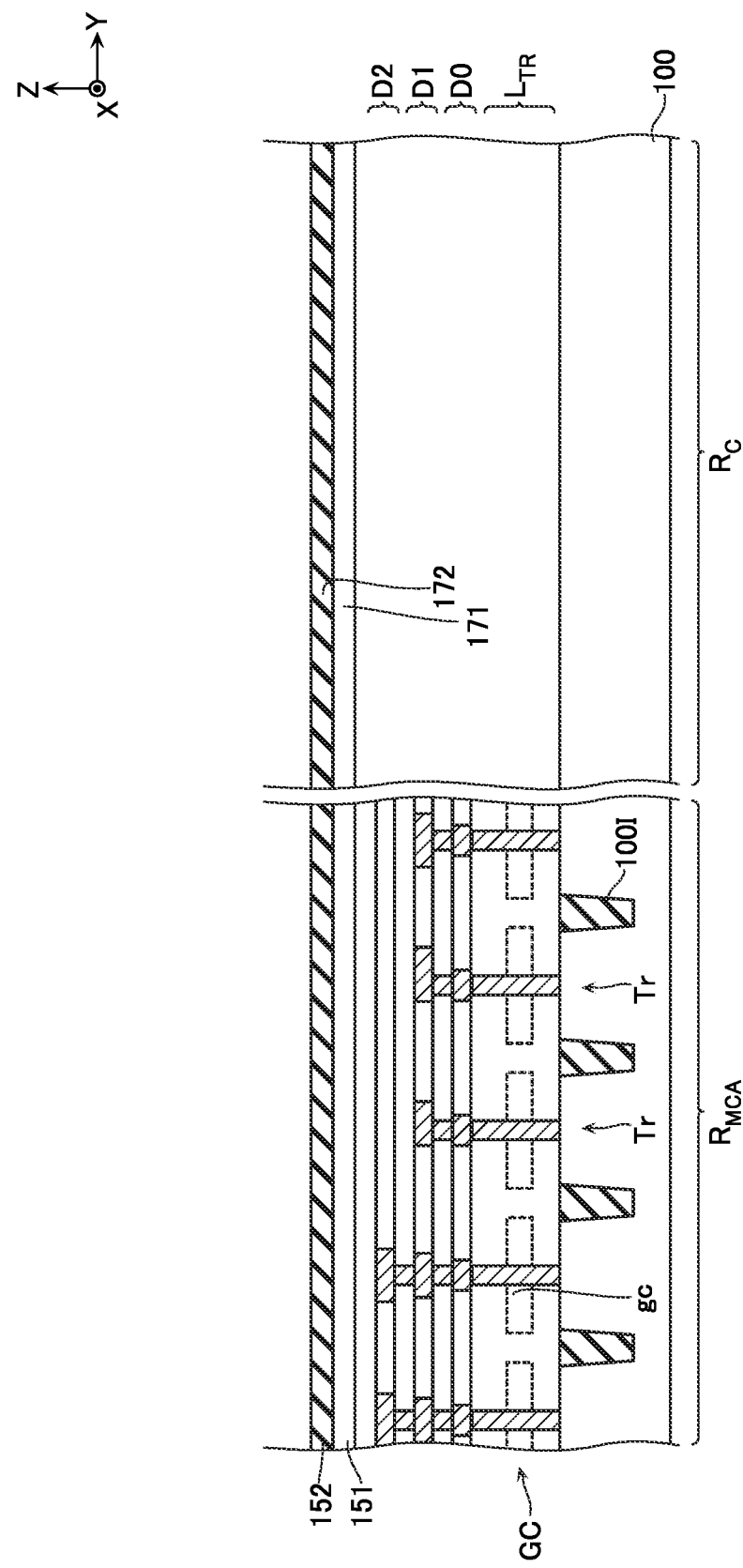
FIG. 9 is a schematic cross-sectional view for explaining a manufacturing method of the semiconductor memory device according to the first embodiment.

When manufacturing the memory die MD according to the present embodiment, first, the transistor layer $L_{TR}$, the wiring layer D0, the wiring layer D1, and the wiring layer D2 are formed on the semiconductor substrate 100, as shown in FIG. 9, for example.

Next, as shown in FIG. 9, for example, the semiconductor layers 151, 171 and insulating layers 152, 172 are formed above the wiring layer D2. This step is performed by a method such as CVD (Chemical Vapor Deposition), for example. Note that in this step, the semiconductor layer 161 and insulating layer 162 are formed too, although illustration of this is omitted.

Figure 10:
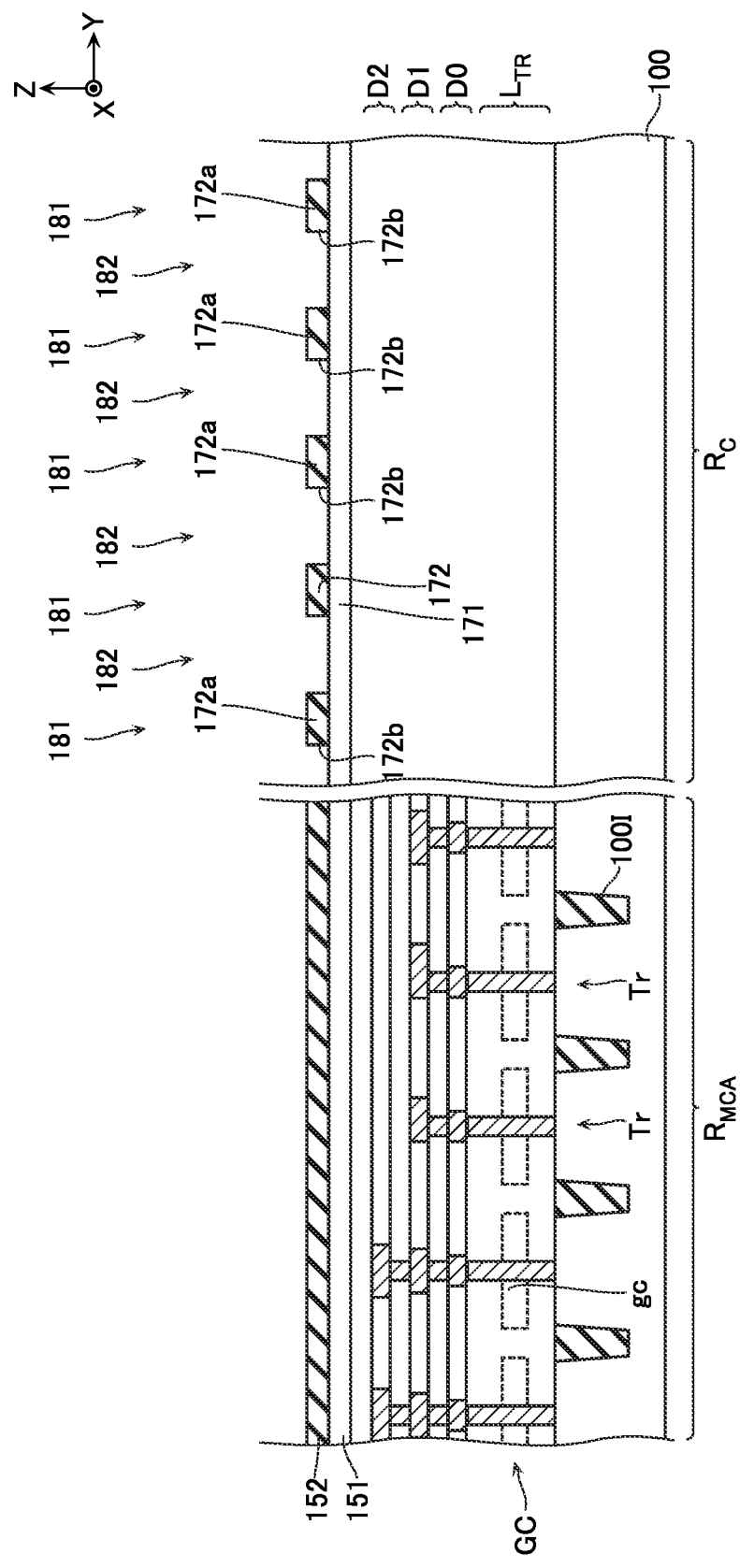
FIG. 10 is a schematic cross-sectional view for explaining same manufacturing method.

Next, as shown in FIG. 10, for example, the plurality of openings 172b are formed in the insulating layer 172, and the insulating layer 172 is divided into the plurality of portions 172a. This step is performed by a method such as wet etching, for example.

Figure 11:
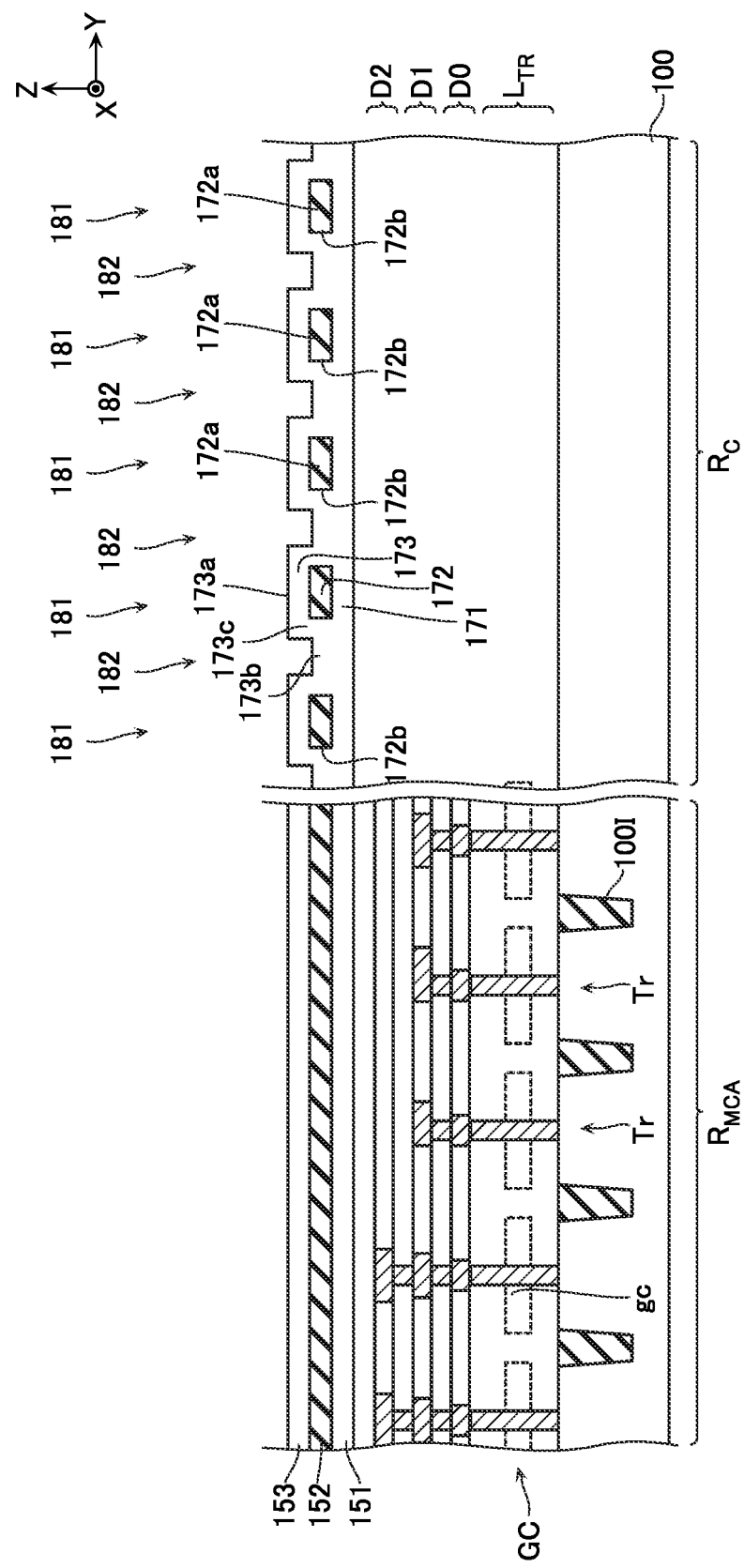
FIG. 11 is a schematic cross-sectional view for explaining same manufacturing method.

Next, as shown in FIG. 11, for example, the semiconductor layers 153, 173 are formed on upper surfaces of the insulating layers 152, 172 and semiconductor layer 171, and on side surfaces in the Y direction of the portions 172a. This step is performed by a method such as CVD, for example. Note that as illustrated, the semiconductor layer 173 is formed along the plurality of openings 172b formed in the insulating layer 172. Hence, the above-mentioned pluralities of portions 173a, 173b, 173c are formed in the connection region $R_C$. Moreover, in this step, the semiconductor layer 163 is formed too, although illustration of this is omitted.

Figure 12:
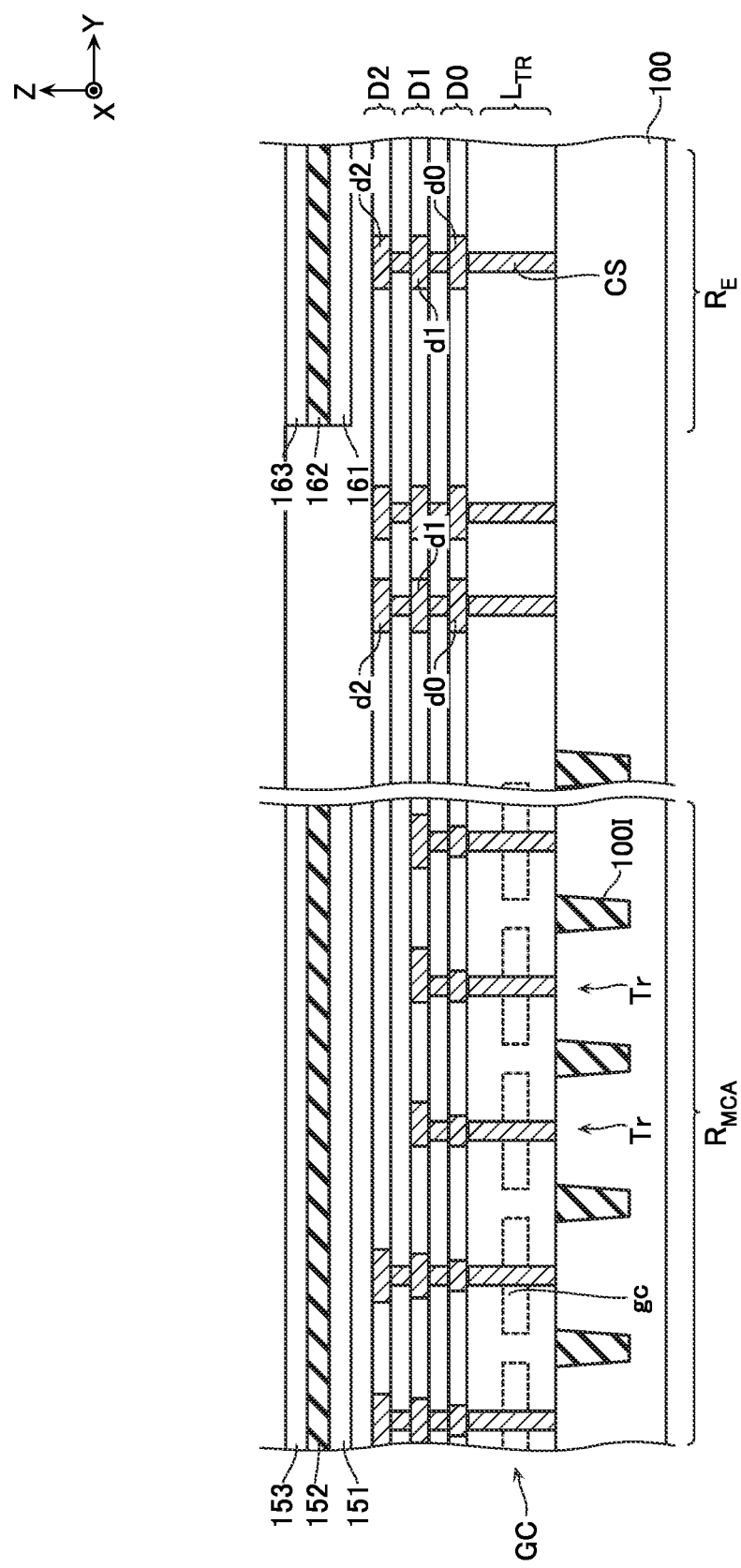
FIG. 12 is a schematic cross-sectional view for explaining same manufacturing method.
Figure 13:
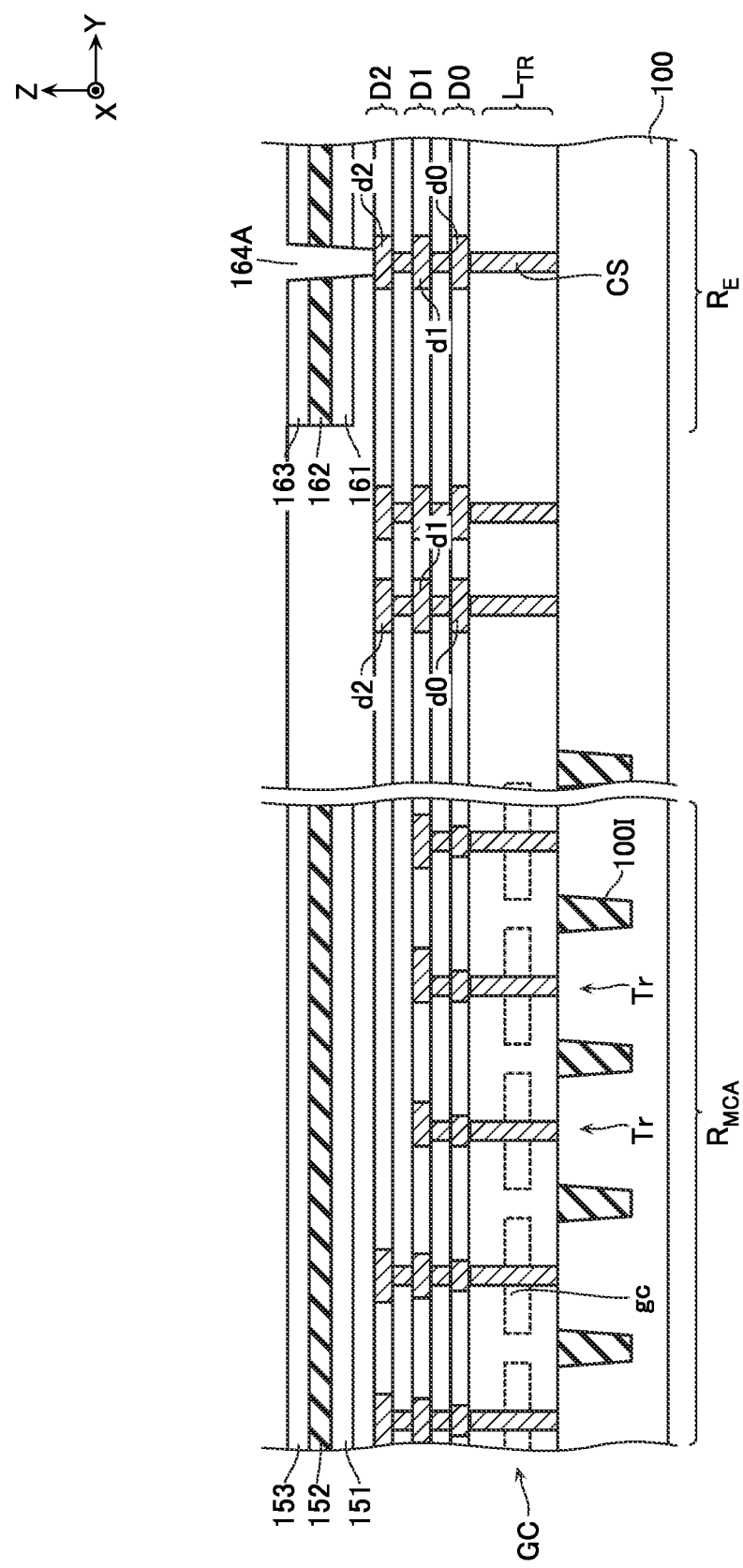
FIG. 13 is a schematic cross-sectional view for explaining same manufacturing method.

Next, as shown in FIGS. 12 and 13, for example, a contact hole 164A is formed at a position corresponding to the conductive layer 164. The contact hole 164A is a through-hole that extends in the Z direction, penetrates the semiconductor layer 161, insulating layer 162, and semiconductor layer 163, and exposes an upper surface of the wiring d2. This step is performed by a method such as RIE (Reactive Ion Etching), for example.

Figure 14:
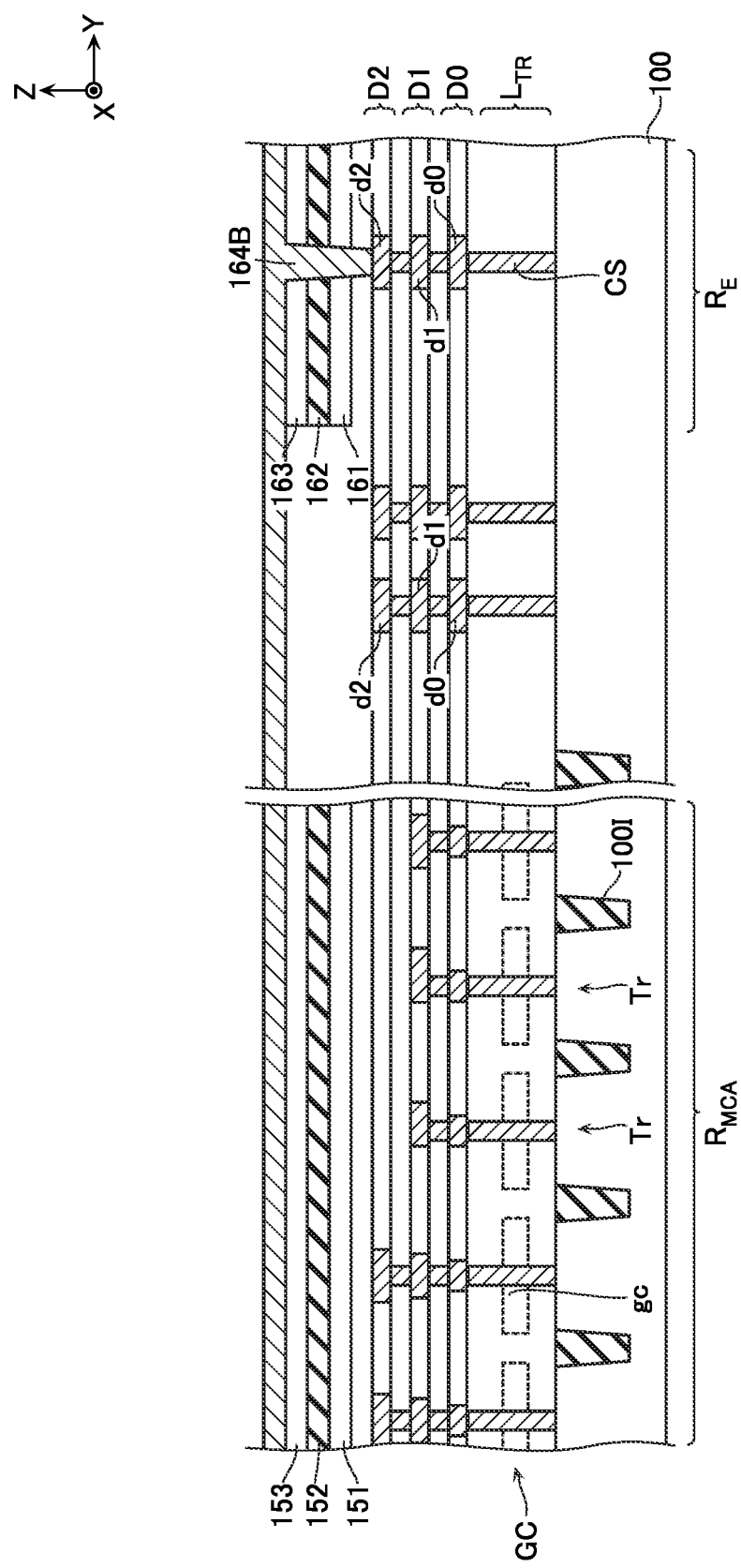
FIG. 14 is a schematic cross-sectional view for explaining same manufacturing method.

Next, as shown in FIG. 14, for example, a conductive layer 164B is formed on an inner peripheral surface of the contact hole 164A and on upper surfaces of the semiconductor layers 153, 163. This step is performed by a method such as CVD, for example.

Figure 15:
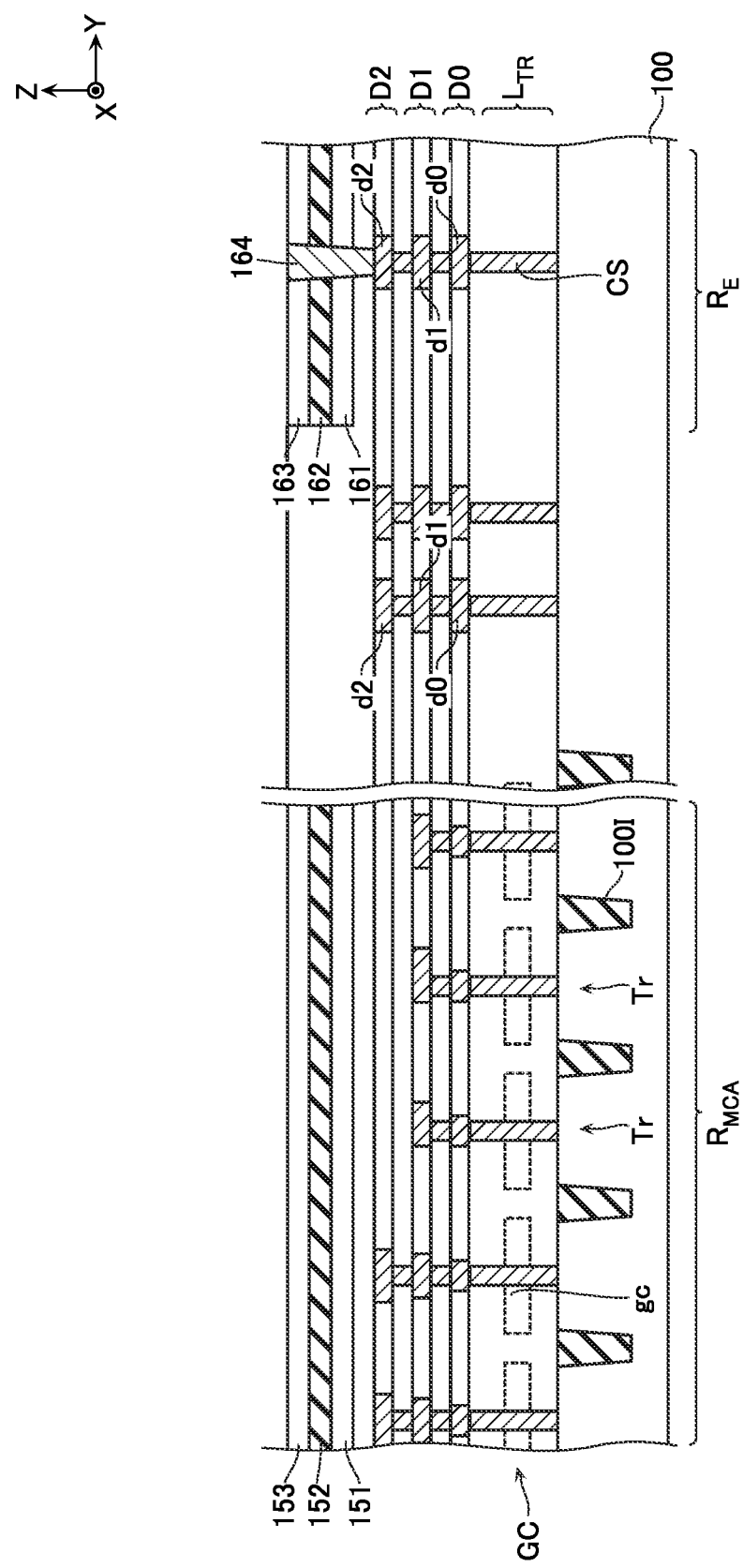
FIG. 15 is a schematic cross-sectional view for explaining same manufacturing method.

Next, as shown in FIG. 15, for example, the conductive layer 164B is removed, except for a portion thereof formed on an inside of the contact hole 164A. This step is performed by a method such as CMP (Chemical Mechanical Polishing), for example. Due to this step, the conductive layer 164 is formed.

Figure 16:
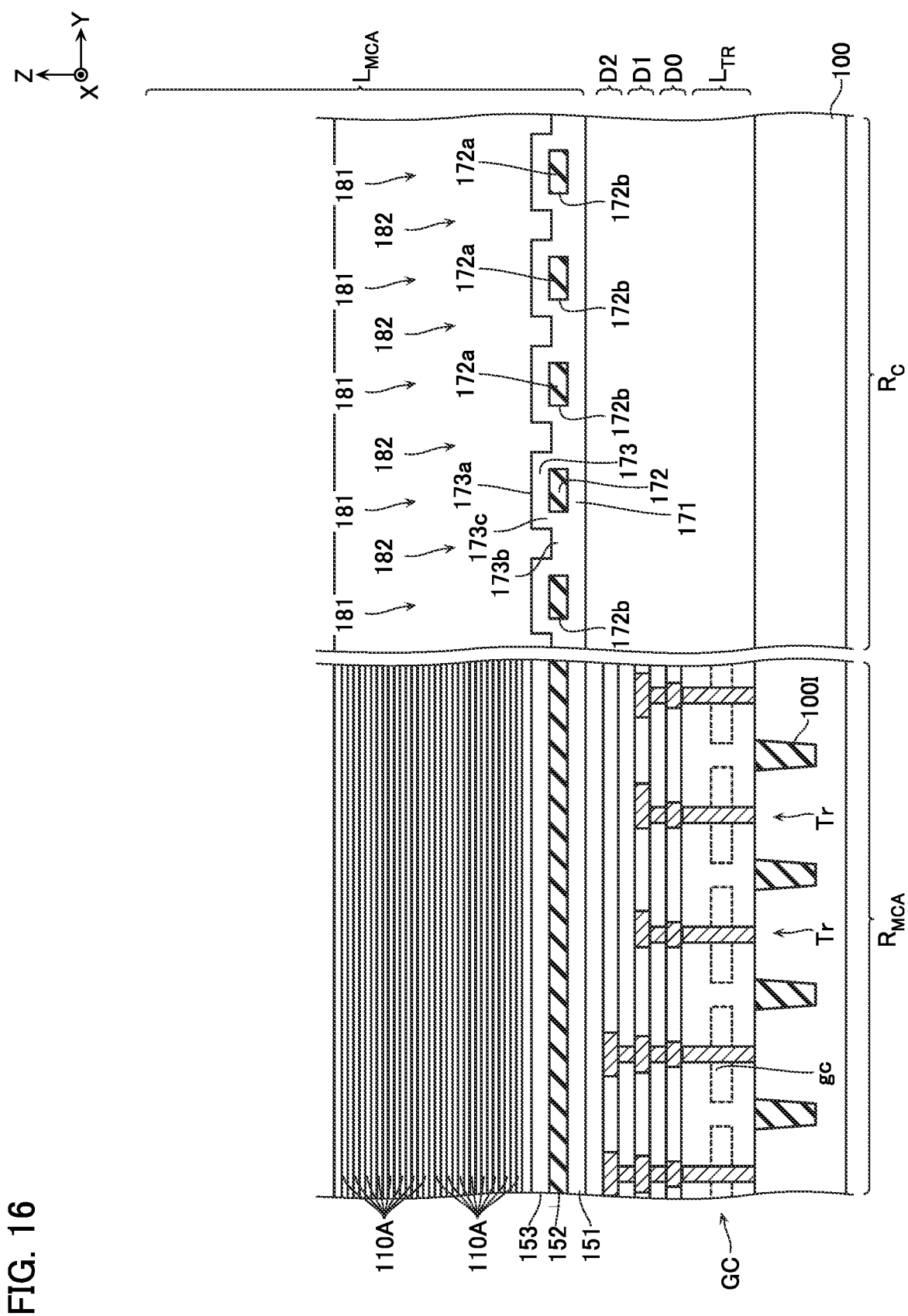
FIG. 16 is a schematic cross-sectional view for explaining same manufacturing method.

Next, as shown in FIG. 16, for example, a plurality of the insulating layers 101 and a plurality of sacrifice layers 110A are formed alternately above the semiconductor layer 153. The sacrifice layer 110A includes the likes of silicon nitride ($Si_3N_4$), for example. This step is performed by a method such as CVD, for example.

Figure 17:
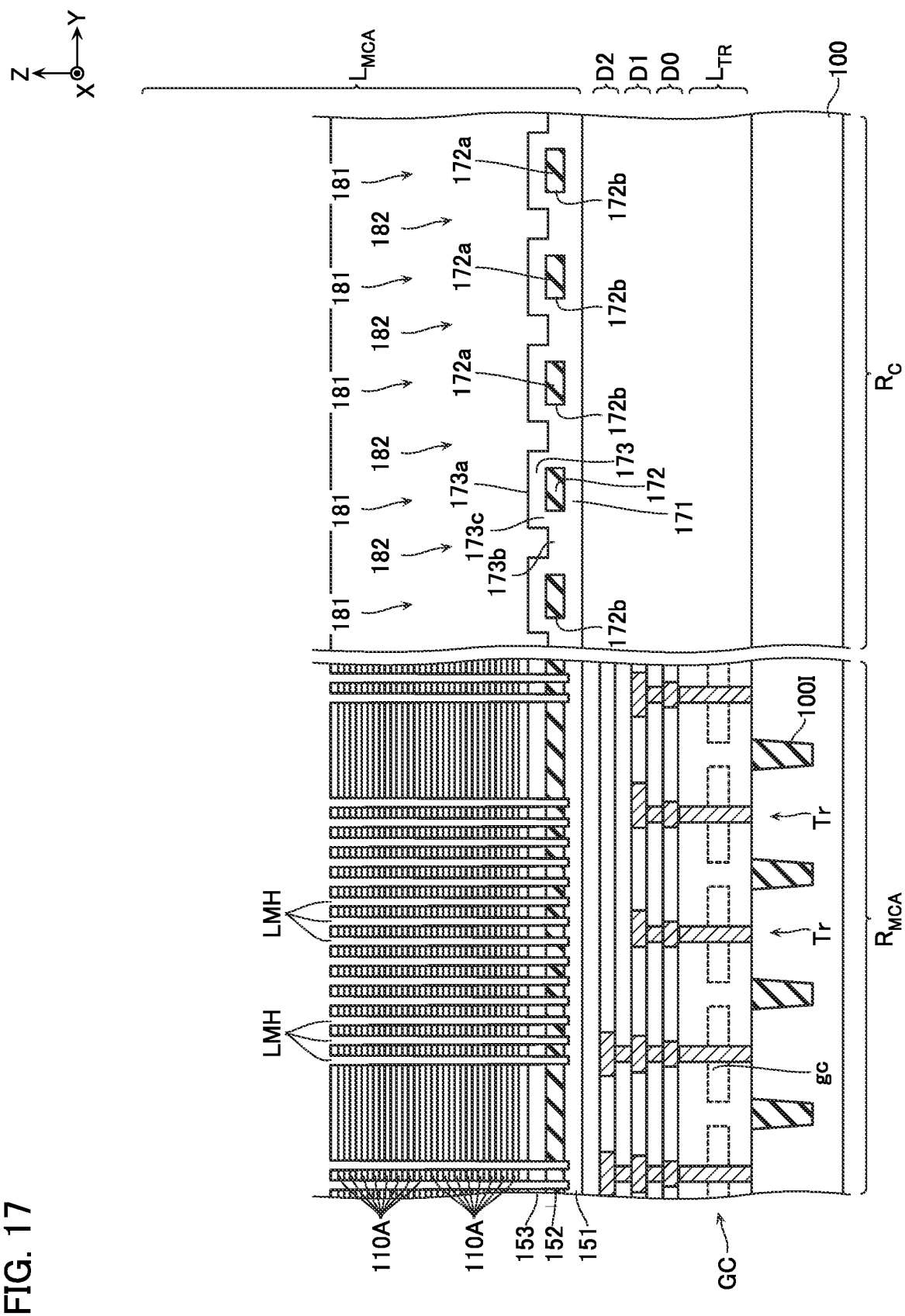
FIG. 17 is a schematic cross-sectional view for explaining same manufacturing method.

Next, as shown in FIG. 17, for example, a plurality of memory holes LMH are formed at positions corresponding to the semiconductor layers 120. The memory hole LMH is a through-hole that extends in the Z direction, penetrates the plurality of insulating layers 101 and plurality of sacrifice layers 110A, the semiconductor layer 153, and the insulating layer 152, and exposes an upper surface of the semiconductor layer 151. This step is performed by a method such as RIE, for example.

Figure 18:
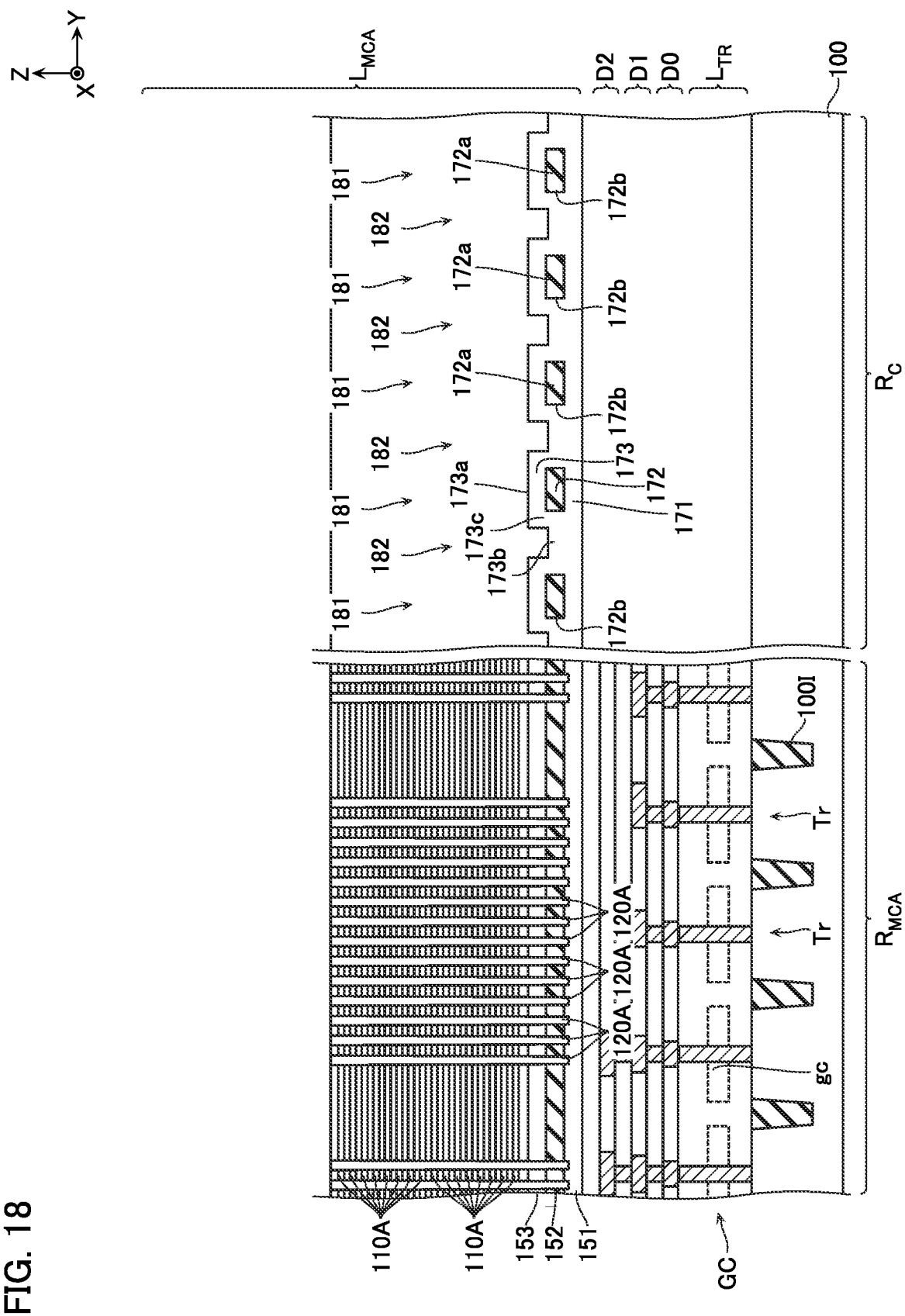
FIG. 18 is a schematic cross-sectional view for explaining same manufacturing method.

Next, as shown in FIG. 18, for example, an amorphous silicon film 120A is formed on an inner peripheral surface of the memory hole LMH. This step is performed by a method such as CVD, for example.

Figure 19:
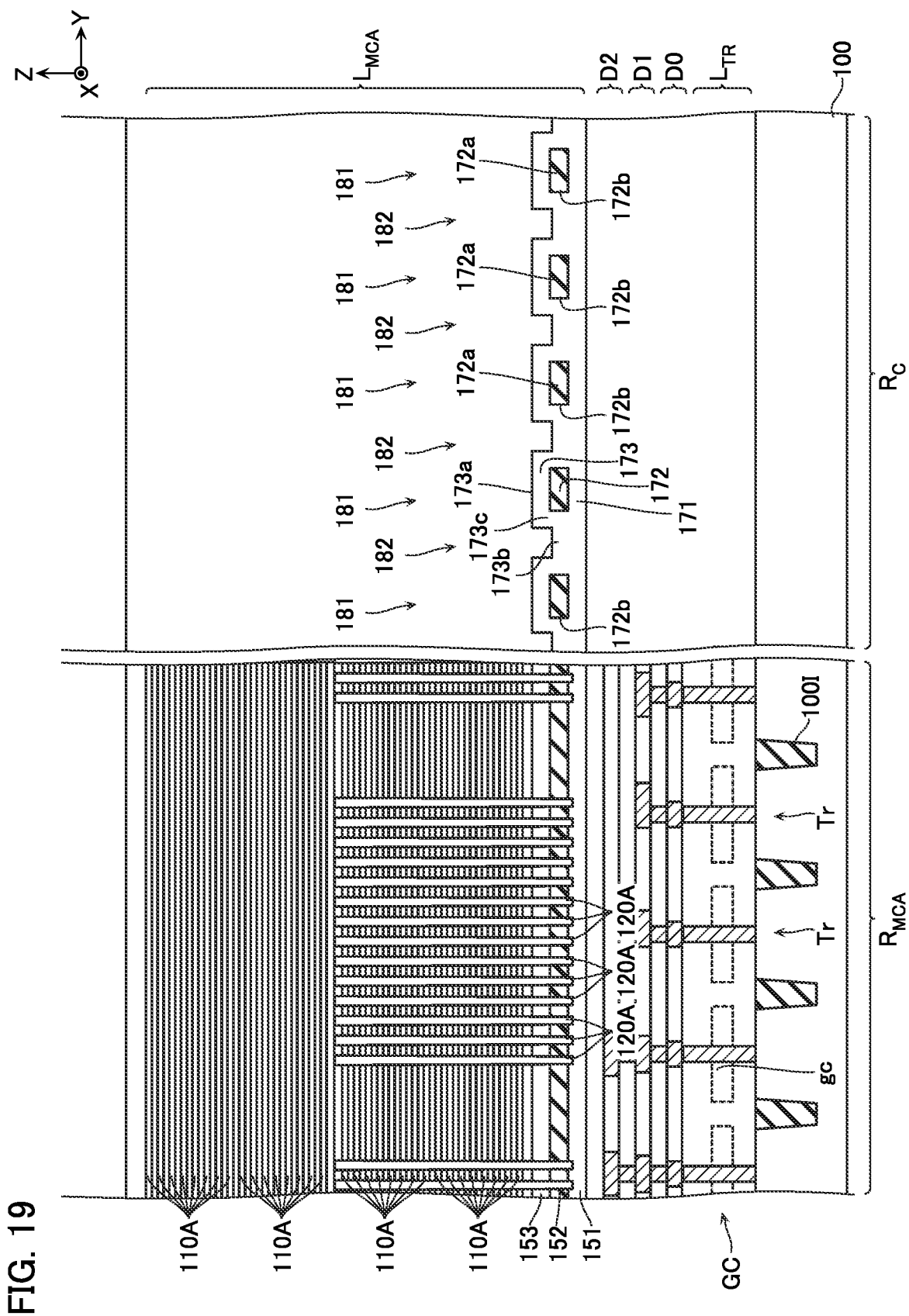
FIG. 19 is a schematic cross-sectional view for explaining same manufacturing method.

Next, as shown in FIG. 19, for example, a plurality of the insulating layers 101 and a plurality of the sacrifice layers 110A are formed alternately on an upper surface of the structure described with reference to FIG. 18. This step is performed by a method such as CVD, for example.

Figure 20:
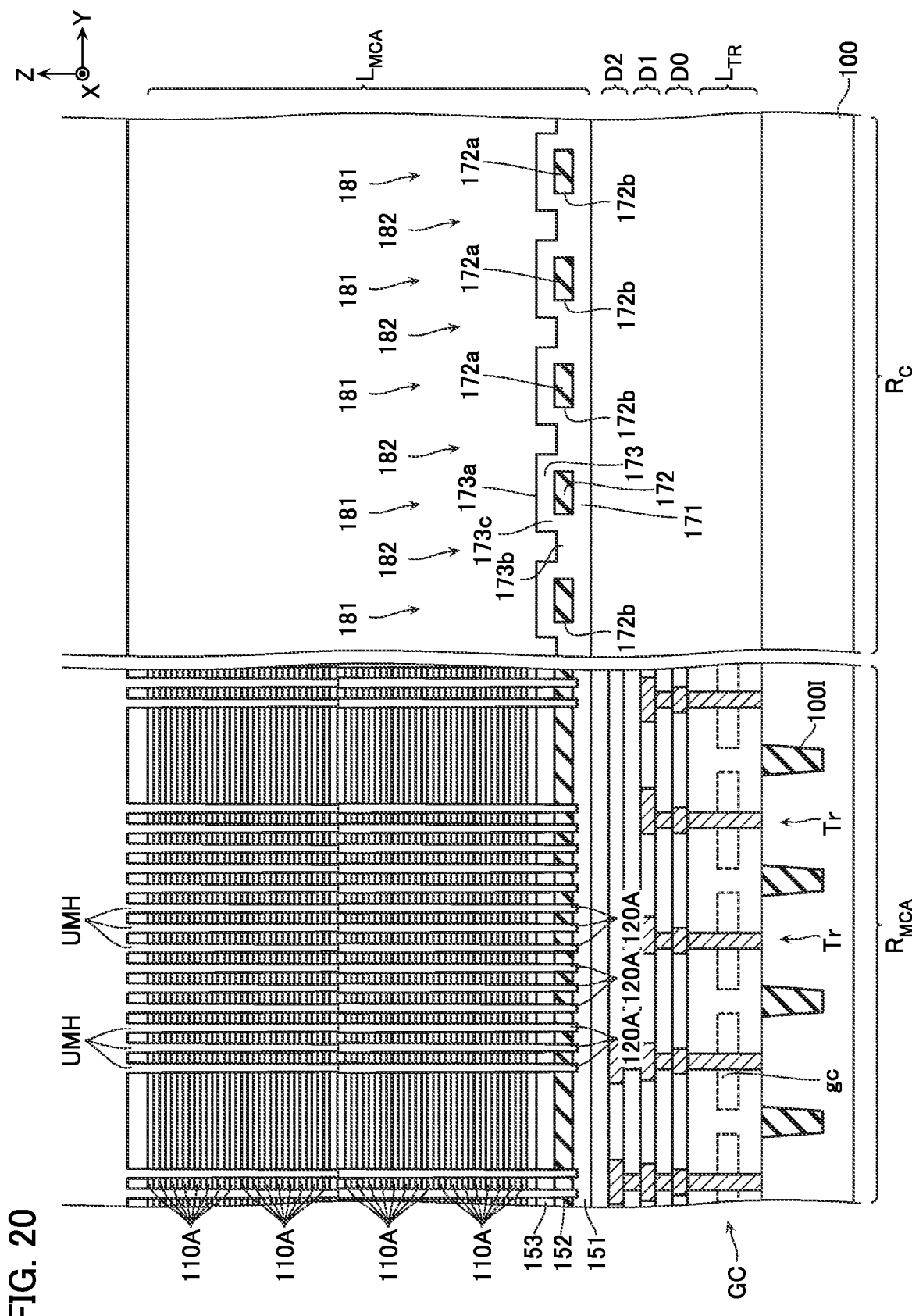
FIG. 20 is a schematic cross-sectional view for explaining same manufacturing method.

Next, as shown in FIG. 20, for example, a plurality of memory holes UMH are formed at positions corresponding to the semiconductor layers 120. This memory hole UMH is a through-hole that extends in the Z direction, penetrates the plurality of insulating layers 101 and plurality of sacrifice layers 110A, and exposes an upper surface of the amorphous silicon film 120A. This step is performed by a method such as RIE, for example.

Figure 21:
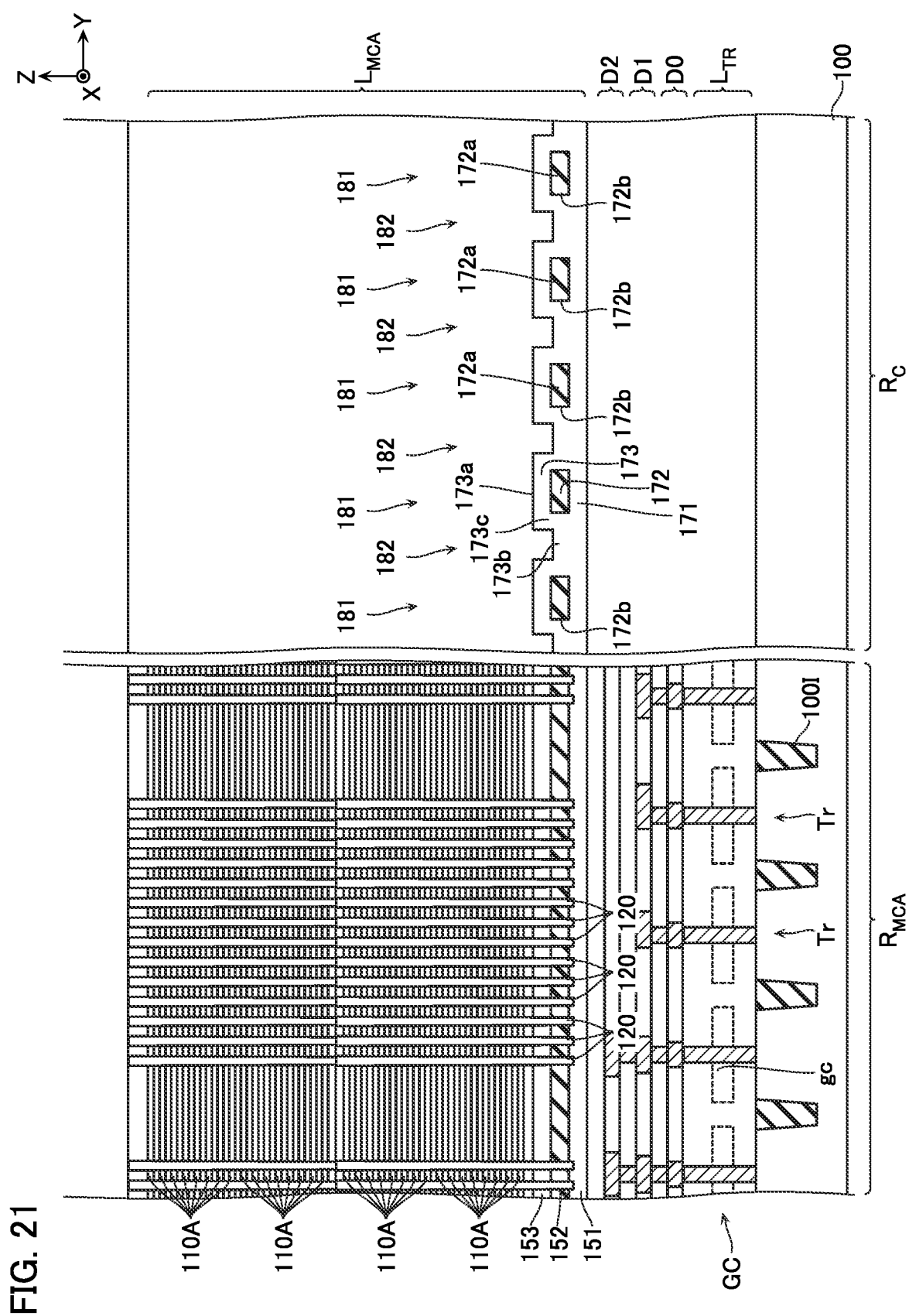
FIG. 21 is a schematic cross-sectional view for explaining same manufacturing method.

Next, as shown in FIG. 21, for example, the semiconductor layer 120 is formed. Moreover, in this step, the gate insulating film 130 is formed, although illustration of this is omitted. In this step, the amorphous silicon film 120A is removed by a method such as wet etching, for example. Moreover, the gate insulating film 130, the semiconductor layer 120, and the insulating layer 125 are formed on the inner peripheral surfaces of the memory holes LMH, UMH, by a method such as CVD, for example.

Figure 22:
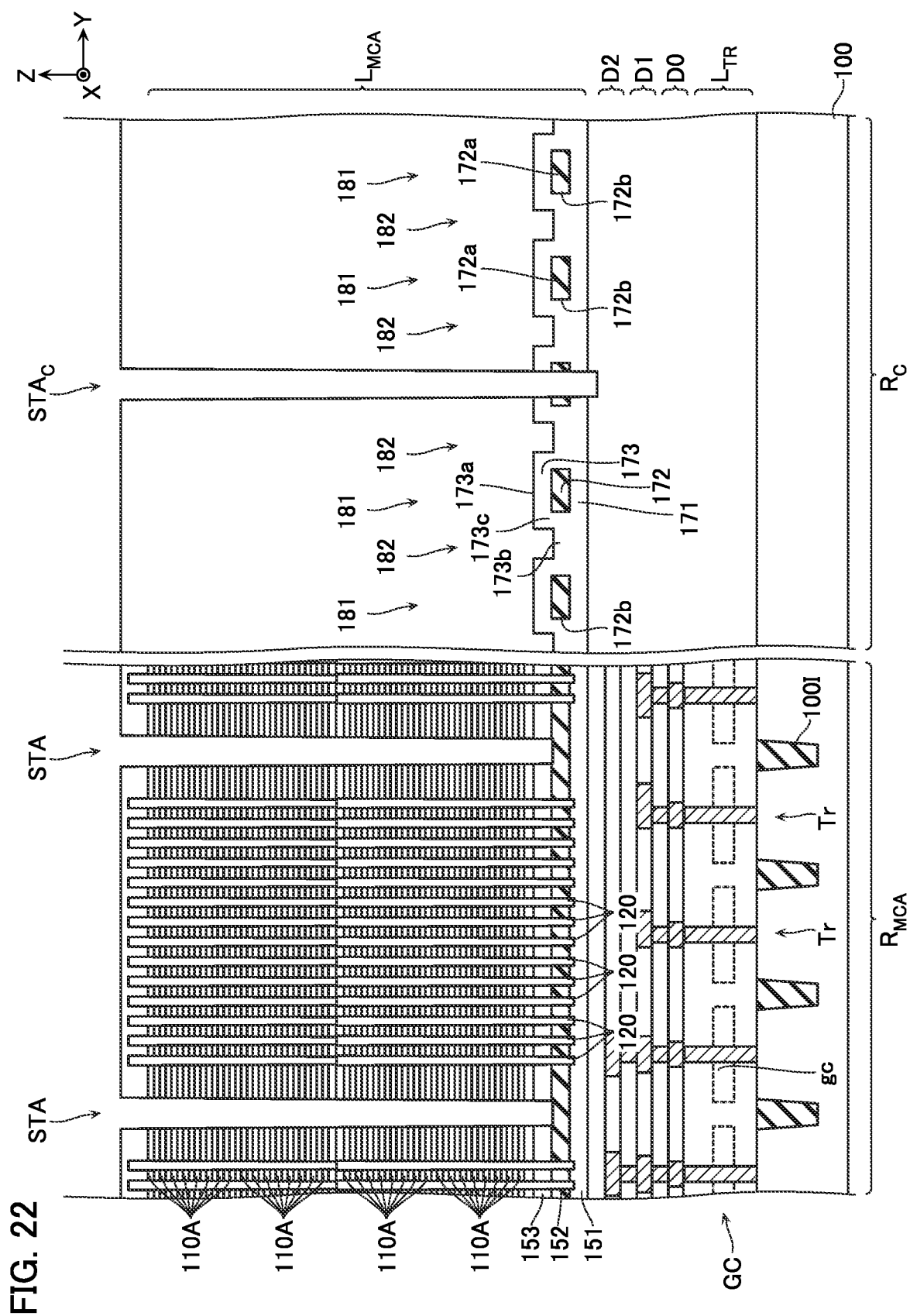
FIG. 22 is a schematic cross-sectional view for explaining same manufacturing method.
Figure 23:
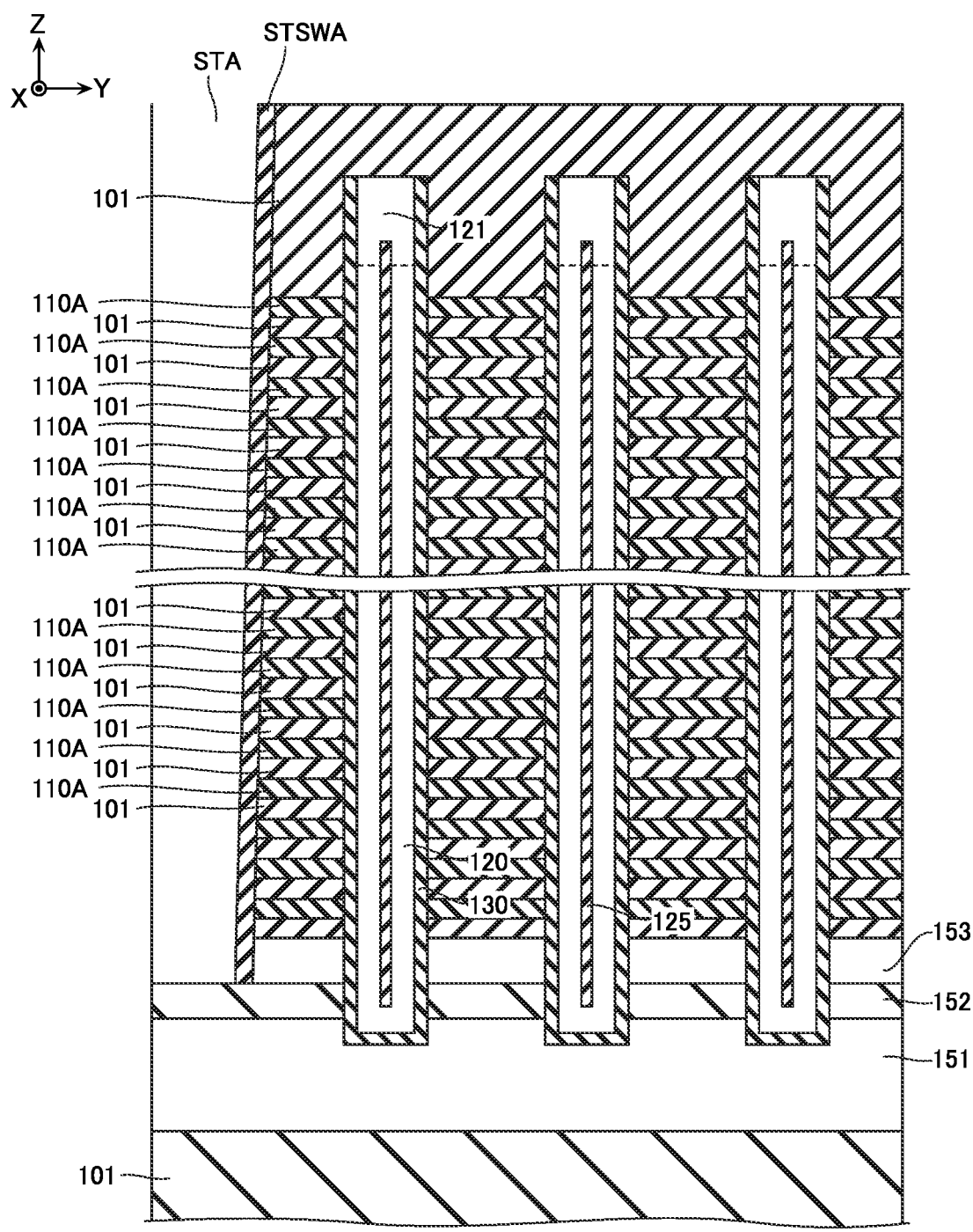
FIG. 23 is a schematic cross-sectional view for explaining same manufacturing method.

Next, as shown in FIG. 22, for example, trenches STA, $STA_C$ are formed. The trench STA is provided in the memory cell array region $R_{MCA}$. The trench STA is a trench that extends in the Z direction and the X direction, divides the plurality of insulating layers 101 and plurality of sacrifice layers 110A and the semiconductor layer 153 in the Y direction, and exposes the upper surface of the insulating layer 152. The trench $STA_C$ is provided in the connection region $R_C$. The trench $STA_C$ is a trench that extends in the Z direction and the X direction, and divides the semiconductor layer 173, the insulating layer 172, and the semiconductor layer 171 in the Y direction. This step is performed by a method such as RIE, for example.

Next, as shown in FIG. 23, for example, a protective film STSWA of the likes of silicon oxide ($SiO_2$) is formed on a side surface in the Y direction of the trench STA. In this step, an insulating film of the likes of silicon oxide is formed on the side surface in the Y direction and a bottom surface of the trench STA by a method such as CVD, for example. Moreover, a portion covering the bottom surface of the trench STA, of this insulating film is removed by a method such as RIE, for example. Note that in this step, the protective film STSWA is formed also on a side surface in the Y direction of the trench $STA_C$, although illustration of this is omitted.

Figure 24:
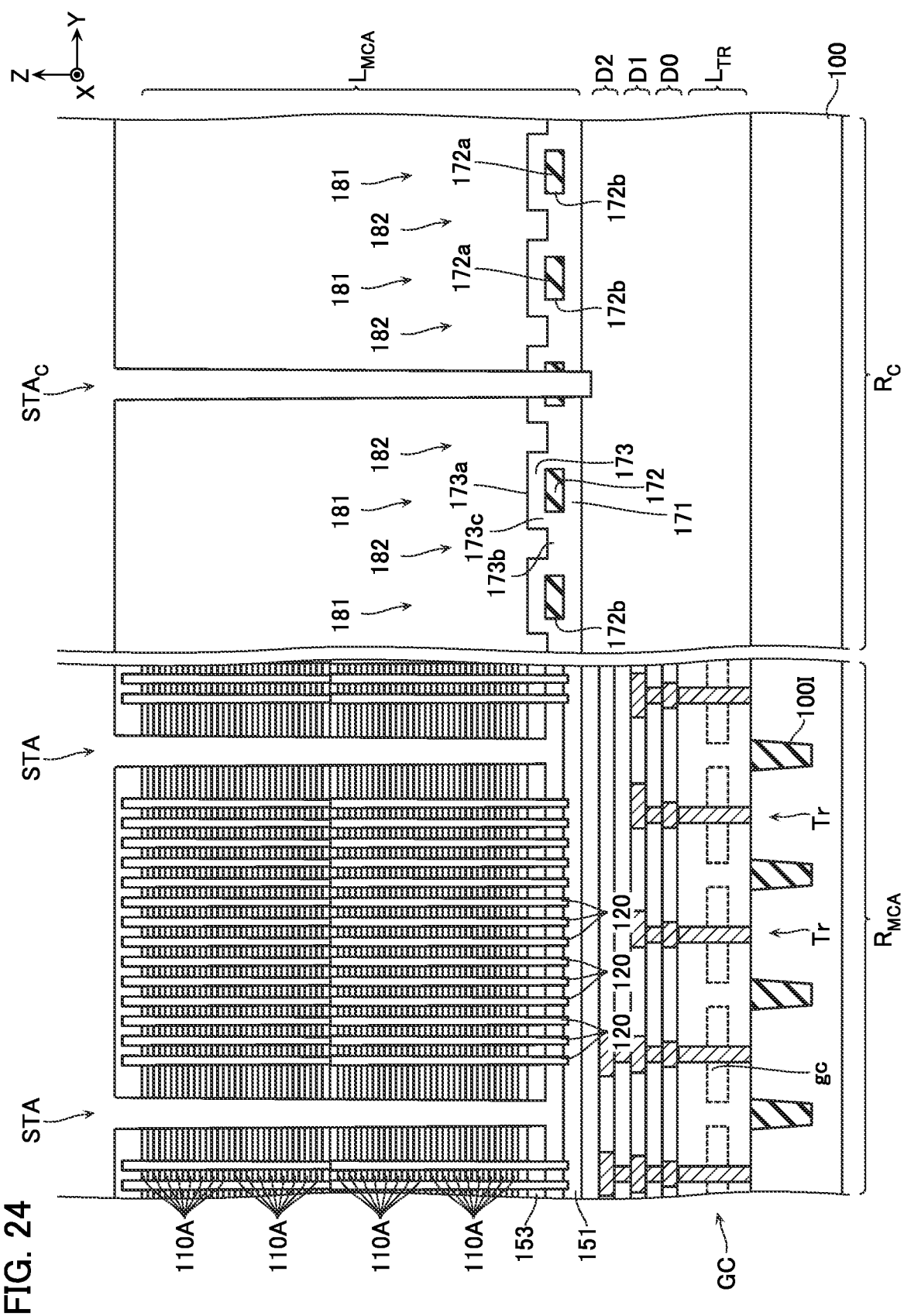
FIG. 24 is a schematic cross-sectional view for explaining same manufacturing method.
Figure 25:
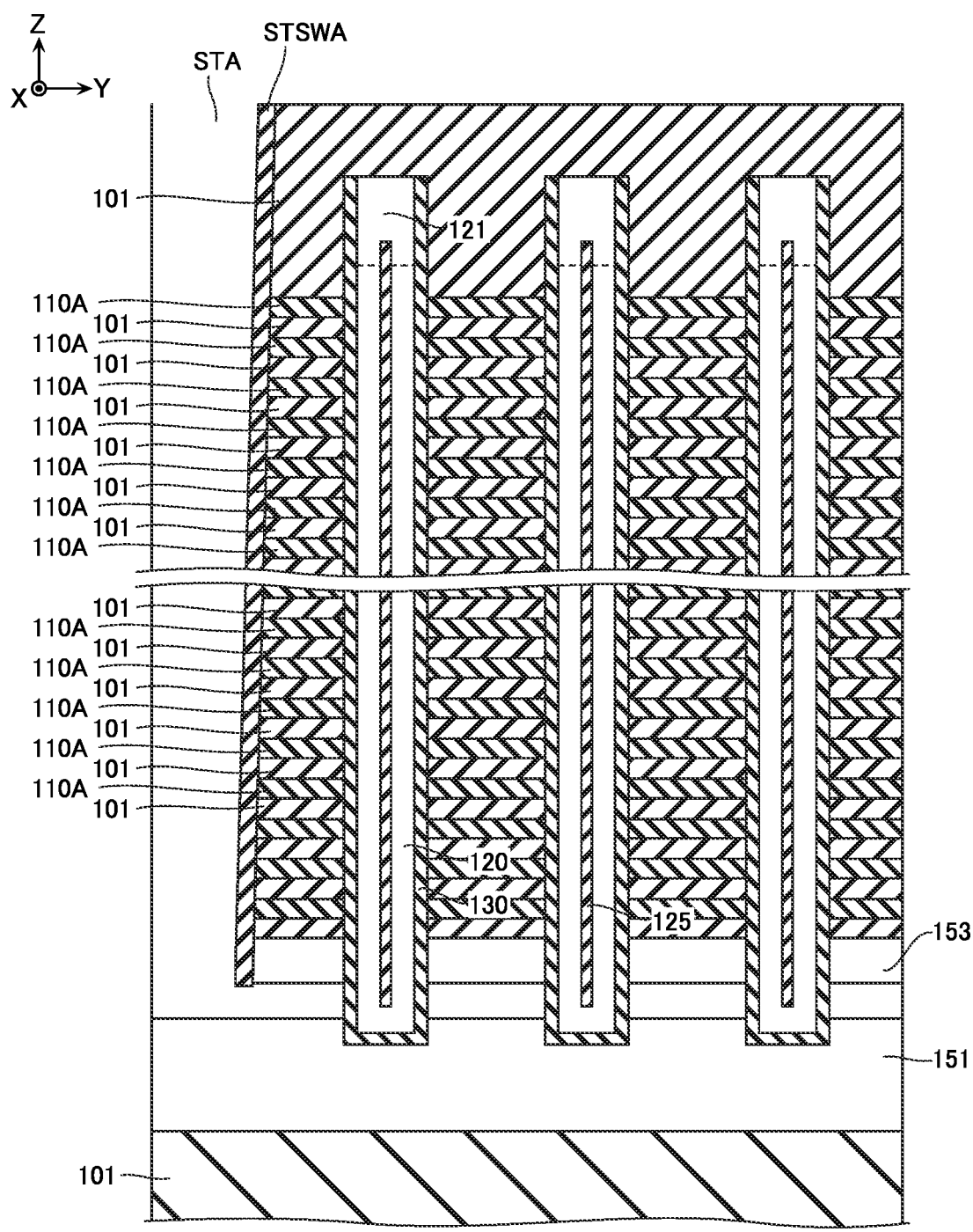
FIG. 25 is a schematic cross-sectional view for explaining same manufacturing method.
Figure 26:
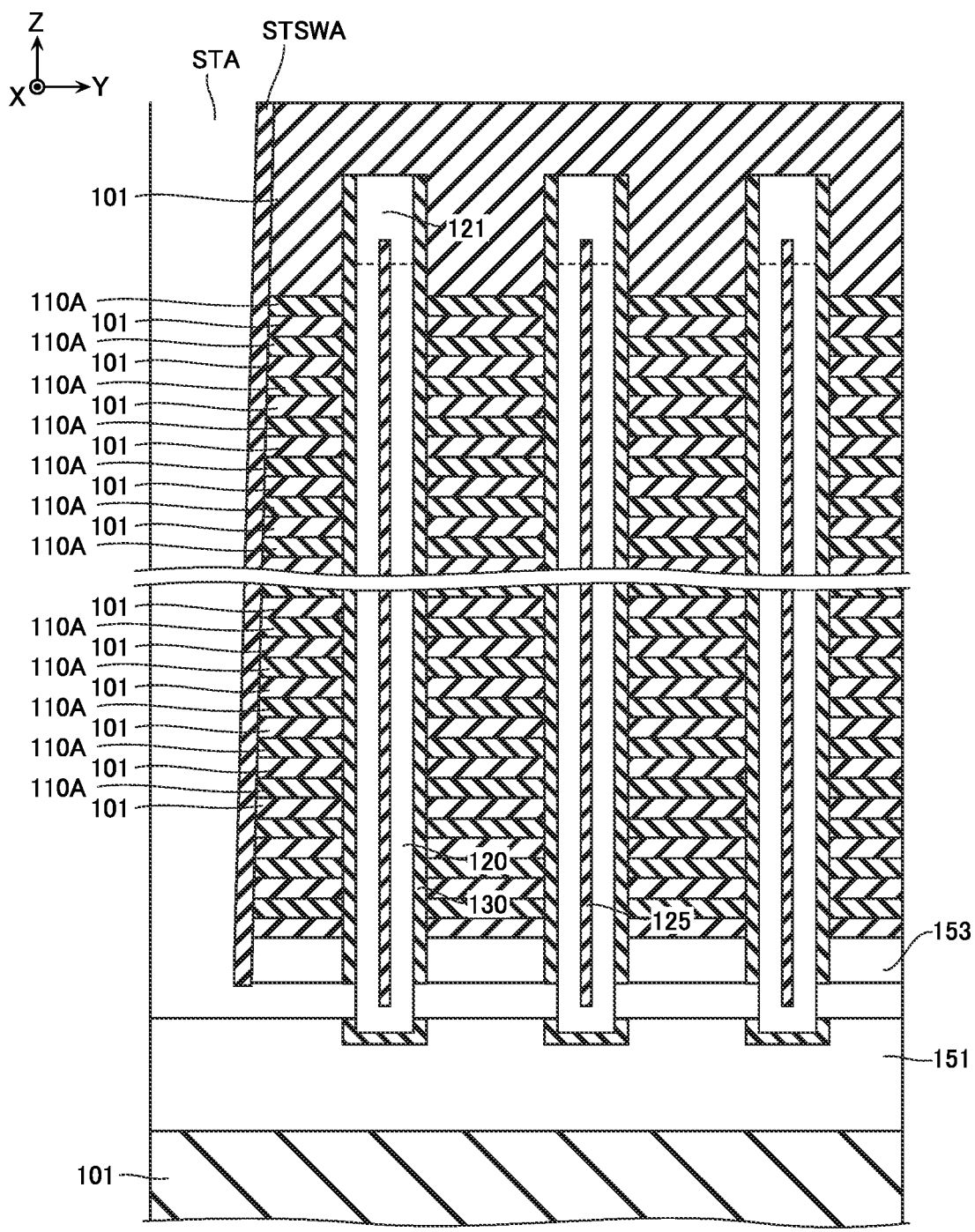
FIG. 26 is a schematic cross-sectional view for explaining same manufacturing method.

Next, as shown in FIGS. 24 to 26, for example, the insulating layer 152 and part of the gate insulating film 130 are removed, and part of the semiconductor layer 120 is exposed. This step is performed by a method such as wet etching, for example.

Figure 27:
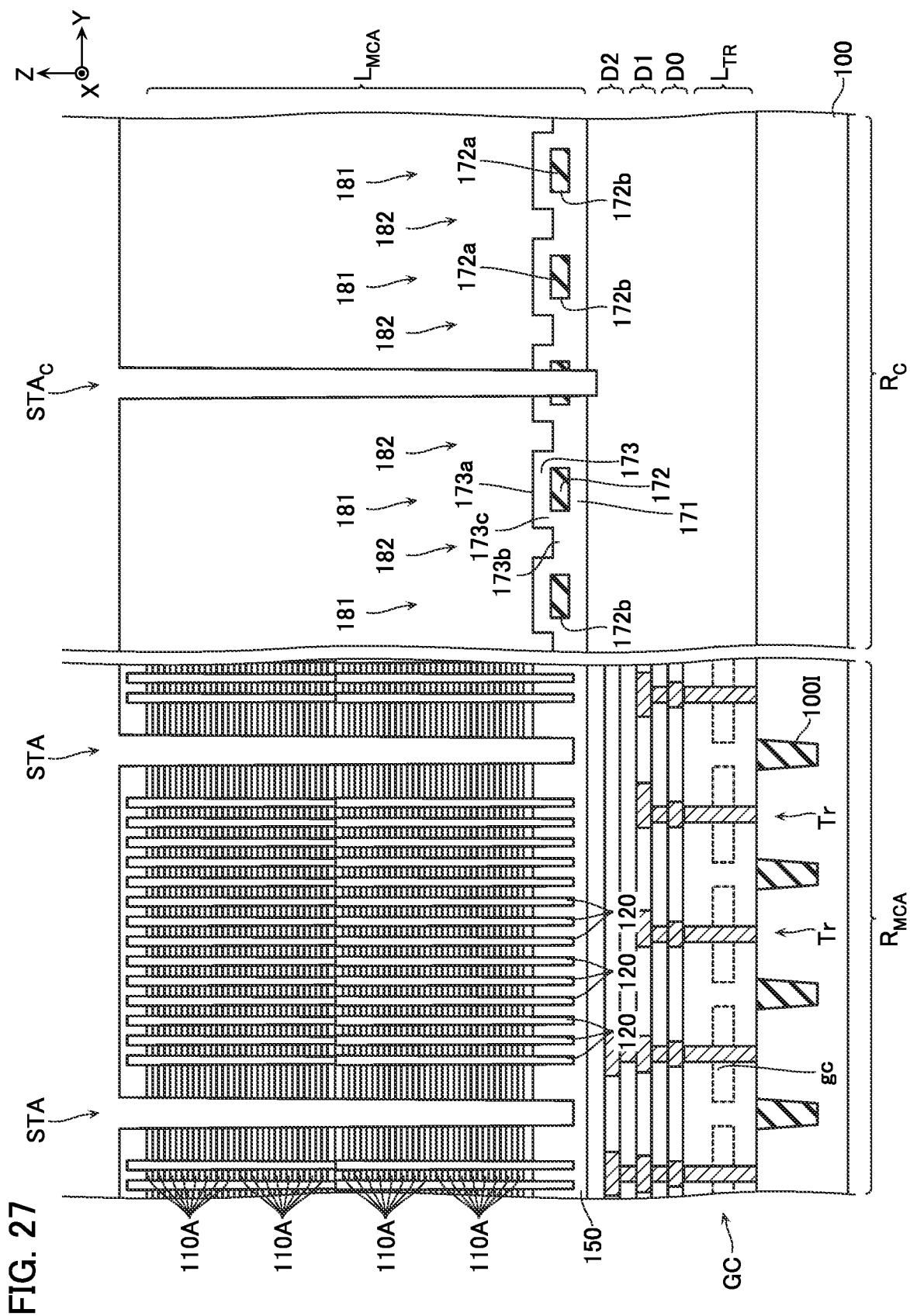
FIG. 27 is a schematic cross-sectional view for explaining same manufacturing method.

Next, as shown in FIG. 27, for example, the semiconductor layer 150 is formed. This step is performed by a method such as epitaxial growth, for example.

Figure 28:
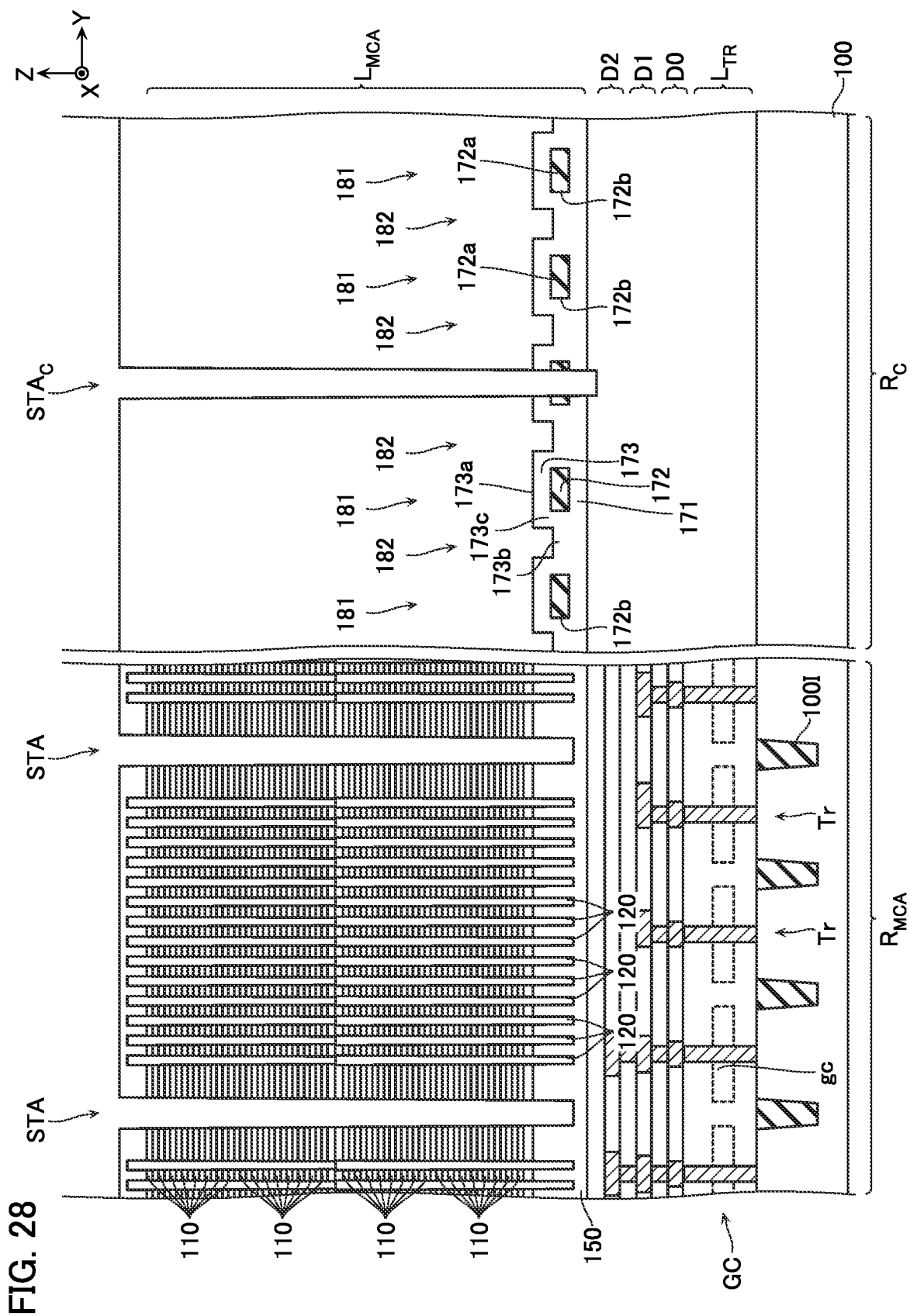
FIG. 28 is a schematic cross-sectional view for explaining same manufacturing method.

Next, as shown in FIG. 28, for example, the conductive layer 110 is formed. In this step, the protective film STSWA (FIG. 26) is removed by a method such as wet etching, for example. Moreover, the sacrifice layer 110A is removed by a method such as wet etching, for example. Moreover, the conductive layer 110 is formed by a method such as CVD, for example.

Figure 29:
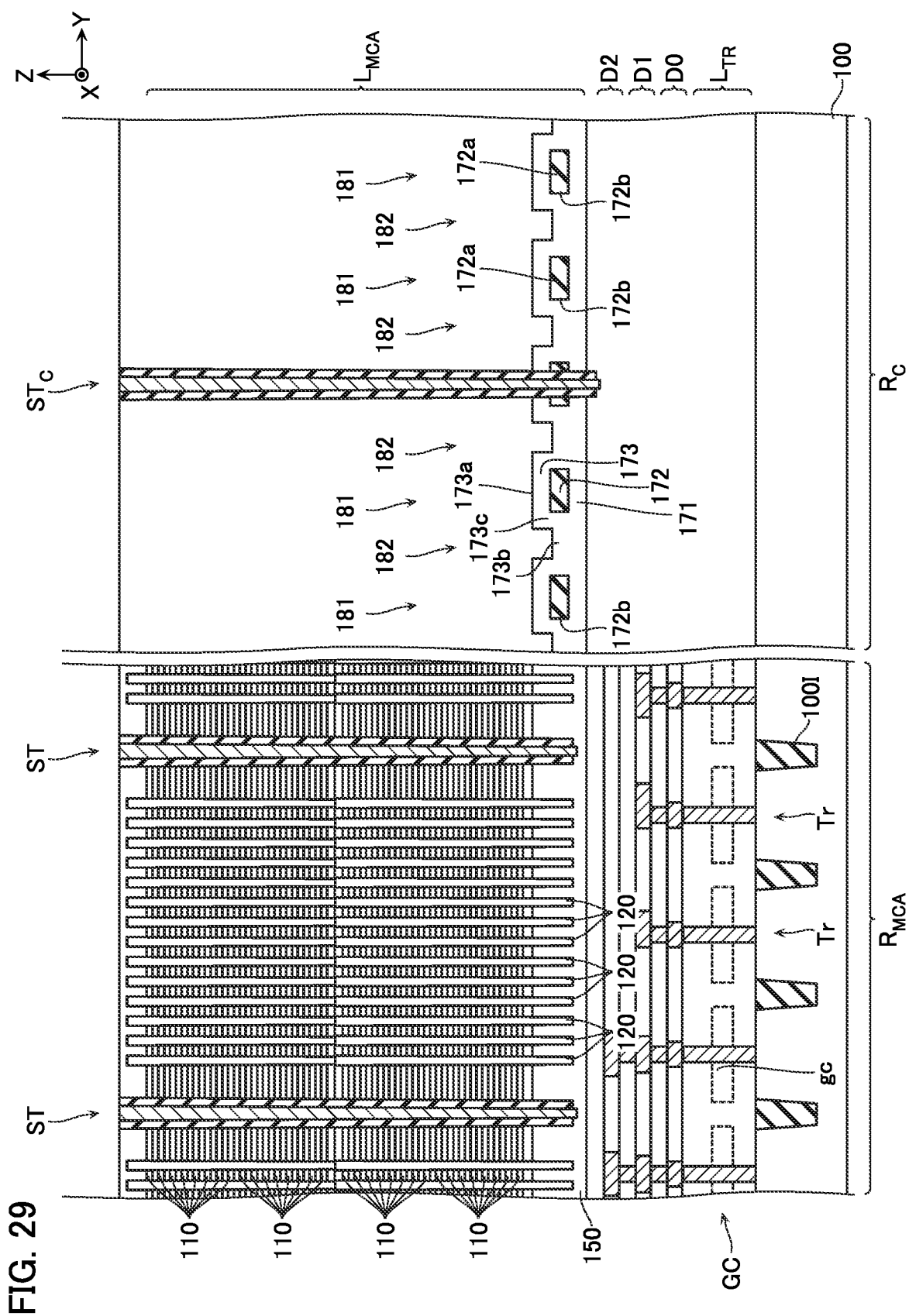
FIG. 29 is a schematic cross-sectional view for explaining same manufacturing method.

Next, as shown in FIG. 29, for example, the inter-block structure ST is formed in the trench STA, and the structure $ST_C$ is formed in the trench $STA_C$. This step is performed by methods such as CVD and RIE, for example.

Subsequently, the crack stopper 180 (FIG. 6), the wirings, and so on, are formed and a wafer is divided by dicing, whereby the memory die MD is formed.

[First Comparative Example]

Figure 30:
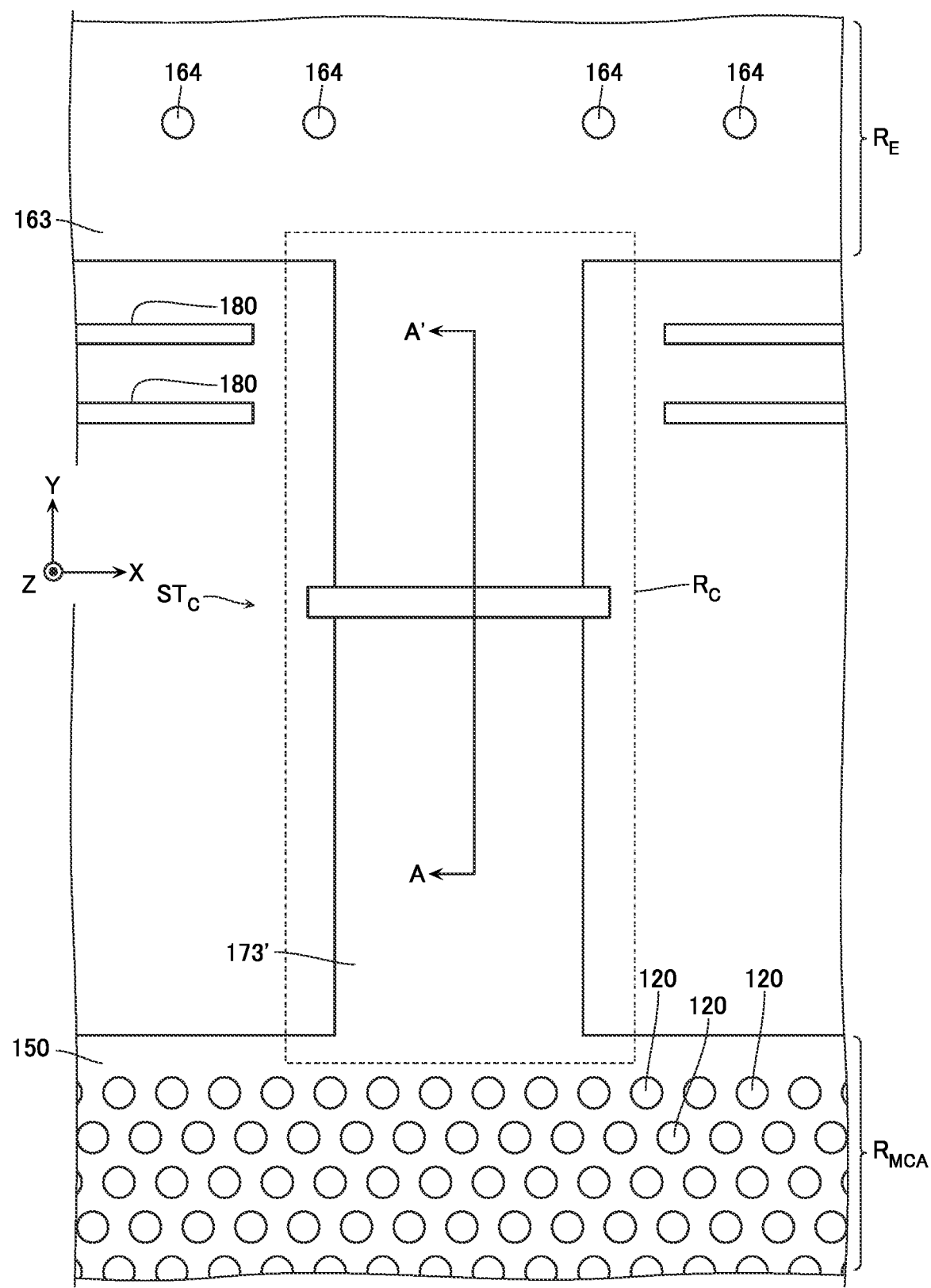
FIG. 30 is a schematic plan view showing a configuration of a semiconductor memory device according to a first comparative example.
Figure 31:
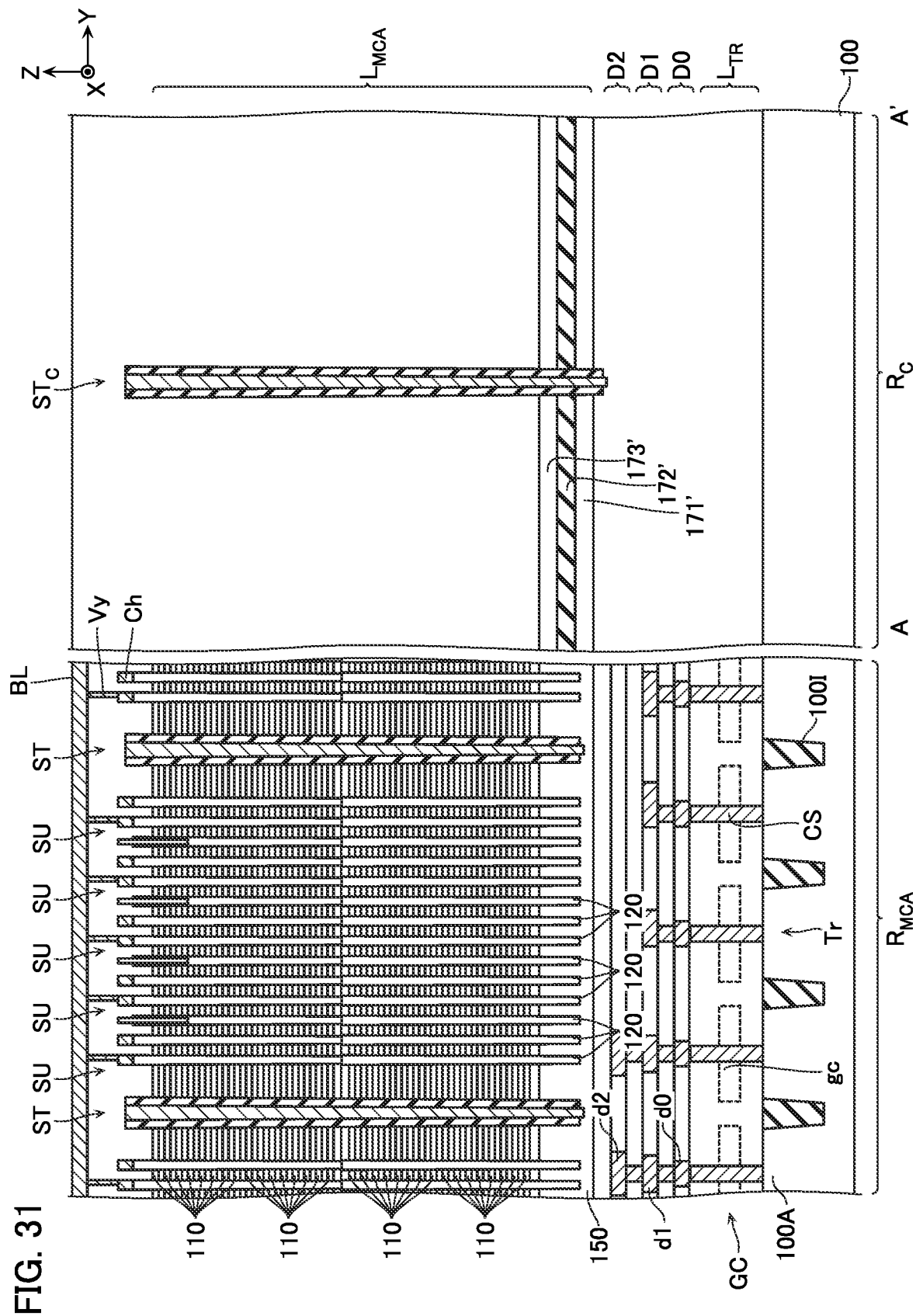
FIG. 31 is a schematic cross-sectional view showing a configuration of same semiconductor memory device.

FIG. 30 is a schematic plan view showing a configuration of a semiconductor memory device according to a first comparative example. FIG. 31 is a schematic cross-sectional view showing a configuration of same semiconductor memory device. Note that FIG. 31 includes a schematic cross-sectional view in which the structure shown in FIG. 30 has been cut along the line A-A' and viewed along a direction of the arrows.

In the semiconductor memory device according to the first comparative example, the connection region $R_C$ is provided with a semiconductor layer 171', an insulating layer 172', and a semiconductor layer 173'. The semiconductor layer 171', the insulating layer 172', and the semiconductor layer 173' are divided into two portions aligned in the Y direction, by the structure $ST_C$. Ones of these two portions are respectively formed continuously with the semiconductor layer 161, the insulating layer 162, and the semiconductor layer 163. The others of these two portions are each formed continuously with the semiconductor layer 150.

In a manufacturing method of the semiconductor memory device according to the first comparative example, the step described with reference to FIG. 10 is not executed.

Now, in the manufacturing method according to the first comparative example, the memory holes LMH, UMH are formed in the steps described with reference to FIGS. 17 and 20. Now, in order to achieve a high level of integration in the semiconductor memory device, it is desirable that memory holes LMH, UMH of high aspect ratio are formed. Now, when memory holes LMH, UMH of high aspect ratio are formed by a method such as RIE, sometimes, a large amount of charge is accumulated in the semiconductor layers 151, 153 exposed in the memory hole LMH, due to effects of ions for processing. Sometimes, when the amount of such charge exceeds a certain amount, arcing occurs, whereby the wafer is destroyed.

Accordingly, in the manufacturing method according to the first comparative example, the conductive layer 164 by which the semiconductor layers 151, 153 exposed on the inner peripheral surface of the memory hole LMH and the semiconductor substrate 100 are electrically connected, is formed in the steps described with reference to FIGS. 12 to 15, before the memory holes LMH, UMH are formed. Such a configuration makes it possible for the charge of the semiconductor layers 151, 153 to be released to the semiconductor substrate 100. As a result, occurrence of the above-mentioned kind of arcing can be suppressed.

However, as shown in FIGS. 30 and 31, for example, in the first comparative example, the semiconductor layer 150 and the semiconductor layers 161, 163 are formed continuously except for portions thereof divided by the structure $ST_C$. Moreover, the crack stopper 180 is disposed avoiding the connection region $R_C$. In such a configuration, there is a risk that if, for example, a crack occurs in the semiconductor layers 161, 163 in the dicing step of the memory die MD, this crack spreads to the semiconductor layer 150 via the semiconductor layers 171', 173'.

Moreover, in the step described with reference to FIG. 15, the semiconductor layer 163 sometimes is partially removed. Sometimes, in such a case, the semiconductor layer 153 is electrically cut off from the conductive layer 164, and arcing occurs due to the charge in the semiconductor layer 153.

[Second Comparative Example]

Figure 32:
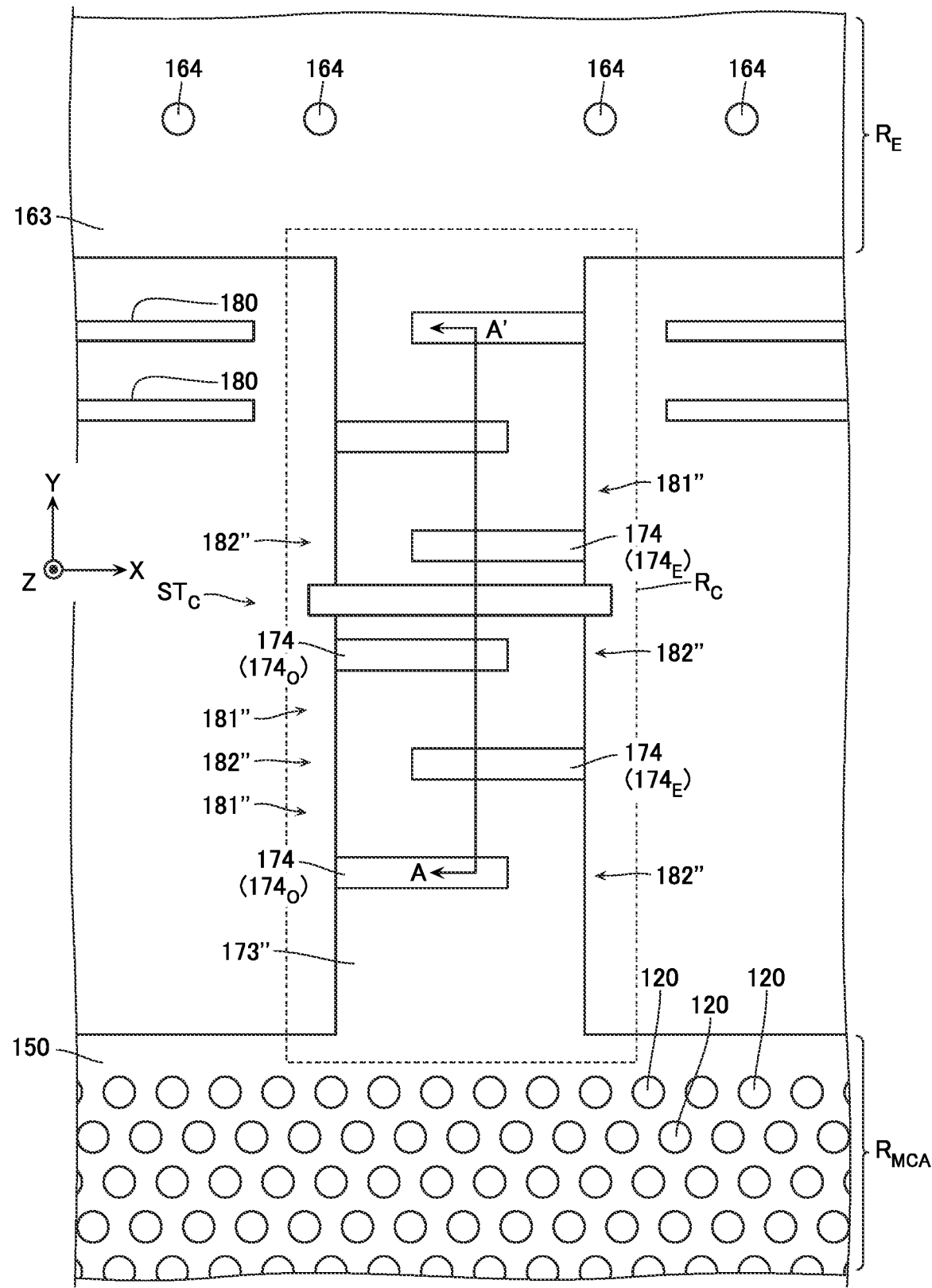
FIG. 32 is a schematic plan view showing a configuration of a semiconductor memory device according to a second comparative example.
Figure 33:
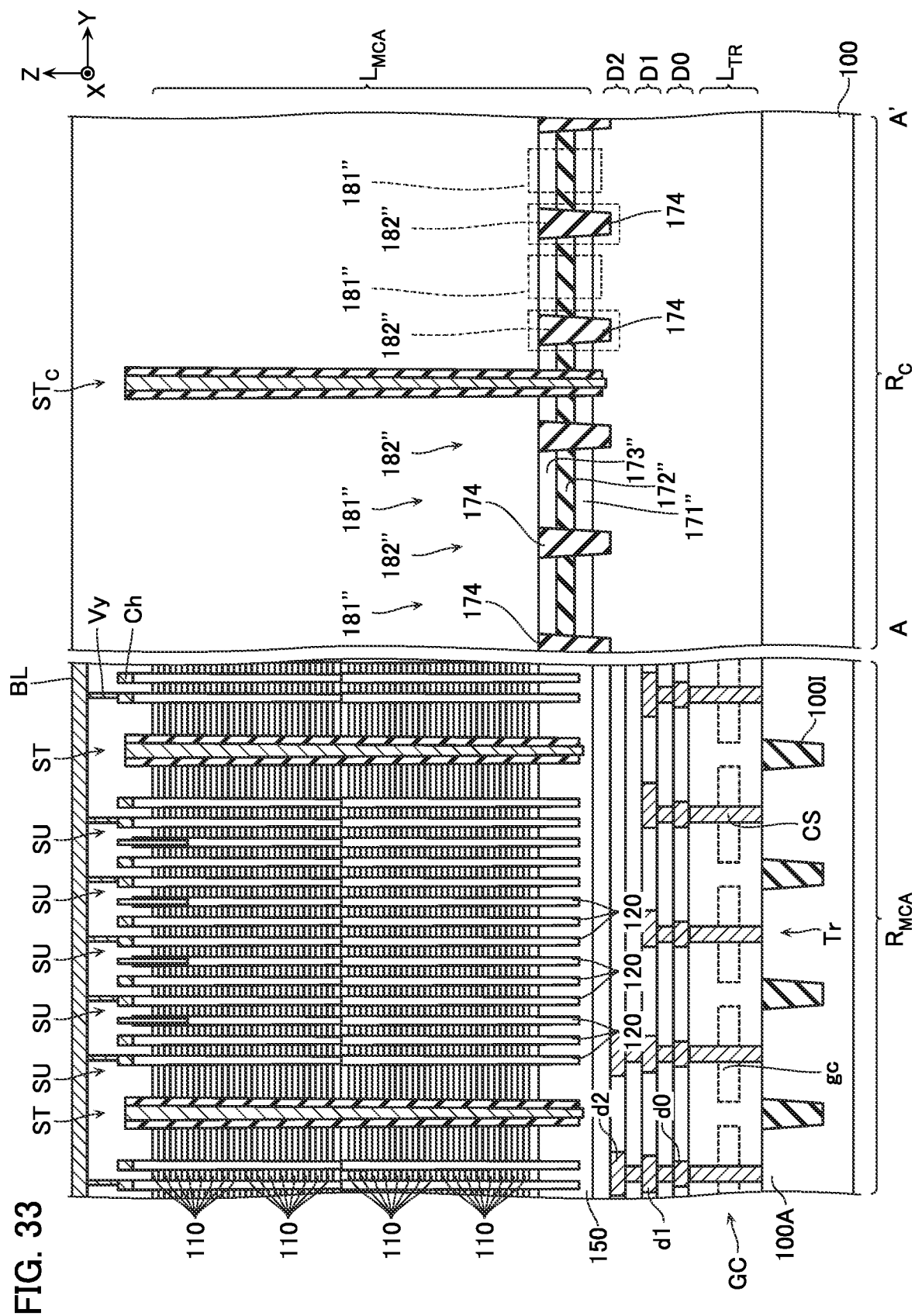
FIG. 33 is a schematic cross-sectional view showing a configuration of same semiconductor memory device.

FIG. 32 is a schematic plan view showing a configuration of a semiconductor memory device according to a second comparative example. FIG. 33 is a schematic cross-sectional view showing a configuration of same semiconductor memory device. Note that FIG. 33 includes a schematic cross-sectional view in which the structure shown in FIG. 32 has been cut along the line A-A' and viewed along a direction of the arrows.

In the semiconductor memory device according to the second comparative example, the connection region $R_C$ is provided with a semiconductor layer 171", an insulating layer 172", and a semiconductor layer 173".

Moreover, in the semiconductor memory device according to the second comparative example, the connection region $R_C$ is provided with a plurality of first regions 181" and second regions 182" aligned alternately in the Y direction.

The first regions 181" each comprise parts of the semiconductor layer 171", the insulating layer 172", and the semiconductor layer 173".

The second regions 182" each comprise an insulating layer 174. Side surfaces in the Y direction of the insulating layer 174 are connected to side surfaces in the Y direction of the semiconductor layer 171", the insulating layer 172", and the semiconductor layer 173" included in the two first regions 181" adjacent in the Y direction to the insulating layer 174.

As shown in FIG. 32, the insulating layers 174 are aligned in the Y direction. In FIG. 32, an odd-numbered insulating layer 174 counting from one side in the Y direction (for example, a negative side in the Y direction in FIG. 32) is indicated as an insulating layer $174_O$, and an even-numbered insulating layer 174 counting from the one side in the Y direction is indicated as an insulating layer $174_E$.

An end portion on one side in the X direction (for example, a negative side in the X direction in FIG. 32) of the insulating layer $174_O$ reaches an end portion position on the one side in the X direction of the semiconductor layer 171", the insulating layer 172", and the semiconductor layer 173". On the other hand, an end portion on the other side in the X direction (for example, a positive side in the X direction in FIG. 32) of the insulating layer $174_O$ does not reach an end portion position on the other side in the X direction of the semiconductor layer 171", the insulating layer 172", and the semiconductor layer 173".

An end portion on the one side in the X direction of the insulating layer $174_E$ does not reach the end portion position on the one side in the X direction of the semiconductor layer 171", the insulating layer 172", and the semiconductor layer 173" provided in the connection region $R_C$. On the other hand, an end portion on the other side in the X direction of the insulating layer $174_E$ reaches the end portion position on the other side in the X direction of the semiconductor layer 171", the insulating layer 172", and the semiconductor layer 173" provided in the connection region $R_C$.

In a manufacturing method of the semiconductor memory device according to the second comparative example, the step described with reference to FIG. 10 is not executed.

Moreover, in the manufacturing method of the semiconductor memory device according to the second comparative example, the insulating layer 174 is formed after the step described with reference to FIG. 12 has been executed, but before the step described with reference to FIG. 16 is executed.

Such a configuration makes it possible that, even if, for example, a crack has occurred in the semiconductor layers 161, 163 in the dicing step of the memory die MD, it is suppressed by the plurality of insulating layers 174 that this crack spreads to the semiconductor layer 150.

However, in a configuration like that of the second comparative example, wiring lengths between the semiconductor layers 151, 153 and semiconductor layers 161, 163 are relatively long, and electrical resistances between them are relatively large. Hence, there is a risk that in the steps described with reference to FIGS. 17 and 20, the charge of the semiconductor layers 151, 153 cannot be suitably released to the semiconductor substrate 100, and arcing occurs.

[Advantages]

In the first embodiment, as shown in FIG. 5, for example, the insulating layer 172 is provided with the plurality of openings 172b aligned in the Y direction. Such a configuration makes it possible that, even if, for example, a crack has ended up occurring in the semiconductor layers 161, 163 in the dicing step of the memory die MD, it is suppressed that this crack spreads to the semiconductor layer 150.

Moreover, in the first embodiment, as shown in FIG. 5, for example, the connection region $R_C$ is provided with the second region 182 that electrically connects the semiconductor layer 171 and the semiconductor layer 173. Such a configuration makes it possible that, even if, for example, the semiconductor layer 163 has been partially removed in the step described with reference to FIG. 15, the charge of the semiconductor layer 153 is released to the semiconductor substrate 100 via the semiconductor layer 171. As a result, occurrence of the above-mentioned kind of arcing can be suppressed.

Moreover, in the first embodiment, the wiring lengths between the semiconductor layers 151, 153 and semiconductor layers 171, 173 can be shortened more compared to by a structure like that of the second comparative example. Hence, occurrence of arcing can be more suitably suppressed compared to in the second comparative example.

Second Embodiment

Figure 34:
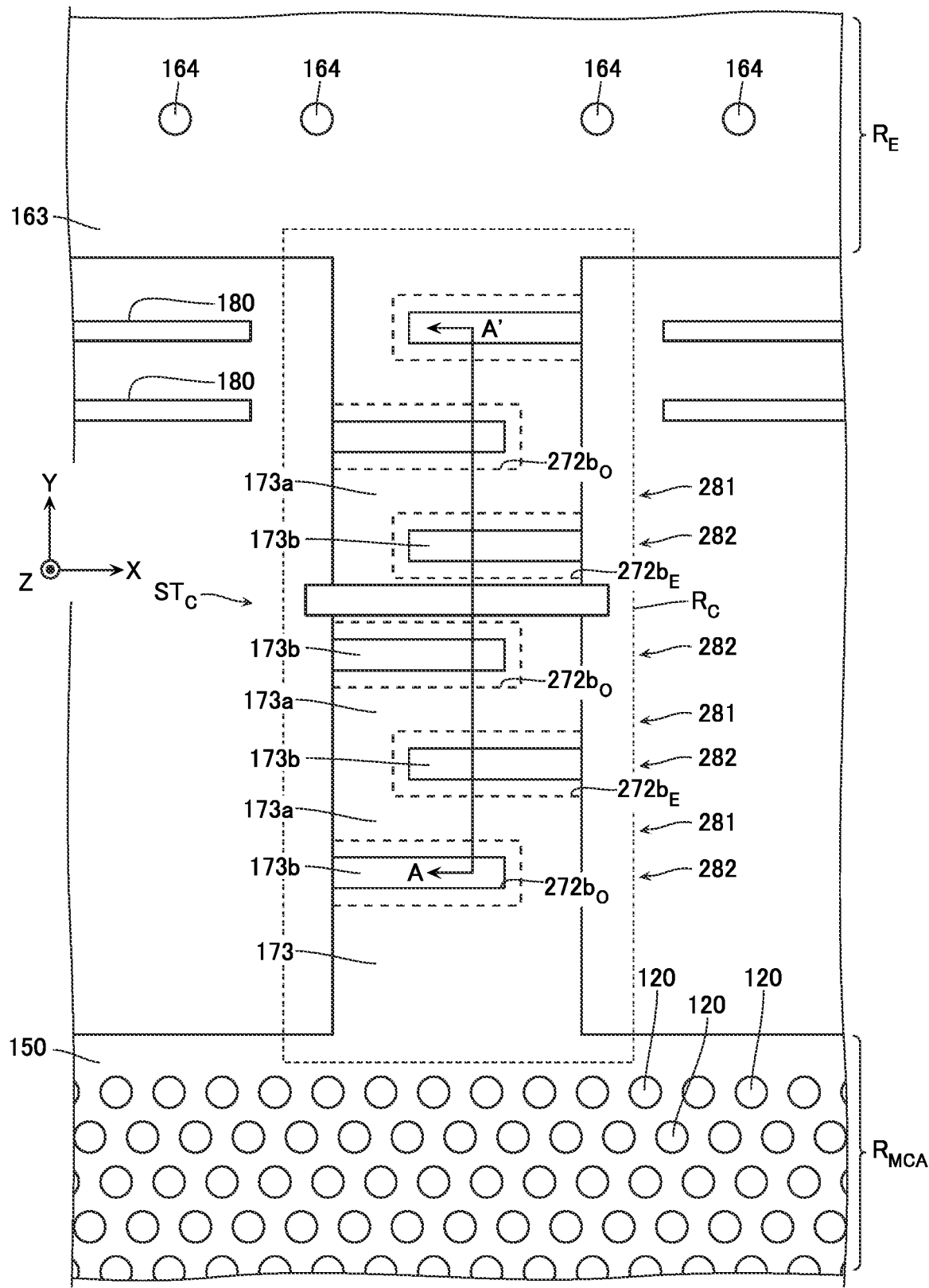
FIG. 34 is a schematic plan view showing a configuration of a semiconductor memory device according to a second embodiment.
Figure 35:
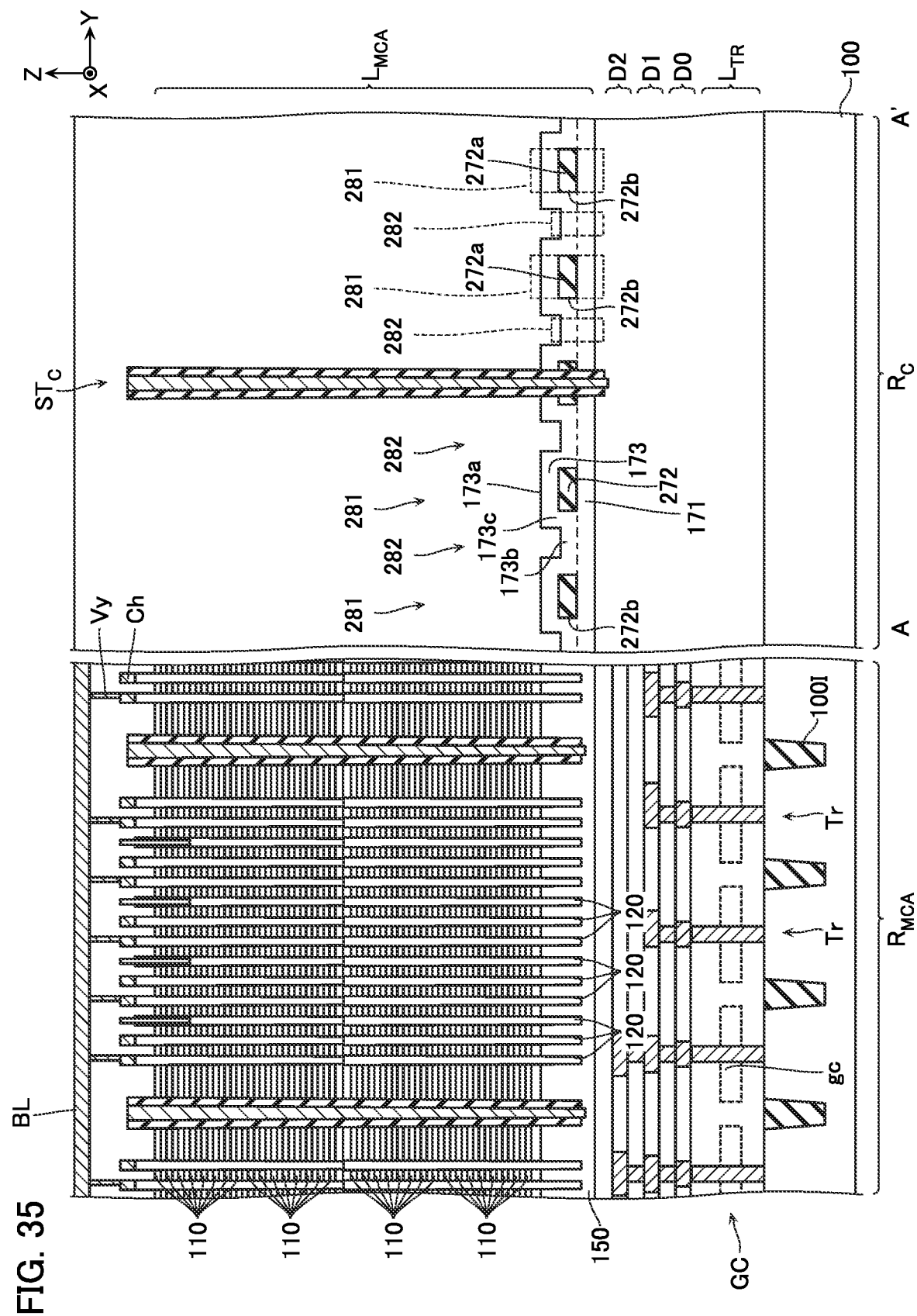
FIG. 35 is a schematic cross-sectional view showing a configuration of same semiconductor memory device.

Next, a semiconductor memory device according to a second embodiment will be described with reference to FIGS. 34 and 35. FIG. 34 is a schematic plan view showing a configuration of the semiconductor memory device according to the second embodiment. FIG. 35 is a schematic cross-sectional view showing a configuration of same semiconductor memory device. Note that FIG. 35 includes a schematic cross-sectional view in which the structure shown in FIG. 34 has been cut along the line A-A' and viewed along a direction of the arrows.

The semiconductor memory device according to the second embodiment is basically configured similarly to the semiconductor memory device according to the first embodiment. However, the connection region $R_C$ in the semiconductor memory device according to the second embodiment is provided with an insulating layer 272, instead of the insulating layer 172. Moreover, the connection region $R_C$ in the semiconductor memory device according to the second embodiment is provided with a plurality of first regions 281 and plurality of second regions 282 aligned alternately in the Y direction.

The insulating layer 272 is basically configured similarly to the insulating layer 172. However, as shown in FIG. 35, the insulating layer 272 comprises: a plurality of portions 272a provided correspondingly to the plurality of first regions 281; and a plurality of openings 272b provided correspondingly to the plurality of second regions 282.

As shown in FIG. 34, the openings 272b are aligned in the Y direction. In FIG. 34, an odd-numbered opening 272b counting from one side in the Y direction (for example, a negative side in the Y direction in FIG. 34) is indicated as an opening $272b_O$, and an even-numbered opening 272b counting from the one side in the Y direction is indicated as an opening $272b_E$.

An end portion on one side in the X direction (for example, a negative side in the X direction in FIG. 34) of the opening $272b_O$ reaches an end portion position on the one side in the X direction of the insulating layer 272. On the other hand, an end portion on the other side in the X direction (for example, a positive side in the X direction in FIG. 34) of the opening $272b_O$ does not reach an end portion position on the other side in the X direction of the insulating layer 272.

An end portion on the one side in the X direction of the opening $272b_E$ does not reach the end portion position on the one side in the X direction of the insulating layer 272 provided in the connection region $R_C$. On the other hand, an end portion on the other side in the X direction of the opening $272b_E$ reaches the end portion position on the other side in the X direction of the insulating layer 272 provided in the connection region $R_C$.

A width in the X direction of the opening 272b is larger than half a width in the X direction of the insulating layer 272. Moreover, two portions 272a adjacent in the Y direction are connected to each other at their end portions on the one side or the other side in the X direction.

Figure 36:
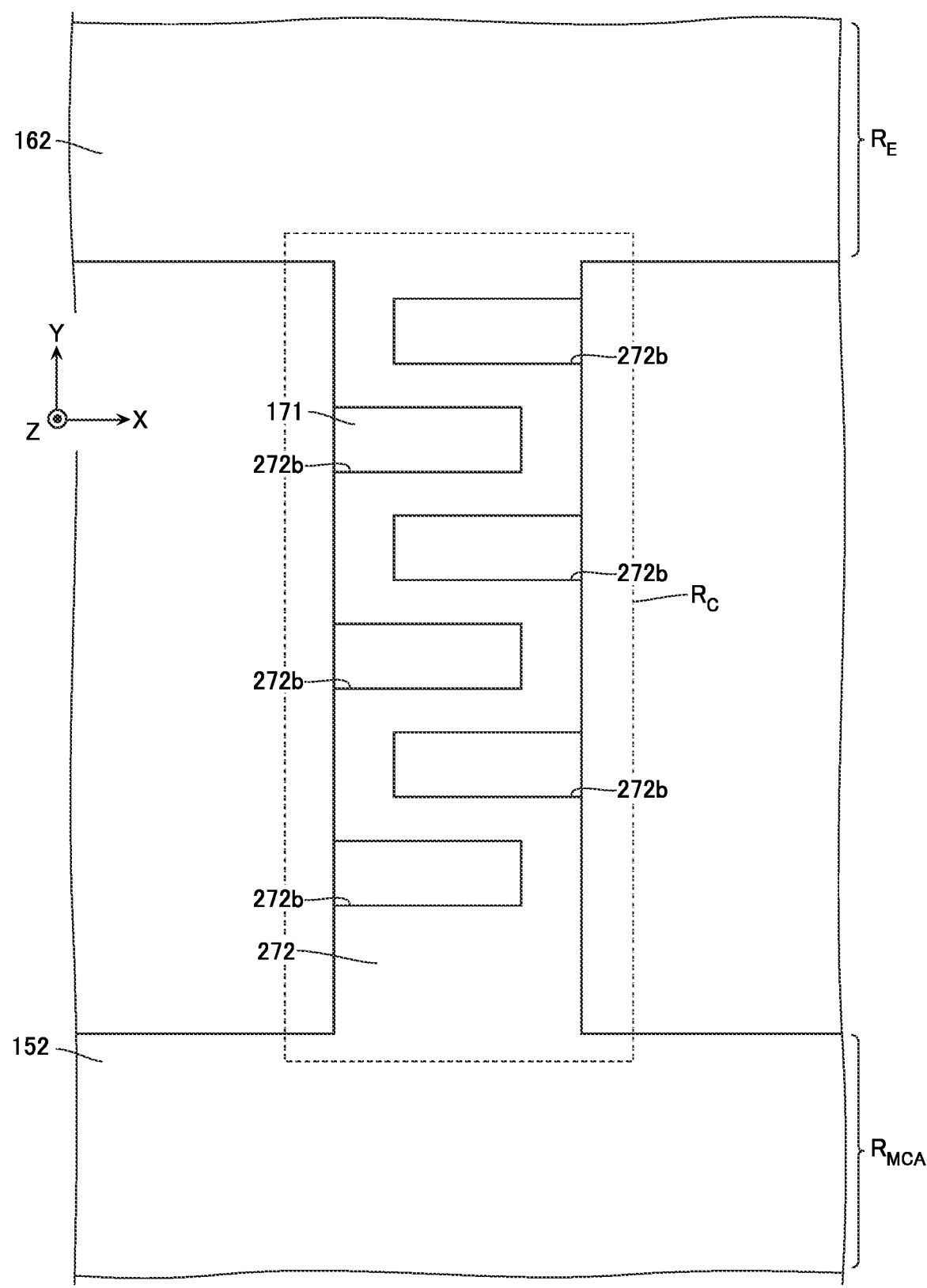
FIG. 36 is a schematic plan view for explaining a manufacturing method of same semiconductor memory device.

A manufacturing method according to the second embodiment is basically similar to the manufacturing method according to the first embodiment. However, in the manufacturing method according to the first embodiment, the plurality of openings 172b are formed in the connection region $R_C$ in the step described with reference to FIG. 10. On the other hand, in the manufacturing method according to the second embodiment, as shown in FIG. 36, the plurality of openings 272b are formed, instead of the plurality of openings 172b.

Third Embodiment

Figure 37:
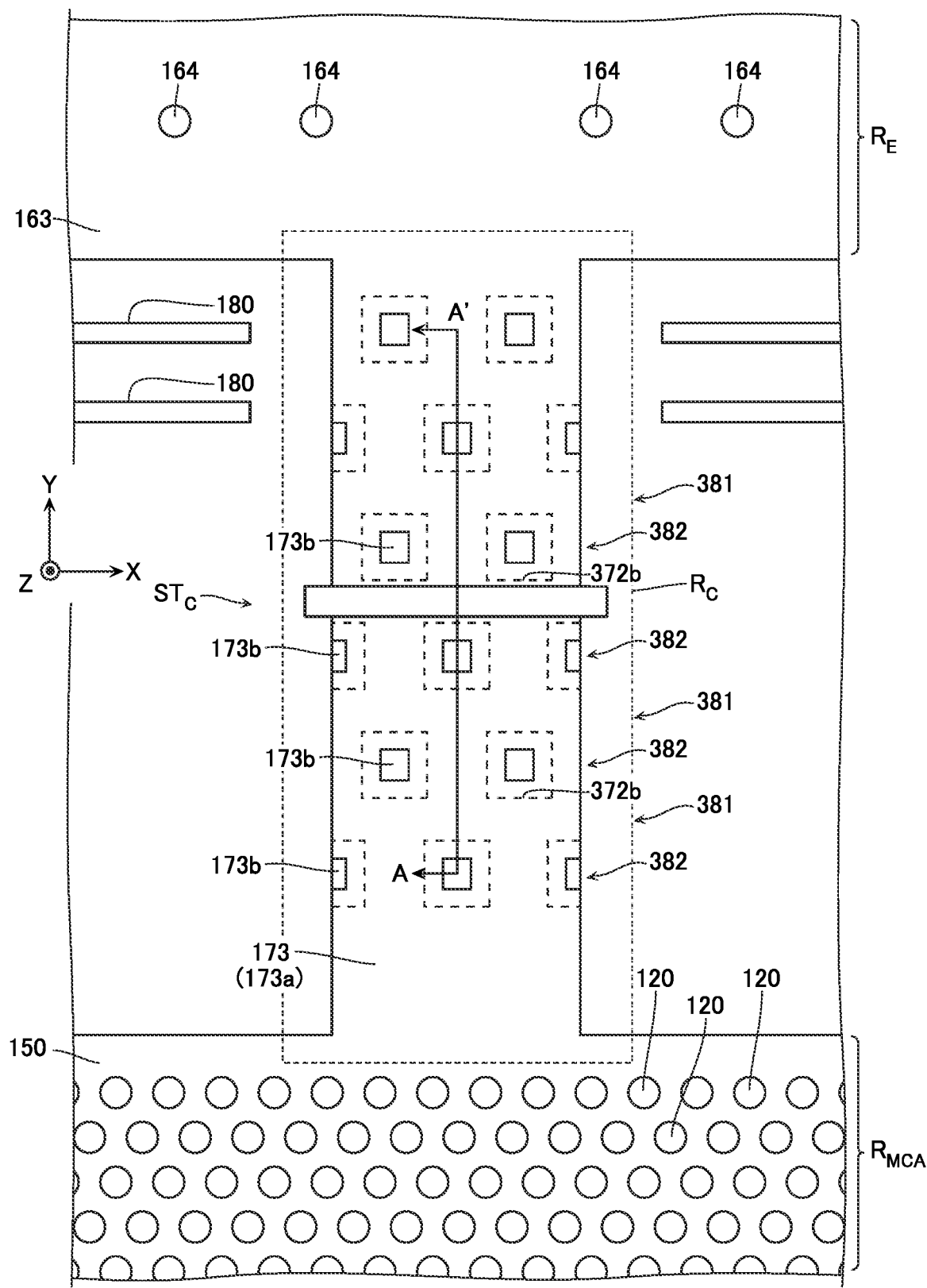
FIG. 37 is a schematic plan view showing a configuration of a semiconductor memory device according to a third embodiment.
Figure 38:
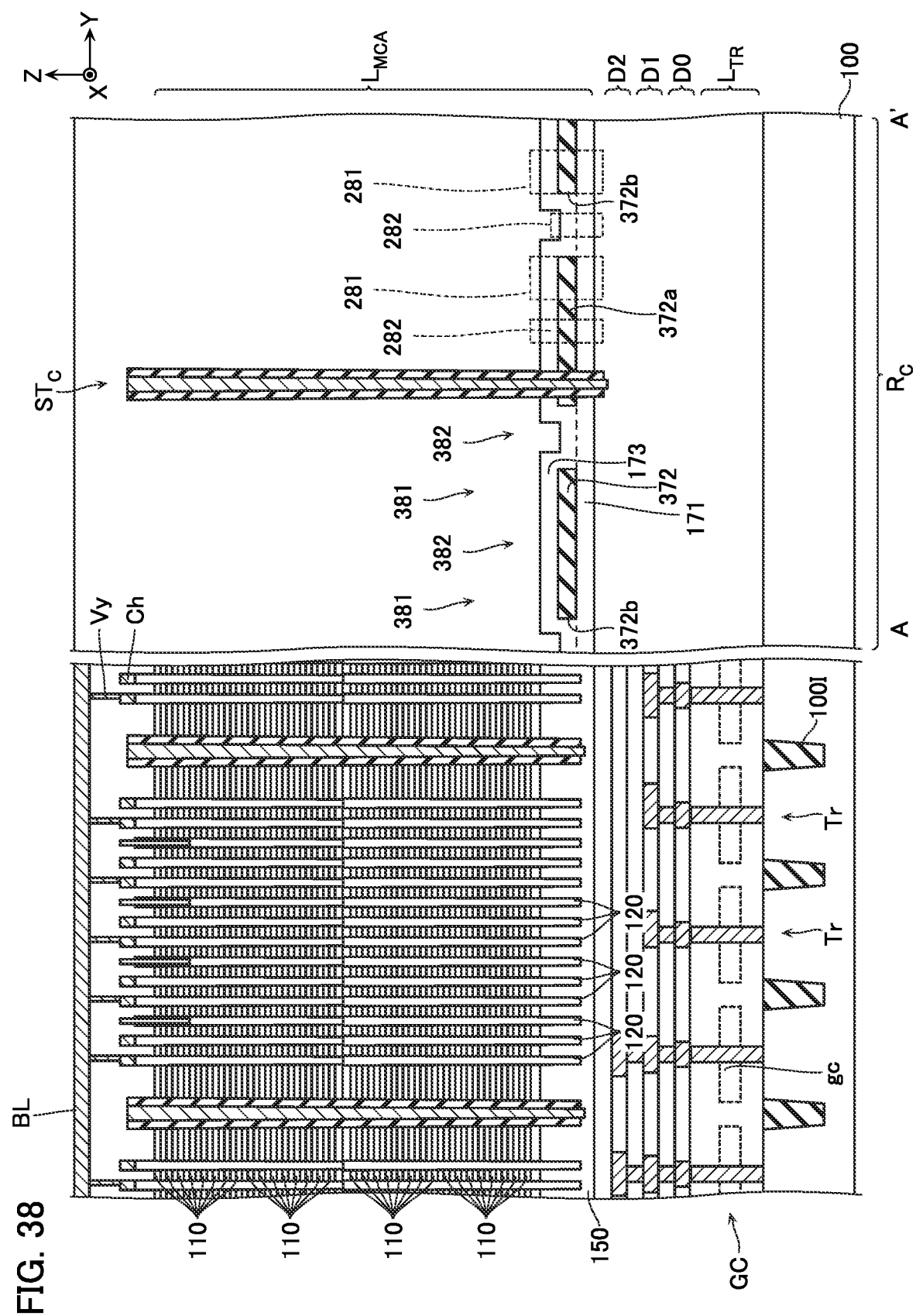
FIG. 38 is a schematic cross-sectional view showing a configuration of same semiconductor memory device.

Next, a semiconductor memory device according to a third embodiment will be described with reference to FIGS. 37 and 38. FIG. 37 is a schematic plan view showing a configuration of the semiconductor memory device according to the third embodiment. FIG. 38 is a schematic cross-sectional view showing a configuration of same semiconductor memory device. Note that FIG. 38 includes a schematic cross-sectional view in which the structure shown in FIG. 37 has been cut along the line A-A' and viewed along a direction of the arrows.

The semiconductor memory device according to the third embodiment is basically configured similarly to the semiconductor memory device according to the second embodiment. However, the connection region $R_C$ in the semiconductor memory device according to the third embodiment is provided with an insulating layer 372, instead of the insulating layer 272. Moreover, the connection region $R_C$ in the semiconductor memory device according to the third embodiment is provided with a plurality of first regions 381 and second regions 382 aligned alternately in the Y direction.

As shown in FIG. 38, the insulating layer 372 comprises: a portion 372a; and a plurality of openings 372b provided in the portion 372a. As shown in FIG. 37, the second region 382 is provided with a plurality of the openings 372b aligned in the X direction. Moreover, the first region 381 and regions between the plurality of openings 372b aligned in the X direction, are provided with the portion 372a (FIG. 38). As shown in FIG. 37, a width in the X direction of the opening 372b is smaller than half a width in the X direction of the insulating layer 372.

Figure 39:
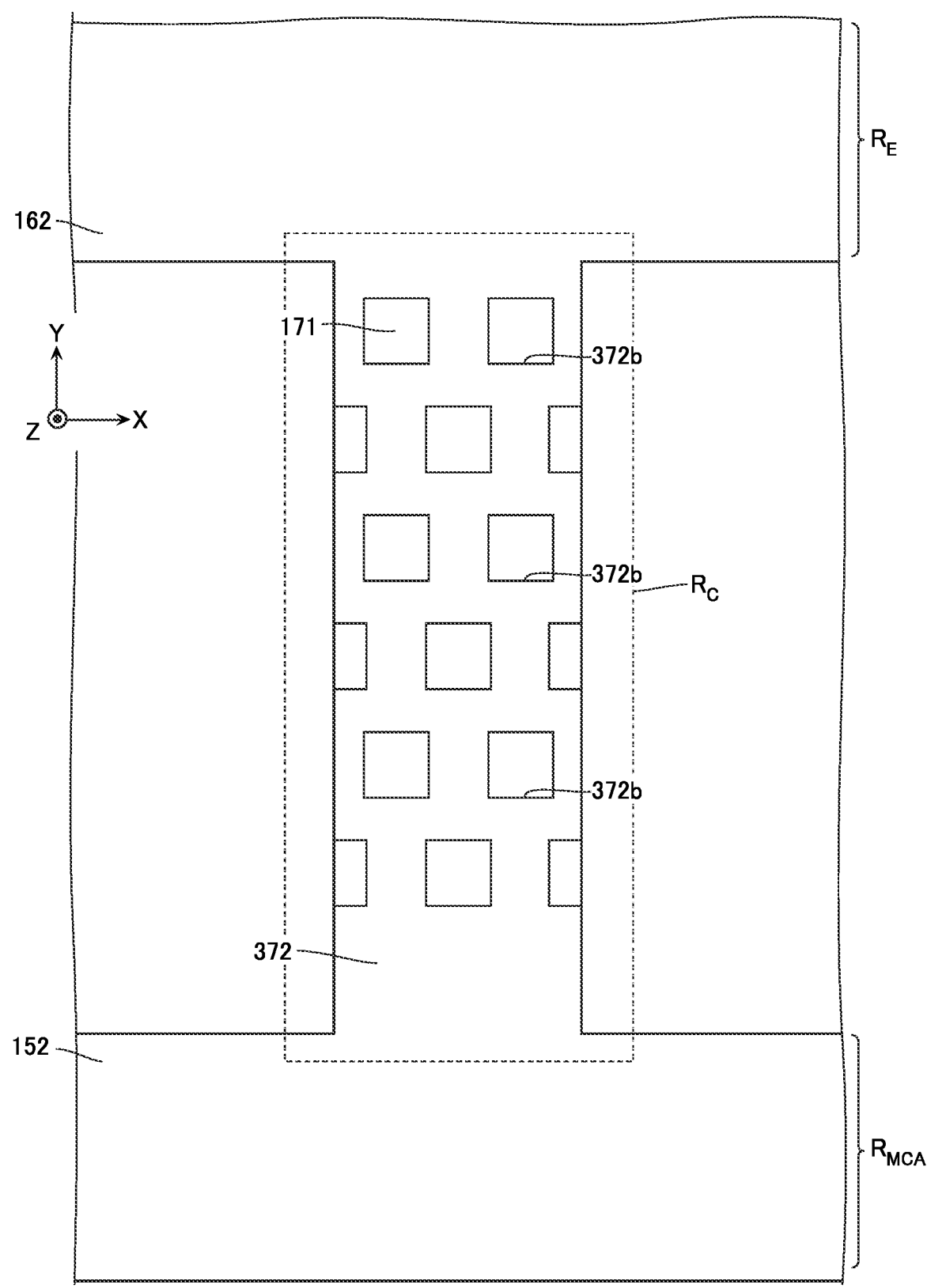
FIG. 39 is a schematic plan view for explaining a manufacturing method of same semiconductor memory device.

A manufacturing method according to the third embodiment is basically similar to the manufacturing method according to the second embodiment. However, in the manufacturing method according to the second embodiment, the plurality of openings 272b are formed in the connection region $R_C$ in the step described with reference to FIG. 36. On the other hand, in the manufacturing method according to the third embodiment, as shown in FIG. 39, the plurality of openings 372b are formed, instead of the plurality of openings 272b.

Fourth Embodiment

Figure 40:
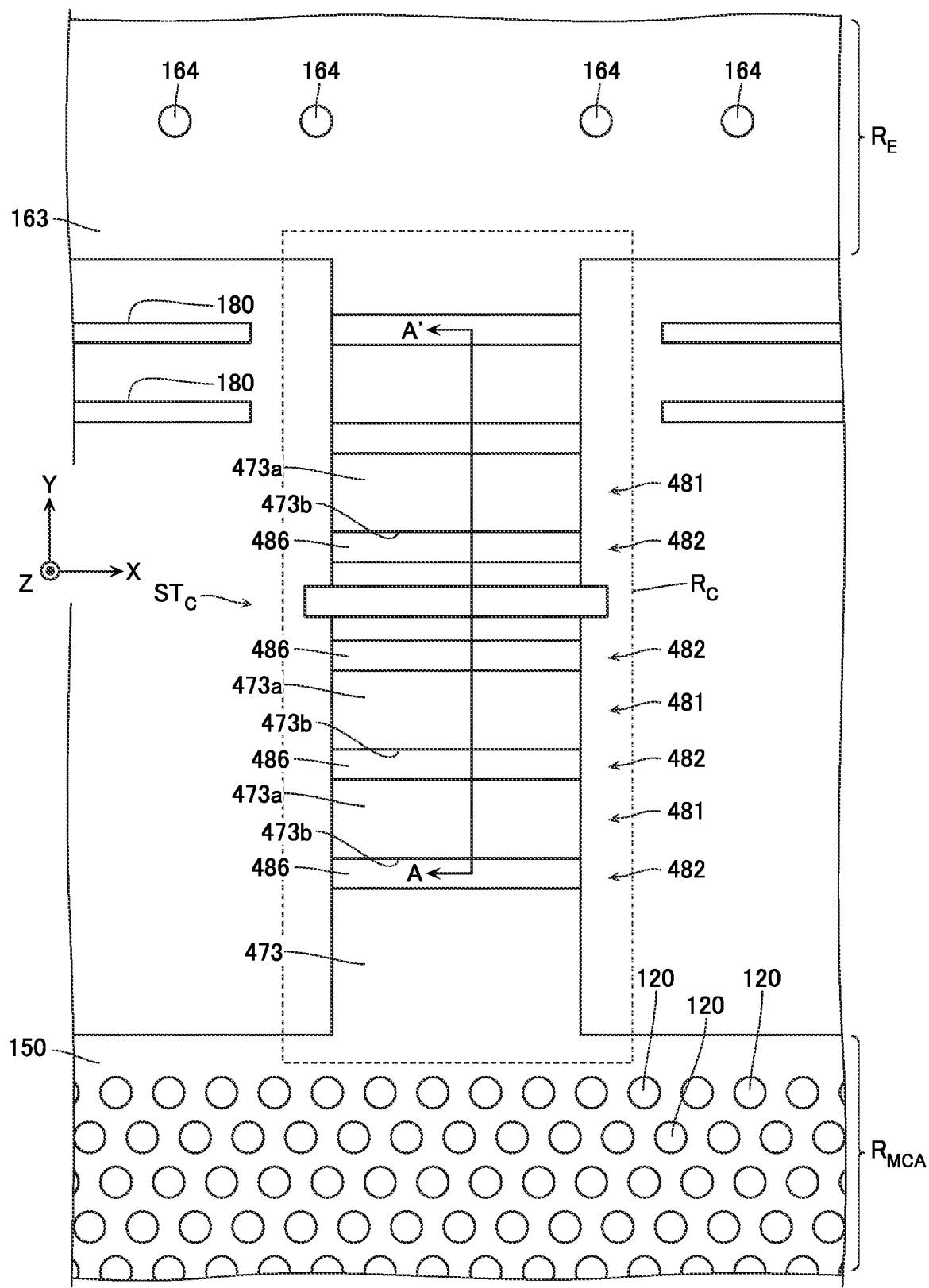
FIG. 40 is a schematic plan view showing a configuration of a semiconductor memory device according to a fourth embodiment.
Figure 41:
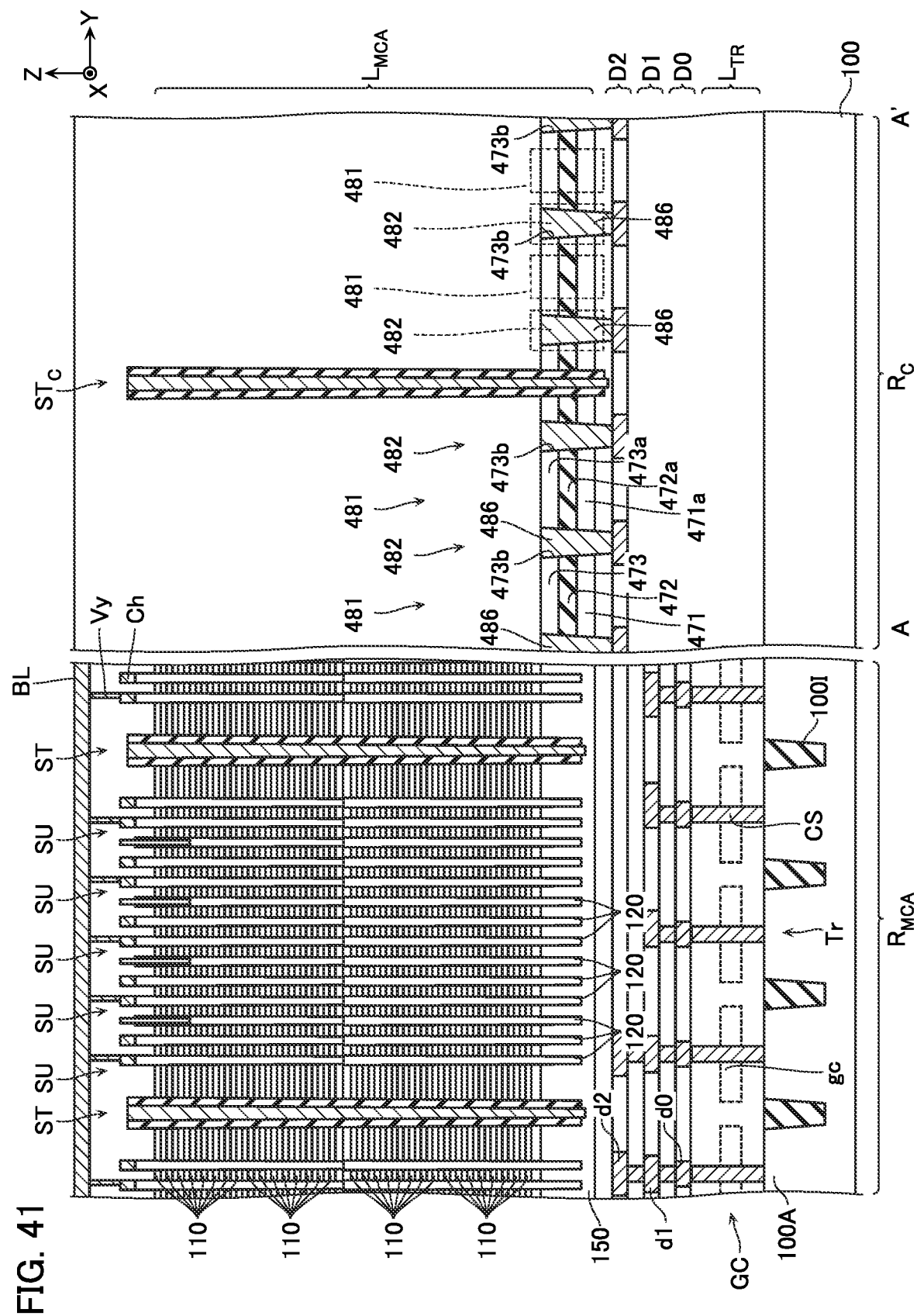
FIG. 41 is a schematic cross-sectional view showing a configuration of same semiconductor memory device.

Next, a semiconductor memory device according to a fourth embodiment will be described with reference to FIGS. 40 and 41. FIG. 40 is a schematic plan view showing a configuration of the semiconductor memory device according to the fourth embodiment. FIG. 41 is a schematic cross-sectional view showing a configuration of same semiconductor memory device. Note that FIG. 41 includes a schematic cross-sectional view in which the structure shown in FIG. 40 has been cut along the line A-A' and viewed along a direction of the arrows.

The semiconductor memory device according to the fourth embodiment is basically configured similarly to the semiconductor memory device according to the first embodiment.

However, the connection region $R_C$ in the semiconductor memory device according to the fourth embodiment is provided with a semiconductor layer 471, an insulating layer 472, and a semiconductor layer 473, instead of the semiconductor layer 171, the insulating layer 172, and the semiconductor layer 173. Moreover, the connection region $R_C$ in the semiconductor memory device according to the fourth embodiment is provided with a plurality of first regions 481 and plurality of second regions 482 aligned alternately in the Y direction.

The semiconductor layer 471, the insulating layer 472, and the semiconductor layer 473 are basically configured similarly to the semiconductor layer 171, the insulating layer 172, and the semiconductor layer 173. However, as shown in FIG. 41, the semiconductor layer 471, the insulating layer 472, and the semiconductor layer 473 comprise: pluralities of portions 471a, 472a, 473a provided correspondingly to the plurality of first regions 481; and a plurality of openings 473b provided correspondingly to the plurality of second regions 482. As shown in FIG. 40, end portions on one side and the other side in the X direction of the opening 473b reach end portion positions on the one side and the other side in the X direction of the semiconductor layer 471, the insulating layer 472, and the semiconductor layer 473.

Moreover, the connection region $R_C$ in the semiconductor memory device according to the fourth embodiment is provided with a plurality of conductive layers 486 provided correspondingly to the plurality of second regions 482 aligned alternately in the Y direction. As shown in FIG. 41, a side surface in the Y direction of the conductive layer 486 contacts side surfaces in the Y direction of the portions 471a, 472a, 473a. A lower end of the conductive layer 486 is connected to the wiring d2. Moreover, as shown in FIG. 40, end portions on the one side and the other side in the X direction of the conductive layer 486 reach end portion positions on the one side and the other side in the X direction of the semiconductor layer 471, the insulating layer 472, and the semiconductor layer 473.

A manufacturing method according to the fourth embodiment is basically similar to the manufacturing method according to the first embodiment. However, in the manufacturing method according to the first embodiment, the step described with reference to FIG. 10 is not executed. Moreover, openings penetrating the semiconductor layer 171, the insulating layer 172, and the semiconductor layer 173 are formed at positions corresponding to the conductive layers 486 in the step described with reference to FIG. 13, for example.

Fifth Embodiment

Figure 42:
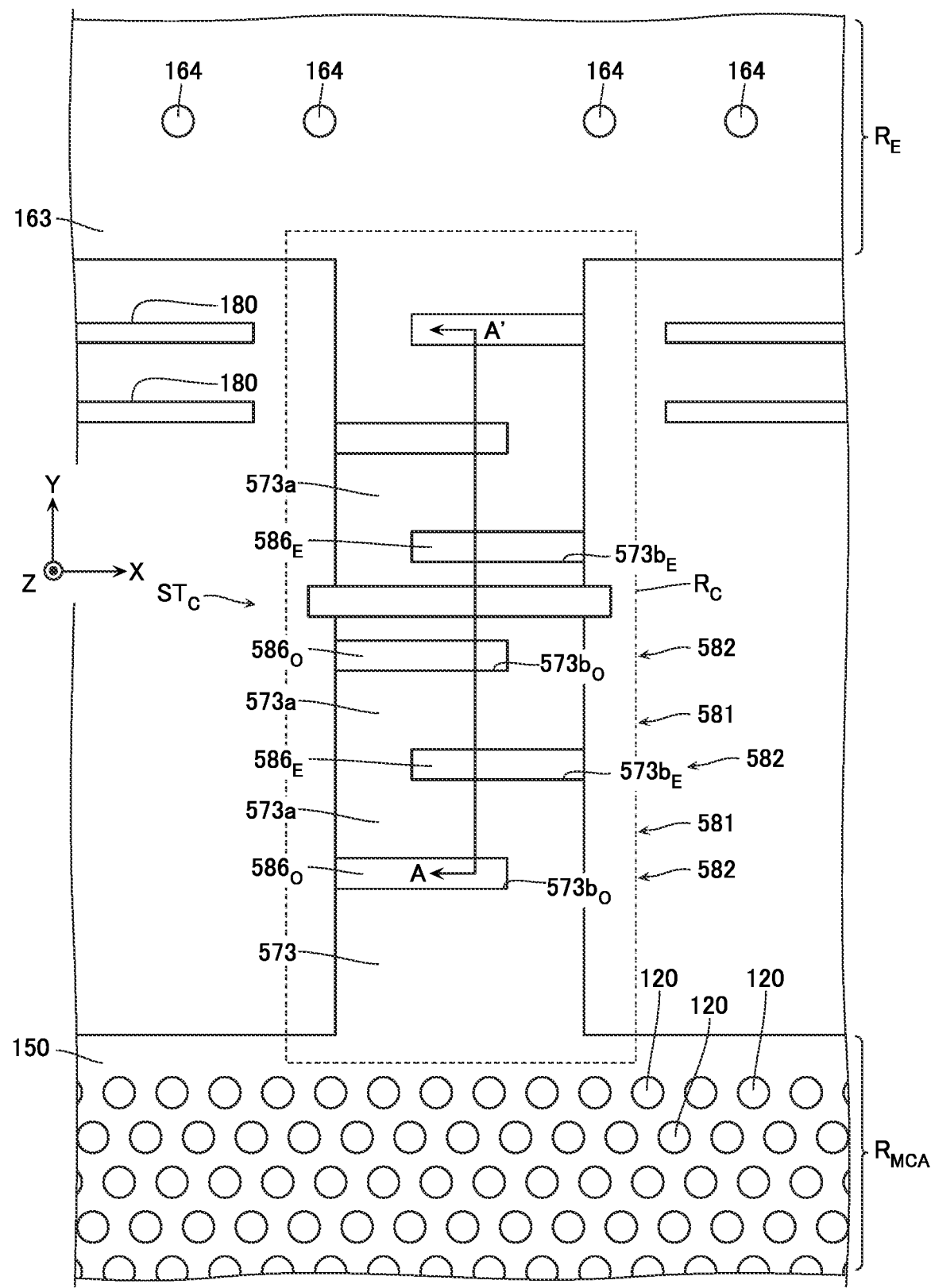
FIG. 42 is a schematic plan view showing a configuration of a semiconductor memory device according to a fifth embodiment.
Figure 43:
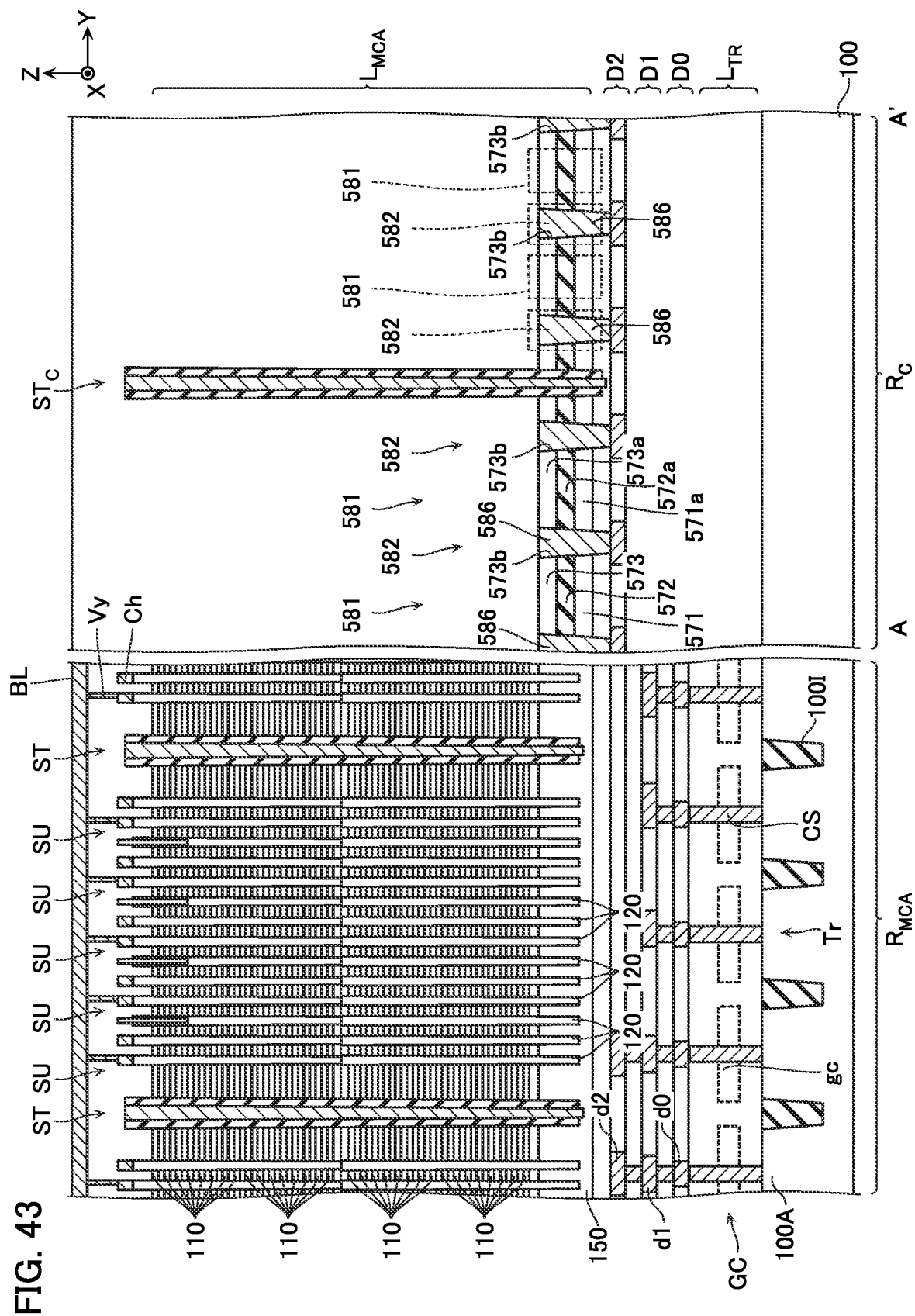
FIG. 43 is a schematic cross-sectional view showing a configuration of same semiconductor memory device.

Next, a semiconductor memory device according to a fifth embodiment will be described with reference to FIGS. 42 and 43. FIG. 42 is a schematic plan view showing a configuration of the semiconductor memory device according to the fifth embodiment. FIG. 43 is a schematic cross-sectional view showing a configuration of same semiconductor memory device. Note that FIG. 43 includes a schematic cross-sectional view in which the structure shown in FIG. 42 has been cut along the line A-A' and viewed along a direction of the arrows.

The semiconductor memory device according to the fifth embodiment is basically configured similarly to the semiconductor memory device according to the fourth embodiment. However, the connection region $R_C$ in the semiconductor memory device according to the fifth embodiment is provided with a semiconductor layer 571, an insulating layer 572, and a semiconductor layer 573, instead of the semiconductor layer 471, the insulating layer 472, and the semiconductor layer 473. Moreover, as shown in FIG. 43, the connection region $R_C$ in the semiconductor memory device according to the fifth embodiment is provided with a plurality of first regions 581 and plurality of second regions 582 aligned alternately in the Y direction.

The semiconductor layer 571, the insulating layer 572, and the semiconductor layer 573 are basically configured similarly to the semiconductor layer 471, the insulating layer 472, and the semiconductor layer 473. However, as shown in FIG. 43, the semiconductor layer 571, the insulating layer 572, and the semiconductor layer 573 comprise: pluralities of portions 571a, 572a, 573a provided correspondingly to the plurality of first regions 581; and a plurality of openings 573b provided correspondingly to the plurality of second regions 582.

As shown in FIG. 42, the openings 573b are aligned in the Y direction. In FIG. 42, an odd-numbered opening 573b counting from one side in the Y direction (for example, a negative side in the Y direction in FIG. 42) is indicated as an opening $573b_O$, and an even-numbered opening 573b counting from the one side in the Y direction is indicated as an opening $573b_E$.

An end portion on one side in the X direction (for example, a negative side in the X direction in FIG. 42) of the opening $573b_O$ reaches an end portion position on the one side in the X direction of the semiconductor layer 571, the insulating layer 572, and the semiconductor layer 573. On the other hand, an end portion on the other side in the X direction (for example, a positive side in the X direction in FIG. 42) of the opening $573b_O$ does not reach an end portion position on the other side in the X direction of the semiconductor layer 571, the insulating layer 572, and the semiconductor layer 573.

An end portion on the one side in the X direction of the opening $573b_E$ does not reach the end portion position on the one side in the X direction of the semiconductor layer 571, the insulating layer 572, and the semiconductor layer 573 provided in the connection region $R_C$. On the other hand, an end portion on the other side in the X direction of the opening $573b_E$ reaches the end portion position on the other side in the X direction of the semiconductor layer 571, the insulating layer 572, and the semiconductor layer 573 provided in the connection region $R_C$.

A width in the X direction of the opening 573b is larger than half a width in the X direction of the semiconductor layer 571, the insulating layer 572, and the semiconductor layer 573. Moreover, twos of portions 571a, 572a, 573a adjacent in the Y direction are connected to each other at their end portions on the one side or the other side in the X direction.

Moreover, the connection region $R_C$ in the semiconductor memory device according to the fifth embodiment is provided with a plurality of conductive layers 586 provided correspondingly to the plurality of second regions 582 aligned alternately in the Y direction. The conductive layer 586 is basically configured similarly to the conductive layer 486.

As shown in FIG. 42, the conductive layers 586 are aligned in the Y direction. In FIG. 42, an odd-numbered conductive layer 586 counting from one side in the Y direction (for example, a negative side in the Y direction in FIG. 42) is indicated as a conductive layer $586_O$, and an even-numbered conductive layer 586 counting from the one side in the Y direction is indicated as a conductive layer $586_E$.

An end portion on one side in the X direction (for example, a negative side in the X direction in FIG. 42) of the conductive layer $586_O$ reaches an end portion position on the one side in the X direction of the semiconductor layer 571, the insulating layer 572, and the semiconductor layer 573. On the other hand, an end portion on the other side in the X direction (for example, a positive side in the X direction in FIG. 42) of the conductive layer $586_O$ does not reach an end portion position on the other side in the X direction of the semiconductor layer 571, the insulating layer 572, and the semiconductor layer 573.

An end portion on the one side in the X direction of the conductive layer $586_E$ does not reach the end portion position on the one side in the X direction of the semiconductor layer 571, the insulating layer 572, and the semiconductor layer 573 provided in the connection region $R_C$. On the other hand, an end portion on the other side in the X direction of the conductive layer $586_E$ reaches the end portion position on the other side in the X direction of the semiconductor layer 571, the insulating layer 572, and the semiconductor layer 573 provided in the connection region $R_C$.

A width in the X direction of the conductive layer 586 is larger than half a width in the X direction of the semiconductor layer 571, the insulating layer 572, and the semiconductor layer 573.

A manufacturing method according to the fifth embodiment is basically similar to the manufacturing method according to the fourth embodiment. However, in the manufacturing method according to the fifth embodiment, an opening penetrating the semiconductor layer 171, the insulating layer 172, and the semiconductor layer 173 is formed at a position corresponding to the conductive layer 586 in the step described with reference to FIG. 13.

Sixth Embodiment

Figure 44:
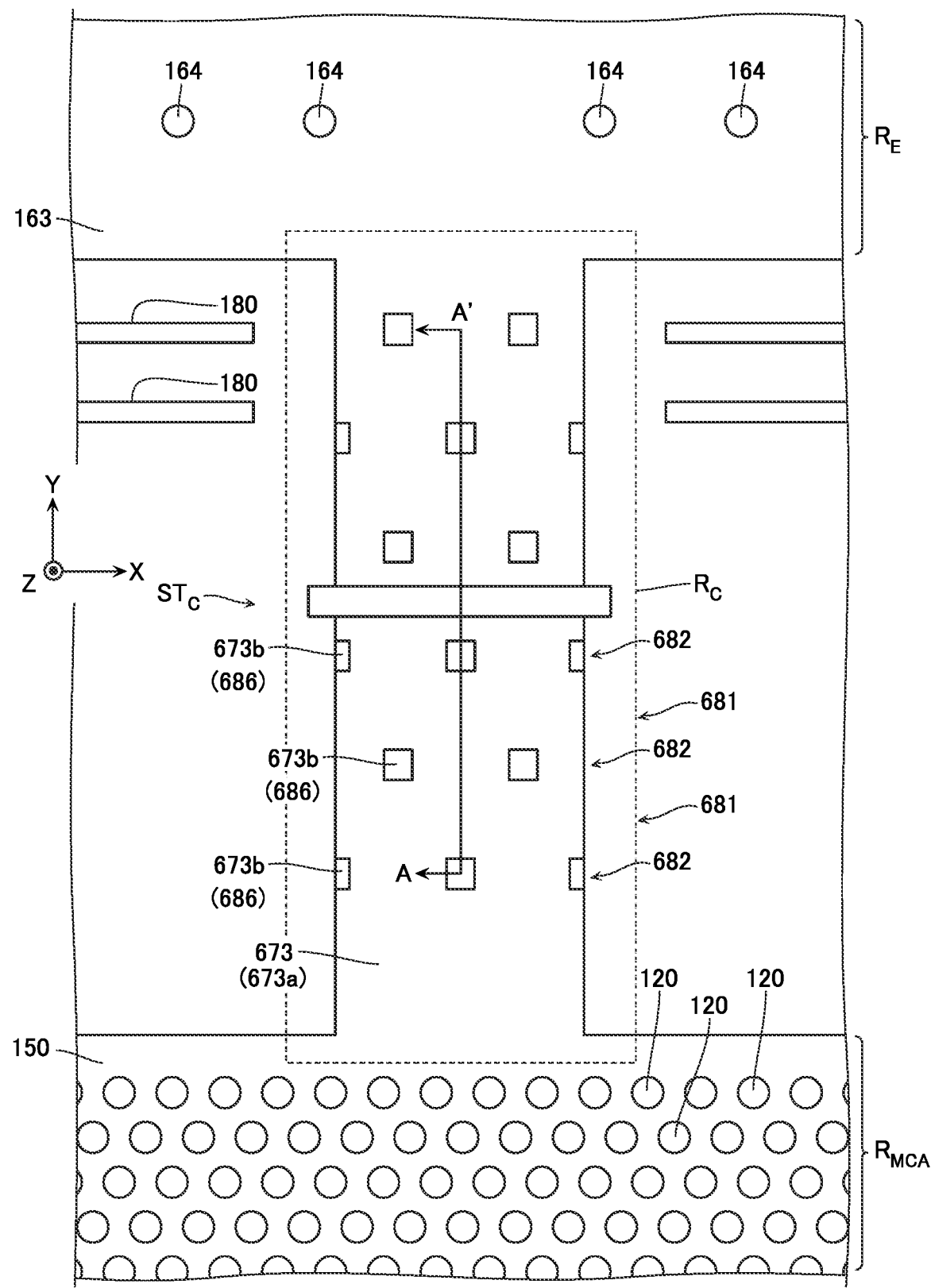
FIG. 44 is a schematic plan view showing a configuration of a semiconductor memory device according to a sixth embodiment.
Figure 45:
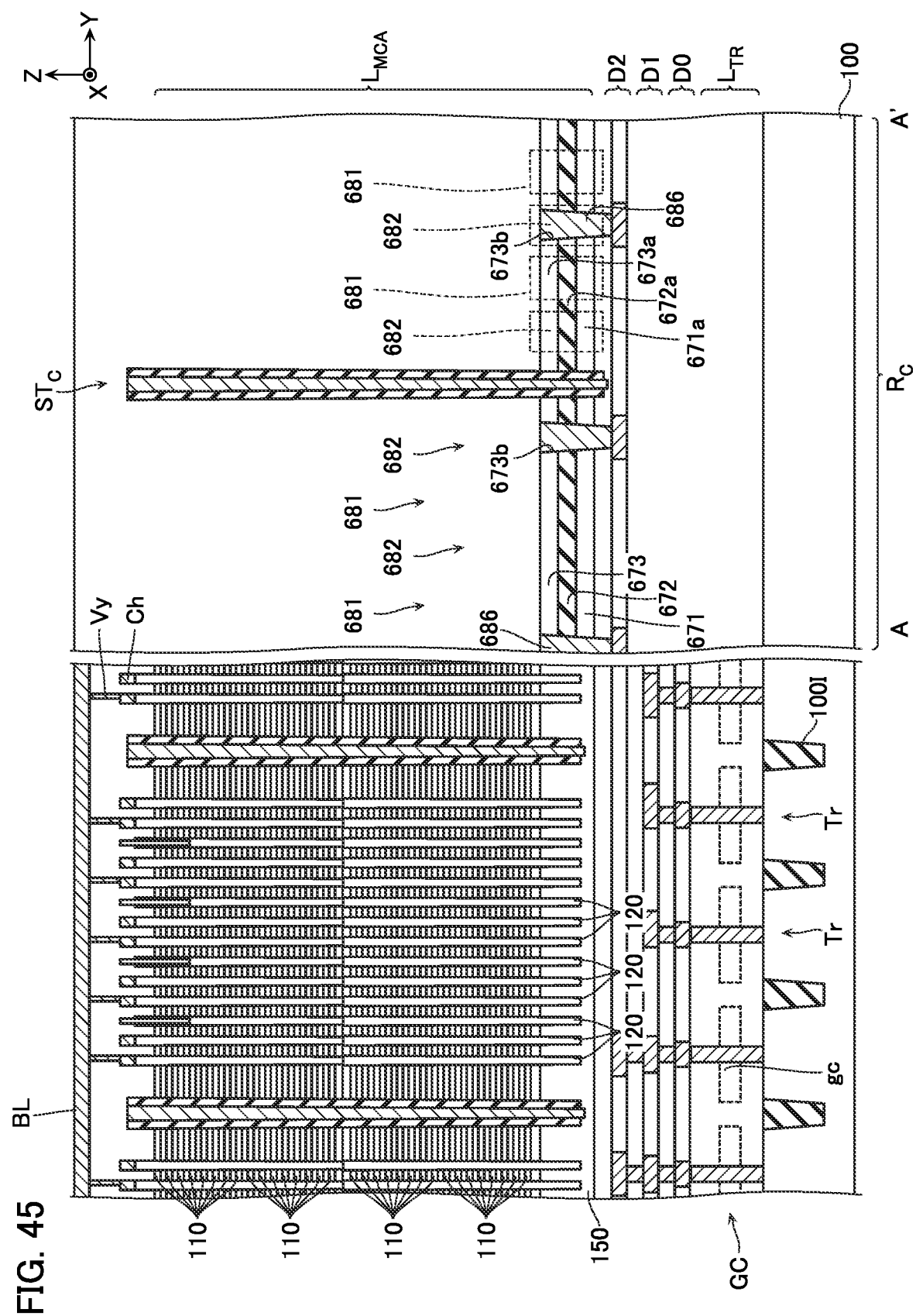
FIG. 45 is a schematic cross-sectional view showing a configuration of same semiconductor memory device.

Next, a semiconductor memory device according to a sixth embodiment will be described with reference to FIGS. 44 and 45. FIG. 44 is a schematic plan view showing a configuration of the semiconductor memory device according to the sixth embodiment. FIG. 45 is a schematic cross-sectional view showing a configuration of same semiconductor memory device. Note that FIG. 45 includes a schematic cross-sectional view in which the structure shown in FIG. 44 has been cut along the line A-A' and viewed along a direction of the arrows.

The semiconductor memory device according to the sixth embodiment is basically configured similarly to the semiconductor memory device according to the fifth embodiment. However, the connection region $R_C$ in the semiconductor memory device according to the sixth embodiment is provided with a semiconductor layer 671, an insulating layer 672, and a semiconductor layer 673, instead of the semiconductor layer 571, the insulating layer 572, and the semiconductor layer 573. Moreover, as shown in FIG. 44, the connection region $R_C$ in the semiconductor memory device according to the sixth embodiment is provided with a plurality of first regions 681 and second regions 682 aligned alternately in the Y direction.

As shown in FIG. 45, the semiconductor layer 671, the insulating layer 672, and the semiconductor layer 673 comprise: portions 671a, 672a, 673a; and a plurality of openings 673b provided in the portions 671a, 672a, 673a. As shown in FIG. 44, the second region 682 is provided with a plurality of the openings 673b aligned in the X direction. Moreover, the first region 681 and regions between the plurality of openings 673b aligned in the X direction, are provided with the portions 671a, 672a, 673a. A width in the X direction of the opening 673b is smaller than half a width in the X direction of the semiconductor layer 671, the insulating layer 672, and the semiconductor layer 673.

Moreover, the connection region $R_C$ in the semiconductor memory device according to the sixth embodiment is provided with a plurality of conductive layers 686 provided correspondingly to the plurality of second regions 682. The conductive layer 686 is basically configured similarly to the conductive layer 586. However, a width in the X direction of the conductive layer 686 is smaller than half a width in the X direction of the semiconductor layer 671, the insulating layer 672, and the semiconductor layer 673.

A manufacturing method according to the sixth embodiment is basically similar to the manufacturing method according to the fifth embodiment. However, in the manufacturing method according to the fifth embodiment, an opening penetrating the semiconductor layer 171, the insulating layer 172, and the semiconductor layer 173 is formed at a position corresponding to the conductive layer 686 in the step described with reference to FIG. 13.

Figure 46:
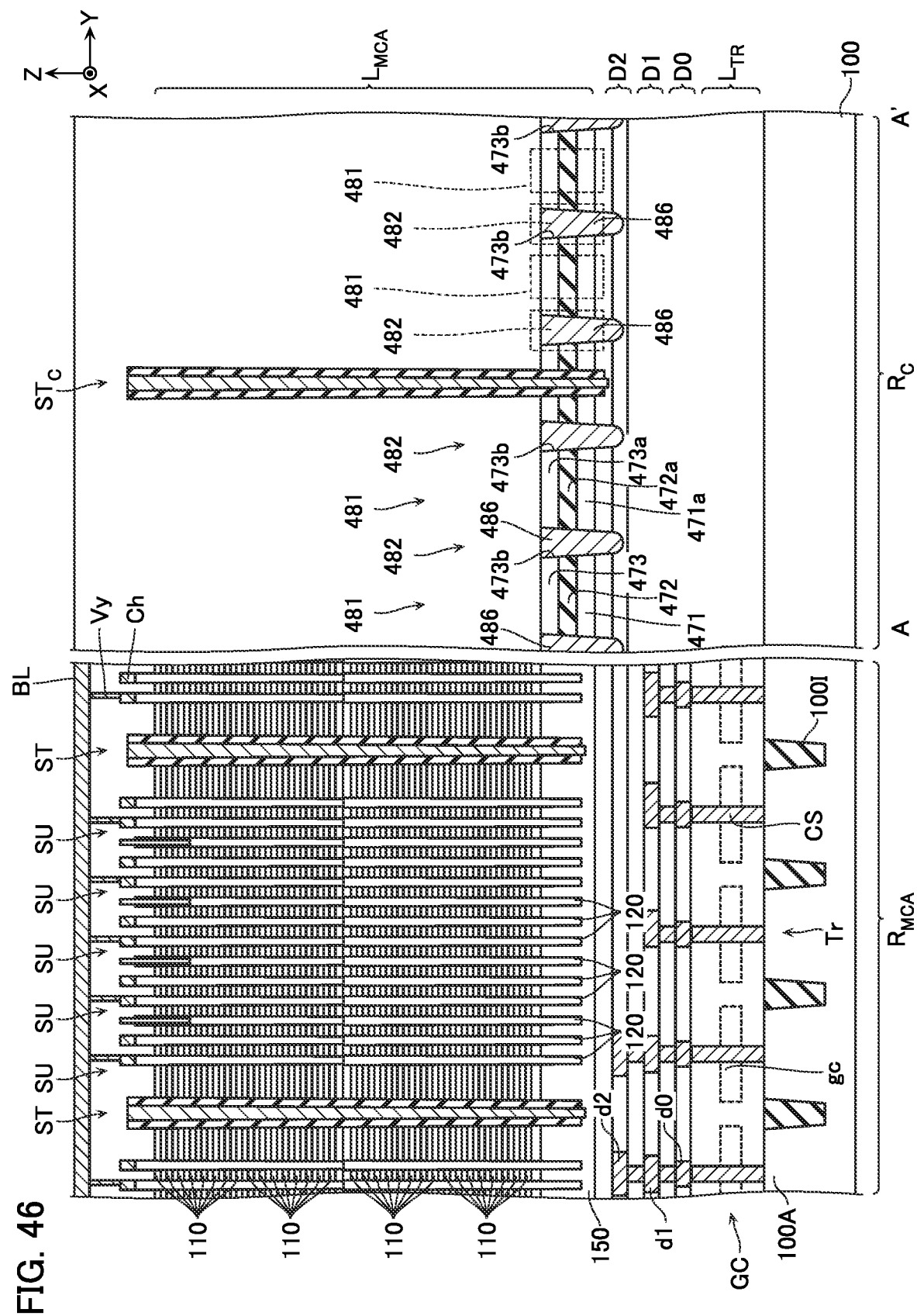
FIG. 46 is a schematic cross-sectional view showing a configuration of a semiconductor memory device according to another example of the fourth embodiment.

Note that lower ends of the conductive layers 486, 586, 686 according to the fourth through sixth embodiments are connected to the wiring d2. However, such a configuration is merely an exemplification, and a specific configuration is appropriately adjustable. As exemplified in FIG. 46, for example, the lower end of the conductive layer 486 need not be connected to the wiring d2. The same applies also to the conductive layers 586, 686.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor substrate, the semiconductor substrate comprising a first region including a plurality of memory cells, a second region provided between the first region and an edge of the semiconductor substrate, and a third region, the third region being provided between the first region and the second region;
   a plurality of first conductive layers provided in the first region, the plurality of first conductive layers being aligned in a first direction intersecting a surface of the semiconductor substrate;
   a first semiconductor layer provided in the first region, the first semiconductor layer extending in the first direction and facing the plurality of first conductive layers;
   a second semiconductor layer provided in the first region, the second semiconductor layer being provided between the plurality of first conductive layers and the semiconductor substrate and being connected to the first semiconductor layer;
   a third semiconductor layer and a fourth semiconductor layer provided in the second region, the third semiconductor layer and the fourth semiconductor layer being aligned in the first direction;
   a second conductive layer provided in the second region, the second conductive layer being electrically connected to the third semiconductor layer, the fourth semiconductor layer, and the semiconductor substrate;
   a fifth semiconductor layer provided in the third region, the fifth semiconductor layer extending in a second direction intersecting the first direction and comprising a portion formed continuously with the second semiconductor layer and a portion formed continuously with the third semiconductor layer; and
   a sixth semiconductor layer provided in the third region, the sixth semiconductor layer extending in the second direction and comprising a portion formed continuously with the second semiconductor layer and a portion formed continuously with the fourth semiconductor layer,
   the third region comprising a plurality of first portions and a plurality of second portions aligned alternately in the second direction,
   in the plurality of first portions, the fifth semiconductor layer and the sixth semiconductor layer being separated in the first direction, and
   in the plurality of second portions, the fifth semiconductor layer and the sixth semiconductor layer being electrically connected.

2. The semiconductor memory device according to claim 1, comprising:
   a first insulating layer provided in the second region, the first insulating layer being positioned between the third semiconductor layer and the fourth semiconductor layer; and
   a second insulating layer provided in the third region, the second insulating layer being positioned between the fifth semiconductor layer and the sixth semiconductor layer and comprising a portion formed continuously with the first insulating layer,
   wherein the second insulating layer comprises a plurality of third portions provided correspondingly to the plurality of first portions.

3. The semiconductor memory device according to claim 2, wherein the sixth semiconductor layer comprises:
   a plurality of fourth portions provided in the plurality of first portions, the plurality of fourth portions being provided on surfaces on one side in the first direction of the plurality of third portions;
   a plurality of fifth portions provided in the plurality of second portions, the plurality of fifth portions being provided on surfaces on one side in the first direction of the fifth semiconductor layer; and
   a plurality of sixth portions provided on side surfaces in the second direction of the plurality of third portions.

4. The semiconductor memory device according to claim 3, wherein
   at least one of the plurality of fifth portions includes:
   one end portion in a third direction intersecting the first direction and the second direction which reaches an end portion position on one side in the third direction of the fifth semiconductor layer; and
   the other end portion in the third direction which reaches an end portion position on the other side in the third direction of the fifth semiconductor layer.

5. The semiconductor memory device according to claim 3, wherein
   at least one of the plurality of fifth portions includes:
   one end portion in a third direction intersecting the first direction and the second direction which reaches an end portion position on one side in the third direction of the fifth semiconductor layer; and
   the other end portion in the third direction which does not reach an end portion position on the other side in the third direction of the fifth semiconductor layer.

6. The semiconductor memory device according to claim 3, wherein
   at least one of the plurality of fifth portions includes:
   one end portion in a third direction intersecting the first direction and the second direction which does not reach an end portion position on one side in the third direction of the fifth semiconductor layer; and
   the other end portion in the third direction which does not reach an end portion position on the other side in the third direction of the fifth semiconductor layer either.

7. The semiconductor memory device according to claim 3, wherein
   when a width in a third direction intersecting the first direction and the second direction, of at least one of the plurality of fifth portions is assumed to be a first width, and
   a width in the third direction of the fifth semiconductor layer is assumed to be a second width,
   the first width is equal to the second width.

8. The semiconductor memory device according to claim 3, wherein
   when a width in a third direction intersecting the first direction and the second direction, of at least one of the plurality of fifth portions is assumed to be a first width, and
   a width in the third direction of the fifth semiconductor layer is assumed to be a second width,
   the first width
   is smaller than the second width, and
   is larger than half a width of the second width.

9. The semiconductor memory device according to claim 3, wherein
   when a width in a third direction intersecting the first direction and the second direction, of at least one of the plurality of fifth portions is assumed to be a first width, and a width in the third direction of the fifth semiconductor layer is assumed to be a second width, the first width is smaller than half of the second width.

10. The semiconductor memory device according to claim 1, comprising
a plurality of third conductive layers provided correspondingly to the plurality of second portions,
wherein the fifth semiconductor layer comprises a plurality of seventh portions provided correspondingly to the plurality of first portions,
the sixth semiconductor layer comprises a plurality of eighth portions provided correspondingly to the plurality of first portions, and
the plurality of third conductive layers are each connected to two seventh portions adjacent in the second direction and two eighth portions adjacent in the second direction.

11. The semiconductor memory device according to claim 10, wherein
at least one of the plurality of third conductive layers includes:
one end portion in a third direction intersecting the first direction and the second direction which reaches an end portion position on one side in the third direction of the fifth semiconductor layer; and
the other end portion in the third direction which reaches an end portion position on the other side in the third direction of the fifth semiconductor layer.

12. The semiconductor memory device according to claim 10, wherein
at least one of the plurality of third conductive layers includes:
one end portion in a third direction intersecting the first direction and the second direction which reaches an end portion position on one side in the third direction of the fifth semiconductor layer; and
the other end portion in the third direction which does not reach an end portion position on the other side in the third direction of the fifth semiconductor layer.

13. The semiconductor memory device according to claim 10, wherein
at least one of the plurality of third conductive layers includes:
one end portion in a third direction intersecting the first direction and the second direction which does not reach an end portion position on one side in the third direction of the fifth semiconductor layer; and
the other end portion in the third direction which does not reach an end portion position on the other side in the third direction of the fifth semiconductor layer either.

14. The semiconductor memory device according to claim 10, wherein
when a width in a third direction intersecting the first direction and the second direction, of at least one of the plurality of third conductive layers is assumed to be a first width, and
a width in the third direction of the fifth semiconductor layer is assumed to be a second width,
the first width is equal to the second width.

15. The semiconductor memory device according to claim 10, wherein
when a width in a third direction intersecting the first direction and the second direction, of at least one of the plurality of third conductive layers is assumed to be a first width, and
a width in the third direction of the fifth semiconductor layer is assumed to be a second width,
the first width
is smaller than the second width, and
is larger than half a width of the second width.

16. The semiconductor memory device according to claim 10, wherein
when a width in a third direction intersecting the first direction and the second direction, of at least one of the plurality of third conductive layers is assumed to be a first width, and
a width in the third direction of the fifth semiconductor layer is assumed to be a second width,
the first width is smaller than half of the second width.

17. The semiconductor memory device according to claim 1, wherein
the third semiconductor layer and the fourth semiconductor layer are electrically insulated from the second semiconductor layer.

18. The semiconductor memory device according to claim 1, wherein
the first region is a memory cell array region, and
the second region is an edge seal region.

* * * * *